US009691991B2

(12) United States Patent
Hong et al.

(10) Patent No.: US 9,691,991 B2
(45) Date of Patent: Jun. 27, 2017

(54) ORGANIC LIGHT EMITTING DIODE

(71) Applicant: LG CHEM, LTD, Seoul (KR)

(72) Inventors: Sung Kil Hong, Daejeon (KR); Kongkyeom Kim, Daejeon (KR); Jungi Jang, Daejeon (KR); Yun Hwan Kim, Seoul (KR); Minseung Chun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 469 days.

(21) Appl. No.: 14/241,682

(22) PCT Filed: Feb. 27, 2013

(86) PCT No.: PCT/KR2013/001576
§ 371 (c)(1),
(2) Date: Feb. 27, 2014

(87) PCT Pub. No.: WO2013/129835
PCT Pub. Date: Sep. 6, 2013

(65) Prior Publication Data

US 2014/0203272 A1 Jul. 24, 2014

(30) Foreign Application Priority Data

Feb. 27, 2012 (KR) ........................ 10-2012-0019959

(51) Int. Cl.
*H01L 51/00* (2006.01)
*H01L 51/50* (2006.01)

(52) U.S. Cl.
CPC ........ *H01L 51/006* (2013.01); *H01L 51/0052* (2013.01); *H01L 51/0054* (2013.01);
(Continued)

(58) Field of Classification Search
CPC ............. H01L 51/0052; H01L 51/0054; H01L 51/0058; H01L 51/006; H01L 51/0061;
(Continued)

(56) References Cited

U.S. PATENT DOCUMENTS 6,229,012 B1 5/2001 Hu et al.
2005/0014024 A1* 1/2005 Tsuboyama ............. C07F 1/005 428/690

(Continued)

FOREIGN PATENT DOCUMENTS

CN 101473464 A 7/2009
CN 101904028 A 12/2010

(Continued)

OTHER PUBLICATIONS

Machine Translation of JP 2003045662—published on Feb. 14, 2003—Konica Corp.†

(Continued)

*Primary Examiner* — Dawn Garrett
(74) *Attorney, Agent, or Firm* — Dentons US LLP

(57) ABSTRACT

The present invention relates to an organic light emitting diode and a method of manufacturing the same. An organic light emitting diode according to the present invention comprises an exciton blocking layer comprising a compound represented by Formula 1 to confine an exciton to a light emitting layer to prevent light emitting leakage, and thus there is an effect of implementing an organic electroluminescence diode having excellent light emitting efficiency. Further, even though there is no separate electron injection layer, electron injection and light transport characteristics are excellent by comprising an electron transport layer comprising a compound represented by Formula 2 or 3, and thus it is possible to implement an organic light emitting diode having a simple and economical manufacturing pro- (Continued)

4
8
7
6
5
2
1 cess, a low voltage, high efficiency, and a long life span as compared to the related art.

9 Claims, 1 Drawing Sheet

(52) U.S. Cl.
CPC ...... *H01L 51/0058* (2013.01); *H01L 51/0061* (2013.01); *H01L 51/0067* (2013.01); *H01L 51/0072* (2013.01); *H01L 51/0073* (2013.01); *H01L 51/0074* (2013.01); *H01L 51/5072* (2013.01); *H01L 51/5096* (2013.01); *H01L 51/0096* (2013.01)

(58) Field of Classification Search
CPC ............. H01L 51/0067; H01L 51/0072; H01L 51/0073; H01L 51/0074; H01L 51/0096; H01L 51/5072; H01L 51/5096
See application file for complete search history.

(56) References Cited

U.S. PATENT DOCUMENTS

| | | | | |
|---|---|---|---|---|
| 2005/0048311 | A1* | 3/2005 | Hatwar ............... | H01L 51/5048 428/690 |
| 2006/0084347 | A1* | 4/2006 | Tutt .................... | H01L 27/3211 445/24 |
| 2006/0105202 | A1* | 5/2006 | Kitamura ............... | C09K 11/06 428/690 |
| 2006/0214553 | A1* | 9/2006 | Nagara ................... | H01L 51/50 313/483 |
| 2006/0251919 | A1* | 11/2006 | Aziz ................... | H01L 51/5012 428/690 |
| 2008/0014464 | A1† | 1/2008 | Kawamura | |
| 2010/0044689 | A1 | 2/2010 | Nishimura et al. | |
| 2010/0052516 | A1* | 3/2010 | Ren ........................ | C09K 11/06 313/504 |
| 2010/0219404 | A1† | 9/2010 | Endo | |
| 2010/0301312 | A1† | 12/2010 | Jinde | |
| 2011/0156013 | A1† | 6/2011 | Kim | |
| 2011/0248247 | A1 | 10/2011 | Matsumoto et al. | |
| 2012/0068170 | A1 | 3/2012 | Pflumm et al. | |
| 2014/0217393 | A1* | 8/2014 | Kato .................... | C07D 403/10 257/40 |

FOREIGN PATENT DOCUMENTS

| | | | | |
|---|---|---|---|---|
| CN | 101971384 | A | | 2/2011 |
| EP | 2031670 | A1 | | 3/2009 |
| EP | 2133932 | A1 | | 12/2009 |
| EP | 2202818 | A1 | | 6/2010 |
| EP | 2224510 | A1 | | 9/2010 |
| JP | 2003045662 | A | † | 2/2003 |
| JP | 2007110093 | A | † | 4/2007 |
| JP | 2009076817 | | | 4/2009 |
| JP | 2009076817 | A | | 4/2009 |
| JP | 2010-097964 | A | | 4/2010 |
| JP | 2010097964 | | | 4/2010 |
| JP | 2010097964 | A | | 4/2010 |
| JP | 2010141059 | A | | 6/2010 |
| JP | 2011233855 | A | | 11/2011 |
| JP | 2012-028524 | A | | 2/2012 |
| KR | 1020100070350 | A | | 6/2010 |
| KR | 10-2011-0076488 | A | | 7/2011 |
| TW | 200936545 | A | | 9/2009 |
| WO | 2007148660 | A1 | | 12/2007 |
| WO | 2008-123178 | A1 | | 10/2008 |
| WO | 2008123178 | A1 | | 10/2008 |
| WO | 2009041635 | A1 | | 4/2009 |
| WO | 2009081857 | A1 | | 7/2009 |
| WO | WO 2010/074422 | A1 | * | 7/2010 |
| WO | 2010136109 | A1 | | 12/2010 |

OTHER PUBLICATIONS

Machine Translation of JP 2007110093 A—published on Apr. 26, 2007—Mitsubishi Chemicals Corp.†

* cited by examiner
† cited by third party

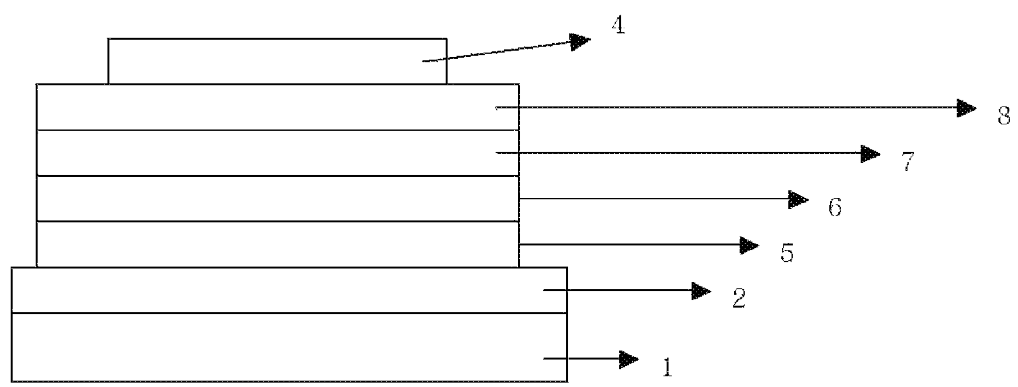
4
8
7
6
5
2
1

ORGANIC LIGHT EMITTING DIODE

This application is a 35 USC §371 National Stage entry of International Application No. PCT/KR2013/001576, filed on Feb. 27, 2013, which claims priority of Korean Application No. 10-2012-0019959, filed on Feb. 27, 2012, all of which are hereby incorporated by reference in their entirety.

TECHNICAL FIELD

The present invention relates to an organic light emitting diode. More particularly, the present invention relates to an organic light emitting diode having excellent characteristics comprising a low voltage, high efficiency, and a long life span, and a simple manufacturing process.

BACKGROUND ART

An organic light emitting phenomenon is an example of a conversion of current into visible rays by an internal process of a specific organic molecule. The organic light emitting phenomenon is based on the following principle. When an organic material layer is interposed between an anode and a cathode, if voltage is applied between two electrodes, electrons and holes are injected from the cathode and the anode to the organic material layer. The electrons and the holes injected into the organic material layer are recombined to form an exciton, and the exciton is reduced to a bottom state to emit light. An organic light emitting diode using the principle may be generally constituted by a cathode, an anode, and an organic material layer interposed therebetween, for example, an organic material layer comprising a hole injection layer, a hole transport layer, a light emitting layer, and an electron transport layer.

The material used in the organic light emitting diode is mostly a pure organic material or a complex compound where an organic material and metal form a complex, and may be classified into a hole injection material, a hole transport material, a light emitting material, an electron transport material, an electron injection material and the like according to the purpose. Herein, an organic material having a p-type property, that is, an organic material which is easily oxidized and electrochemically stable while the organic material is oxidized, is mainly used as the hole injection material or the hole transport material. Meanwhile, an organic material having an n-type property, that is, an organic material which is easily reduced and electrochemically stable while the organic material is reduced, is mainly used as the electron injection material or the electron transport material. A material having both p-type and n-type properties, that is, a material that is stable when the material is oxidized and reduced, is preferable as the light emitting layer material, and a material having high light emitting efficiency for converting the exciton into light when the exciton is formed is preferable.

In addition, it is preferable that the material used in the organic light emitting diode further have the following properties.

First, it is preferable that the material used in the organic light emitting diode have excellent thermal stability. This is because joule heat is generated by the movement of electric charges in the organic light emitting diode. Recently, NPB, which has mostly been used as the hole transport layer material, has a glass transition temperature of 100° C. or lower, and thus there is a problem in that it is difficult to use NPB in an organic light emitting diode requiring a high current.

Second, holes or electrons injected into the organic light emitting diode should be smoothly transported to a light emitting layer, and the injected holes and electrons should not be released out of the light emitting layer in order to obtain an organic light emitting diode that is capable of being driven at low voltage and has high efficiency. To this end, a material used in the organic light emitting diode should have an appropriate band gap and HOMO or LUMO energy level. In the case of PEDOT:PSS currently used as a hole transport material in an organic light emitting diode manufactured by a solution coating method, since a LUMO energy level thereof is lower than that of an organic material used as a light emitting layer material, it is difficult to manufacture an organic light emitting diode having high efficiency and a long life span.

In addition, the material used in the organic light emitting diode should have excellent chemical stability, electric charge mobility, and interfacial characteristic with an electrode or an adjacent layer. That is, the material used in the organic light emitting diode should be little deformed by moisture or oxygen. Further, appropriate hole or electron mobility should be ensured so as to balance densities of the holes and of the electrons in the light emitting layer of the organic light emitting diode, thus maximizing formation of excitons. In addition, an interface with an electrode comprising metal or metal oxides should be favorable for stability of the diode.

In order to sufficiently exhibit excellent characteristics of the aforementioned organic light emitting diode, a material forming the organic material layer in the diode, for example, the hole injection material, the hole transport material, the light emitting material, the electron transport material, the electron injection material, and the like should be supported by stable and efficient materials in advance, but development of a stable and efficient organic material layer material for organic light emitting diodes has not yet been sufficiently made, such that there is still a demand for developing a new material.

DISCLOSURE

Technical Problem

The present invention has been made in an effort to provide an organic light emitting diode having excellent characteristics comprising a low voltage, high efficiency, and a long life span, and a simple manufacturing process.

Technical Solution

An exemplary embodiment of the present invention provides an organic light emitting diode comprising an anode, a cathode, and one or more organic material layers interposed between the anode and the cathode, in which the organic material layer comprises a light emitting layer, the organic material layer comprising a compound represented by the following Formula 1 is comprised between the anode and the light emitting layer, and the organic material layer comprising a compound represented by the following Formula 2 or 3 is comprised between the cathode and the light emitting layer.

[Formula 1]

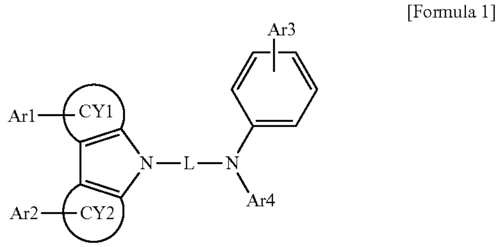

In Formula 1,

CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms,

[Formula 2]

[Formula 3]

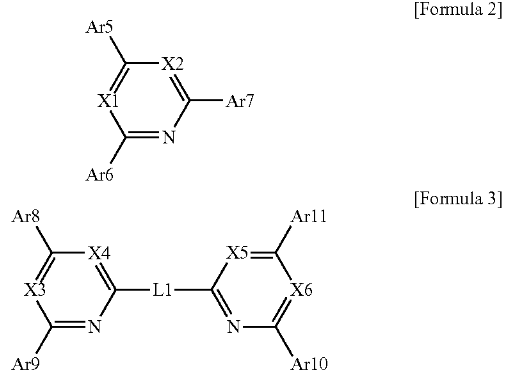

in Formulas 2 and 3,

X1 to X6 are the same as or different from each other, and each independently N or CH, Ar5 to Ar11 are the same as or different from each other, and each independently selected from the group consisting of a substituted or unsubstituted aryl group having 6 to 30 carbon atoms; and a substituted or unsubstituted heteroaryl group having 5 to 30 carbon atoms, and L1 is a substituted or unsubstituted arylene group having 6 to 30 carbon atoms.

Advantageous Effects

An organic light emitting diode according to the present invention comprises an exciton blocking layer comprising a compound represented by Formula 1 to confine an exciton to a light emitting layer to prevent light emitting leakage, and thus there is an effect of implementing an organic electroluminescence diode having excellent light emitting efficiency. Further, even though there is no separate electron injection layer, electron injection and light transport characteristics are excellent by comprising an electron transport layer comprising a compound represented by Formula 2 or 3, and thus it is possible to implement an organic light emitting diode having a simple and economical manufacturing process, a low voltage, high efficiency, and a long life span as compared to the related art.

BRIEF DESCRIPTION OF THE DRAWINGS

FIG. 1 illustrates an example of an organic light emitting diode formed of a substrate 1, an anode 2, a hole injection layer 5, a hole transport layer 6, a light emitting layer 7, an electron transport layer 8, and a cathode 4.

BEST MODE

Hereinafter, the present invention will be described in more detail.

In an organic light emitting diode, when a light emitting layer is formed, since a diffusion distance of a triple exciton is 100 nm or more, which is long, the triple exciton deviates from the light emitting layer having a thickness of 20 to 30 nm to largely reduce light emitting efficiency, and thus it is preferable to confine the triple exciton to the light emitting layer by using an appropriate exciton blocking layer.

An organic light emitting diode according to the present invention comprises an anode, a cathode, and one or more organic material layers interposed between the anode and the cathode, in which the organic material layer comprises a light emitting layer, the organic material layer comprising a compound represented by Formula 1 is comprised between the anode and the light emitting layer, and the organic material layer comprising a compound represented by Formula 2 or 3 is comprised between the cathode and the light emitting layer.

In the organic light emitting diode according to the present invention, an electron blocking layer may be comprised between the anode and the light emitting layer, and may comprise the compound represented by Formula 1.

In the organic light emitting diode according to the present invention, a hole transport layer and the electron blocking layer may be comprised between the anode and the light emitting layer, and the electron blocking layer may comprise the compound represented by Formula 1.

In this case, the electron blocking layer may be an organic material layer that is in contact with the light emitting layer.

In the organic light emitting diode according to the present invention, the electron blocking layer may act as the exciton blocking layer by comprising the compound represented by Formula 1.

In the organic light emitting diode according to the present invention, an electron transport layer may be comprised between the cathode and the light emitting layer, and may comprise the compound represented by Formula 2 or 3.

In the organic light emitting diode according to the present invention, the electron transport layer and the electron injection layer may be comprised between the cathode and the light emitting layer, and the electron transport layer may comprise the compound represented by Formula 2 or 3.

That is, the organic light emitting diode according to the present invention is characterized in that the organic material layer that is in contact with the light emitting layer between the anode and the light emitting layer comprises the compound represented by Formula 1, and the organic material layer that is in contact with the light emitting layer between the cathode and the light emitting layer comprises the compound represented by Formula 2 or 3. The organic material layer comprising the compound represented by Formula 1 may act as the exciton blocking layer to confine the exciton to the light emitting layer to prevent light emitting leakage, and thus it is possible to implement the organic light emitting diode having excellent light emitting efficiency. Further, simultaneously, the organic material layer comprising the compound represented by Formula 2 or 3 may act as the electron transport layer to further improve light emitting efficiency, a life span, and the like of the organic light emitting diode.

In the organic light emitting diode according to the present invention, substituent groups of Formulas 1 to 3 will be described in more detail below.

In Formula 1, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms. That is, in the definitions of Ar4, a substituted or unsubstituted fluorene group, and a substituted or unsubstituted naphthalene group are excluded.

Examples of the halogen group may comprise fluorine, chlorine, bromine, iodine, and the like, but are not limited thereto.

An alkyl group may be a straight chain or a branched chain, and specific examples thereof comprise a methyl group, an ethyl group, a propyl group, an isopropyl group, a butyl group, a t-butyl group, a pentyl group, a hexyl group, a heptyl group, and the like, but are not limited thereto.

An alkenyl group may be a straight chain or a branched chain, and specific examples thereof comprise an alkenyl group connected to an aryl group such as a stylbenyl group and a styrenyl group, but are not limited thereto.

Examples of an alkoxy group may comprise a methoxy group, an ethoxy group, an isopropyloxy group, and the like, but are not limited thereto.

An aryl group may be a monocycle type or a polycycle type. Examples of the monocyclic aryl group may comprise a phenyl group, a biphenyl group, a terphenyl group, stilben, and the like, and examples of the polycyclic aryl group may comprise a naphthyl group, an anthracenyl group, a phenanthrene group, a pyrenyl group, a perylenyl group, a cryxenyl group, a fluorene group, and the like, but are not limited thereto.

The heteroaryl group is a heteroatom and a cyclic group comprising O, N, S, or P, examples of a heterocyclic group comprise a carbazole group, a thiophene group, a furan group, a pyrrole group, an imidazole group, a thiazole group, an oxazole group, an oxadiazole group, a triazole group, a pyridyl group, a pyradazine group, a quinolynyl group, an isoquinolyn group, an acrydyl group, and the like, and the compounds of the following Structural Formulas are preferable but are not limited thereto.

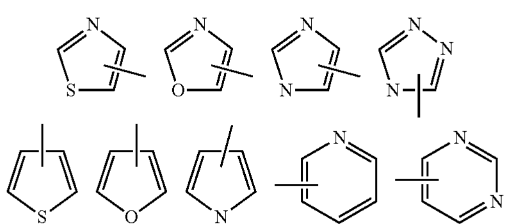

-continued

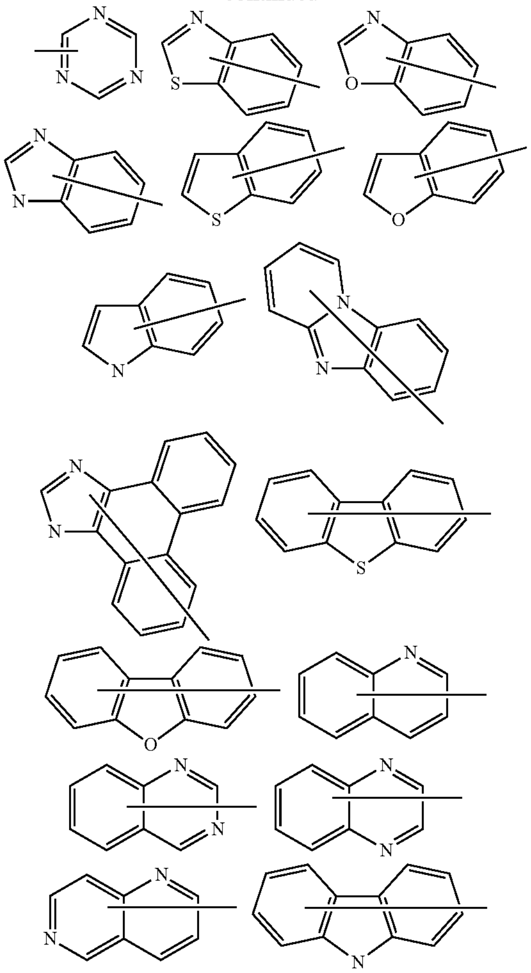

Further, in the present specification, the term "substituted or unsubstituted" means that substitution is performed by one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, and a fluorenyl group and a nitrile group substituted or unsubstituted by an aryl group, or there is no substituent group.

CY1, CY2, Ar1 to Ar11, L, L1, and R of Formulas 1 to 3 may be further substituted by additional substituent groups, and specific examples thereof may comprise a halogen group, an alkyl group, an alkenyl group, an alkoxy group, a silyl group, an arylalkenyl group, an aryl group, a heteroaryl group, a carbazole group, an arylamine group, a fluorenyl group substituted or unsubstituted by an aryl group, a nitrile group, and the like, but are not limited thereto.

In Formula 1, in the case where both CY1 and CY2 are a benzene cycle, Ar3 is preferably hydrogen or a phenyl group and Ar4 is preferably a phenyl group or a biphenyl group, but Ar3 and Ar4 are not limited thereto.

In Formula 1, in the case where both CY1 and CY2 are a benzene cycle, L is preferably a biphenyl group, but is not limited thereto.

The compound represented by Formula 1 may be represented by any one of the following Formulas 4 to 6.

[Formula 4]

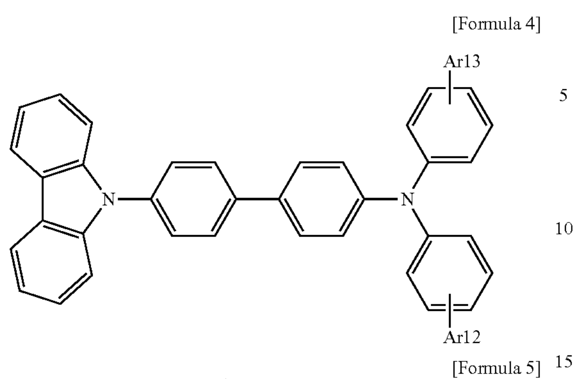

[Formula 5]

[Formula 6]

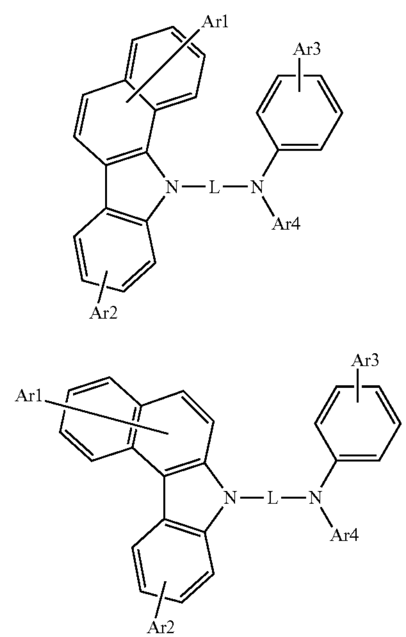

In Formulas 4 to 6,

Ar1 to Ar4, and L are the same as definitions of Formula 1, and at least one of Ar12 and Ar13 is a phenyl group, and the other is hydrogen, a substituted or unsubstituted alkyl group having 1 to 10 carbon atoms, or a phenyl group.

The compound represented by Formula 1 may be preferably selected from the group consisting of the following Structural Formulas, but is not limited thereto.

-continued

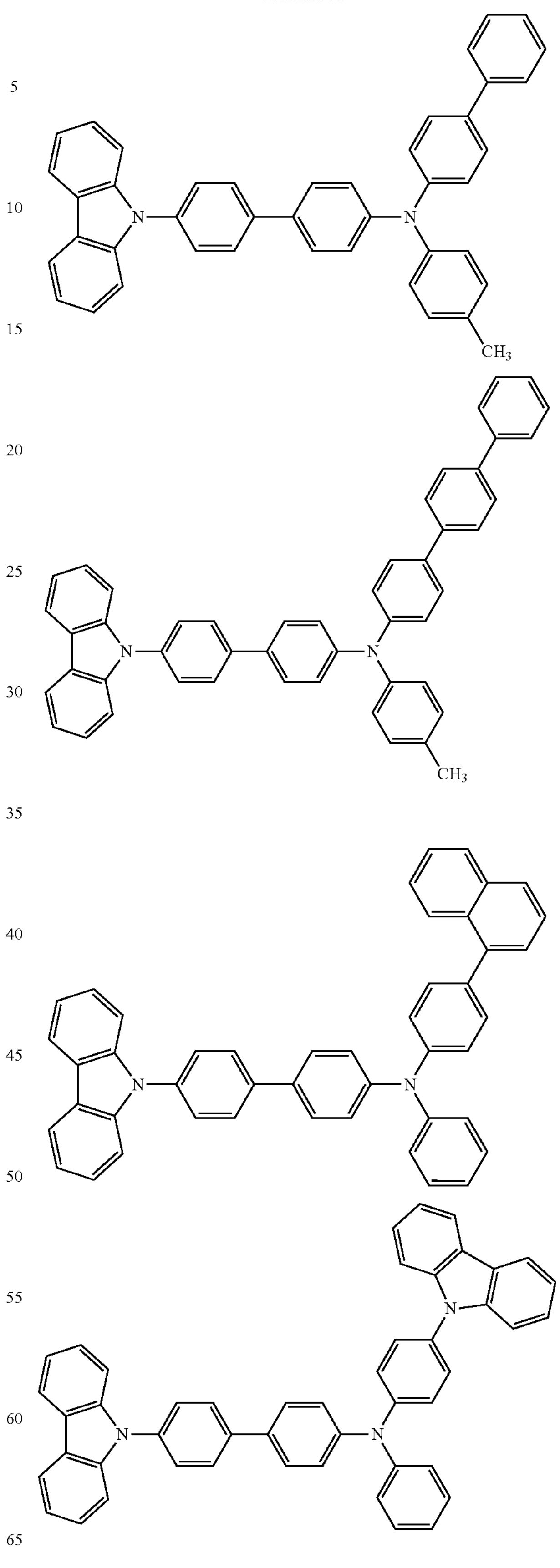

-continued
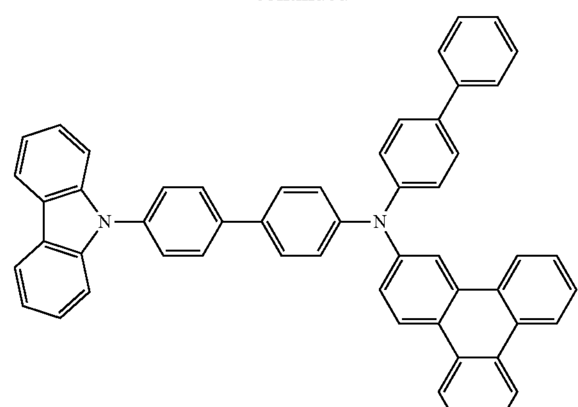
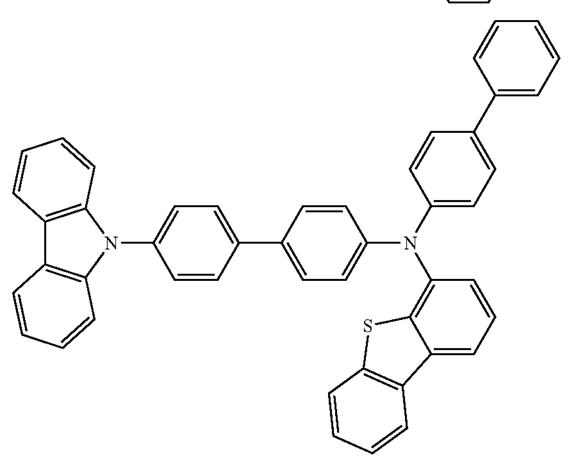
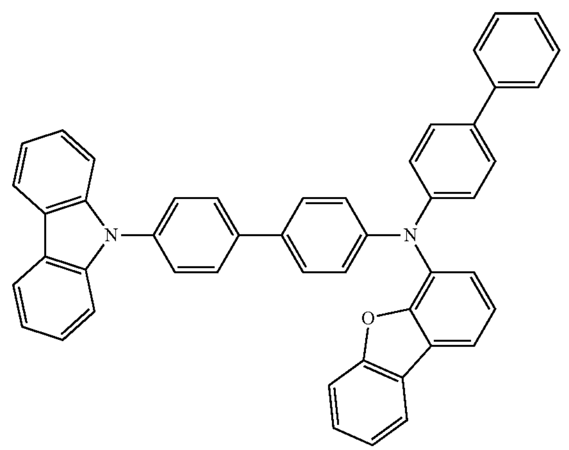
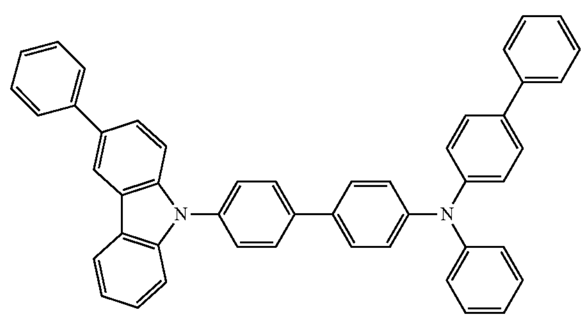
-continued
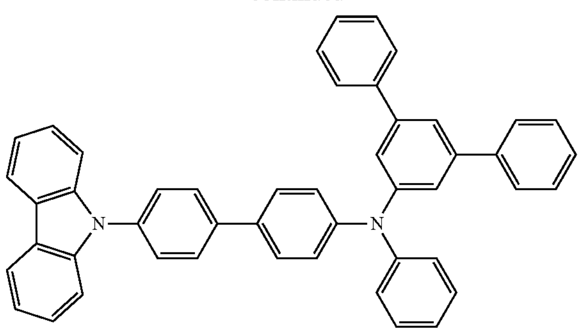
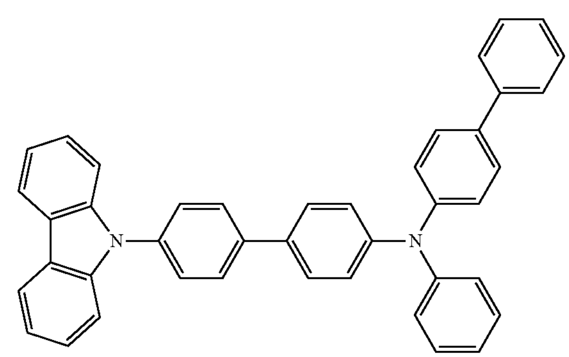
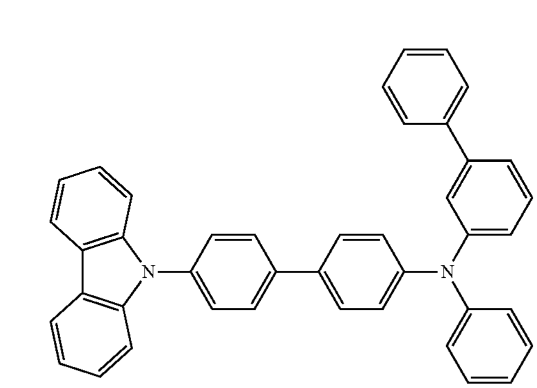
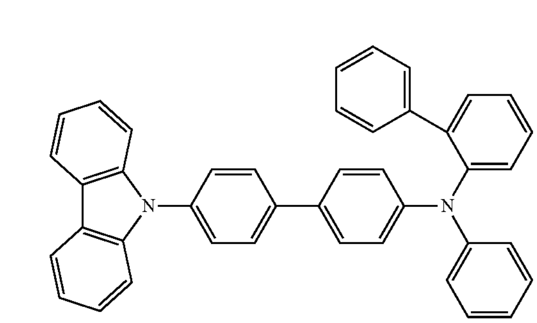

-continued
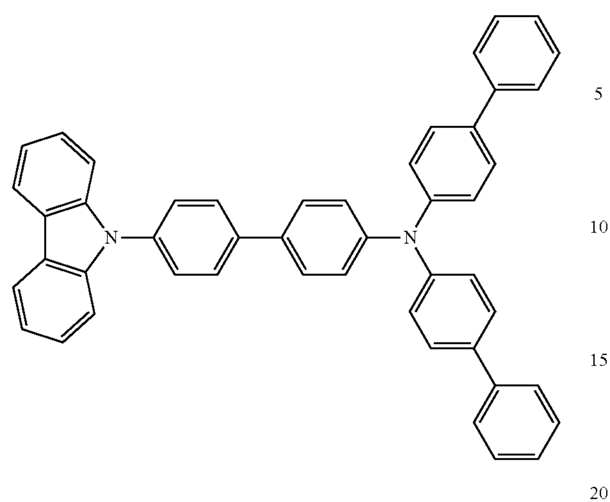
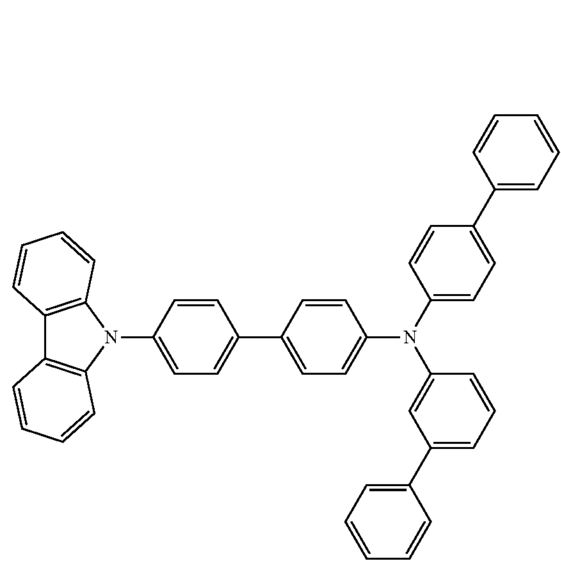
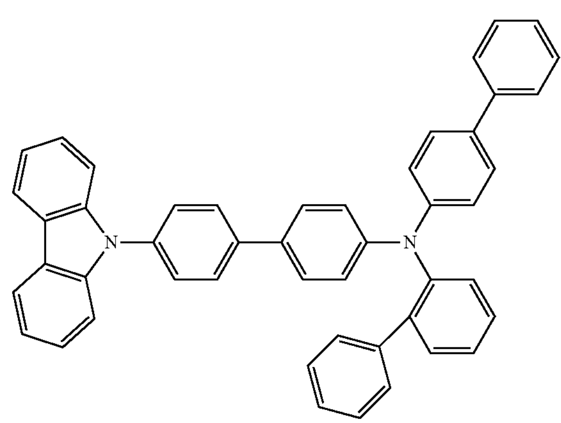
-continued
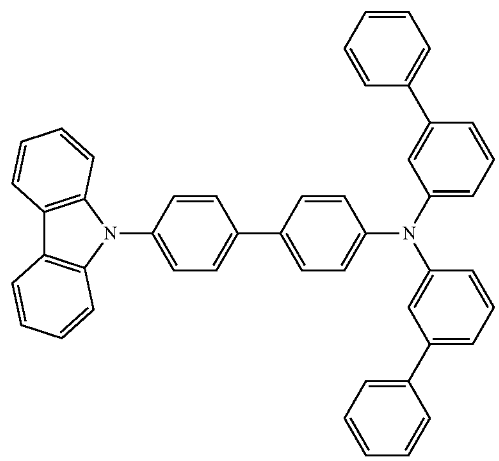
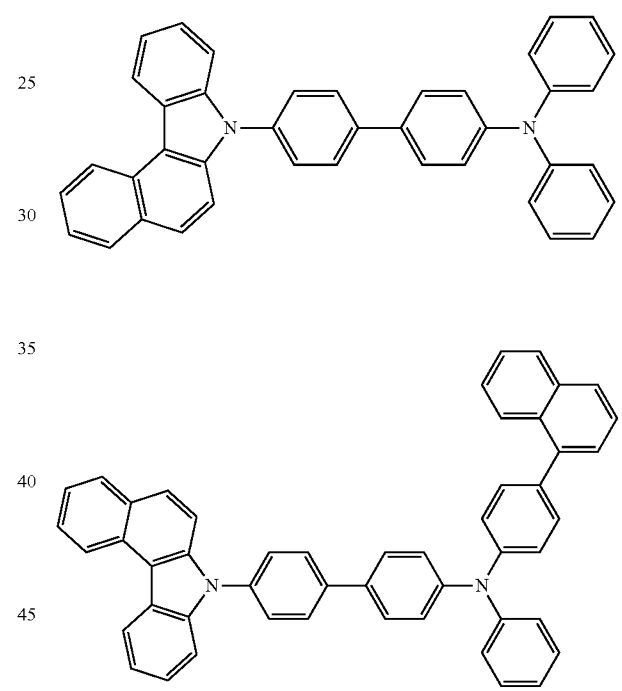
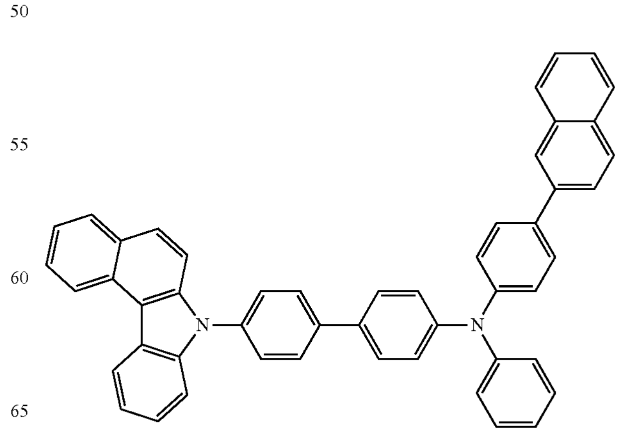

-continued
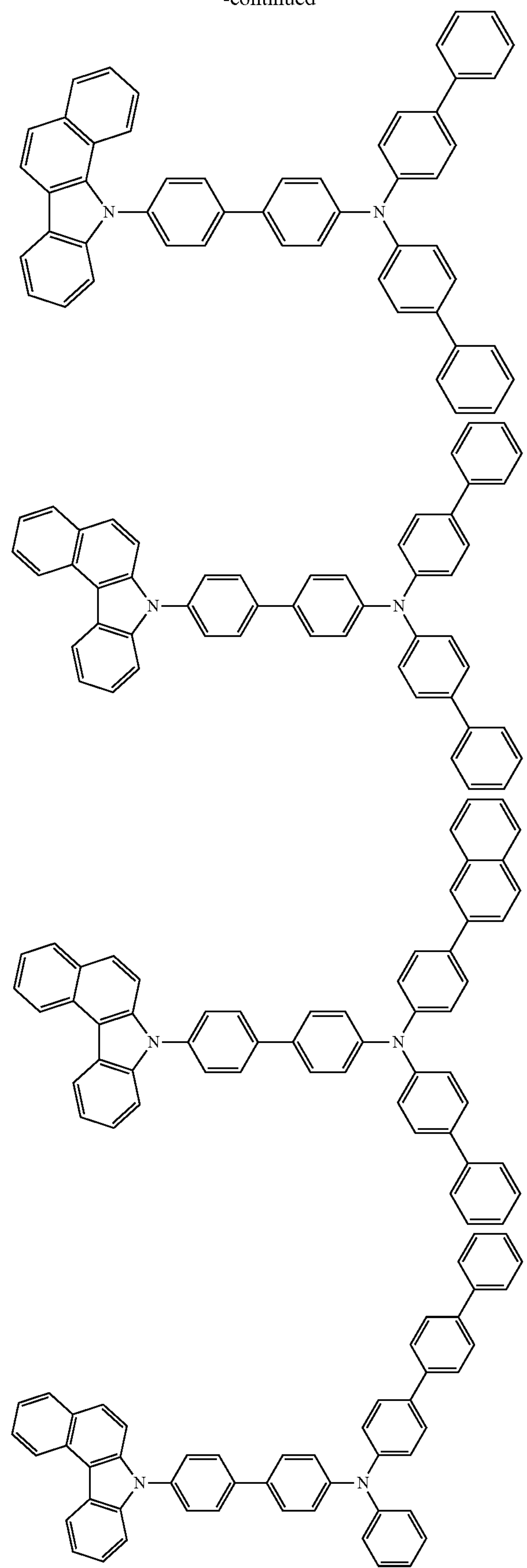
-continued
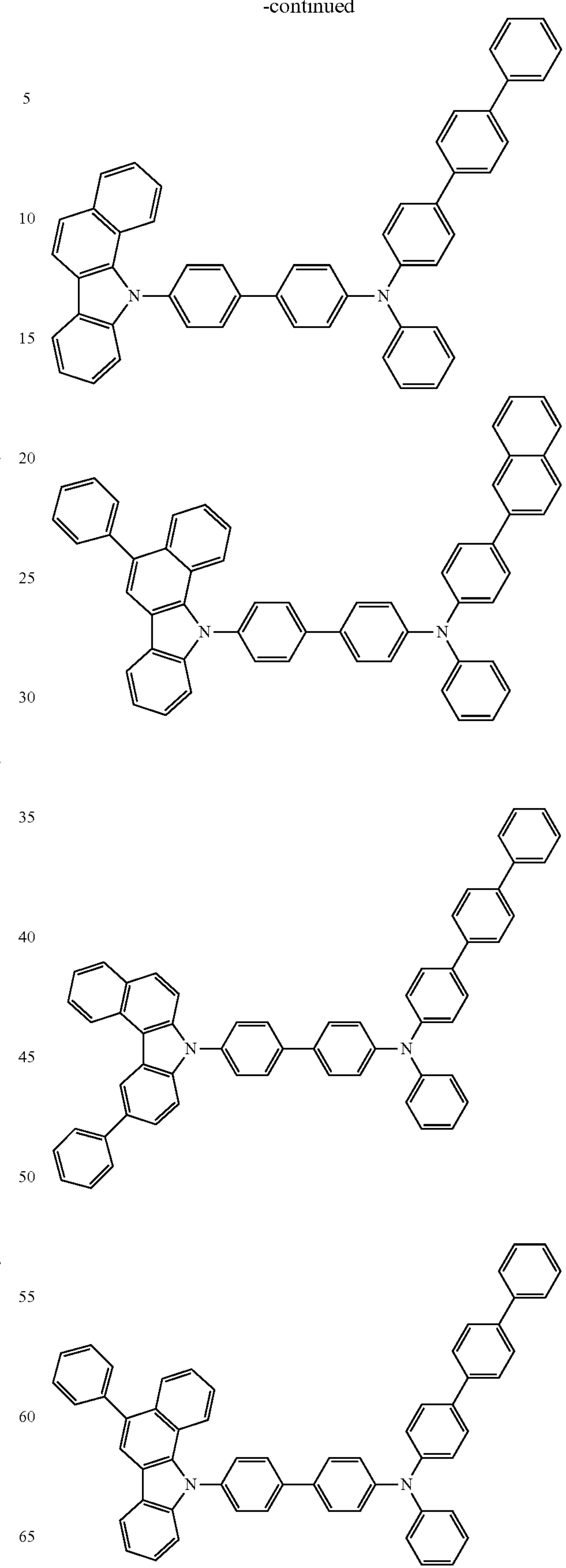

-continued
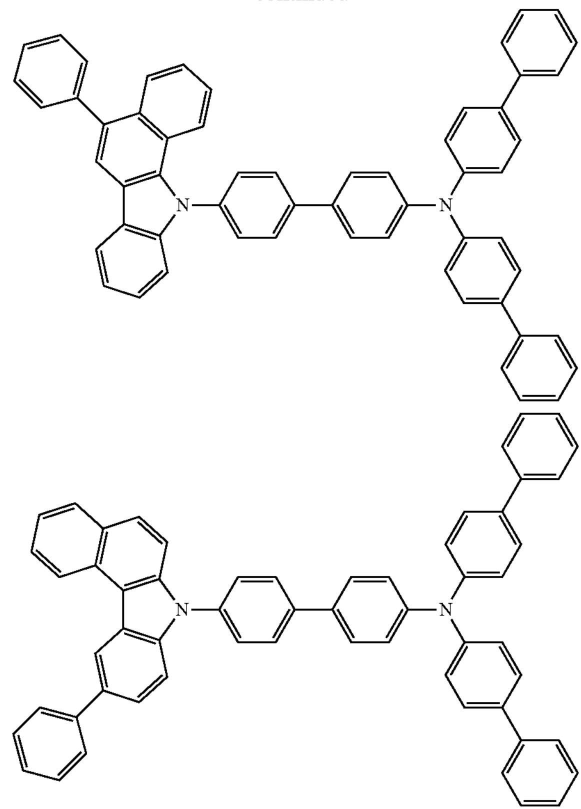
-continued
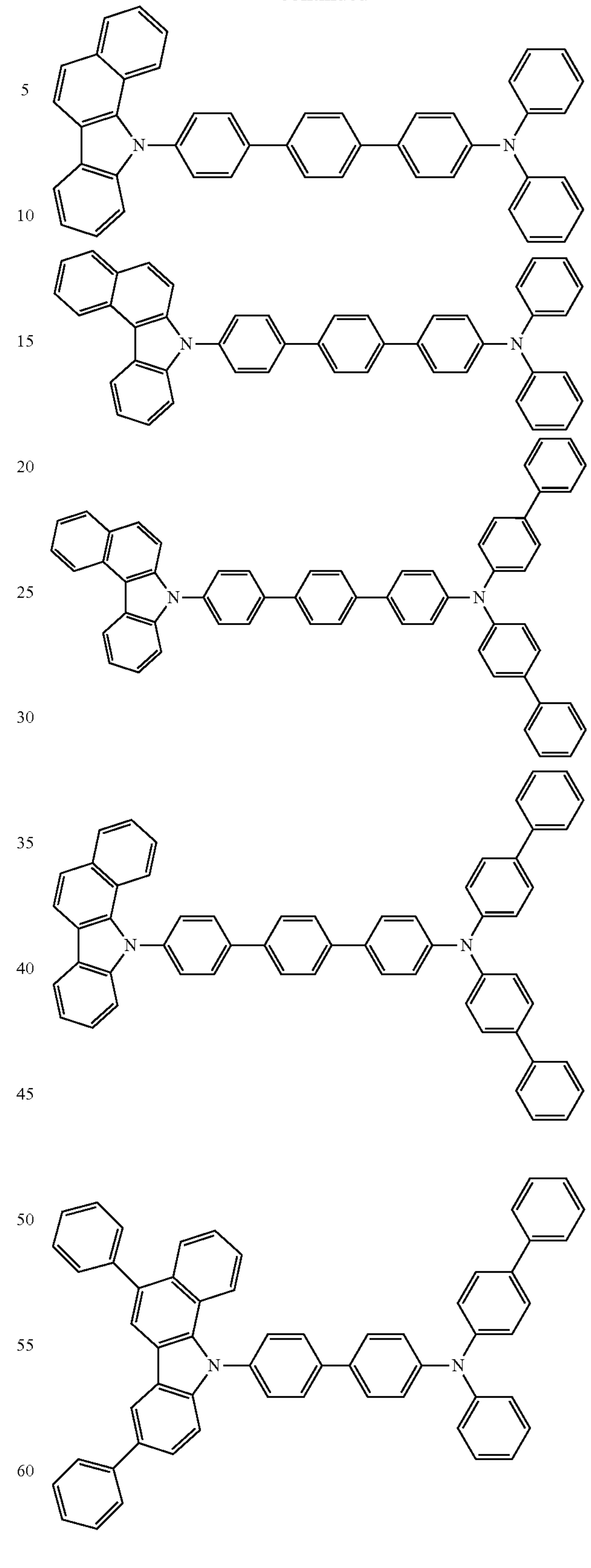
The compound represented by Formula 2 or 3 may be preferably selected from the group consisting of the following Structural Formulas, but is not limited thereto.

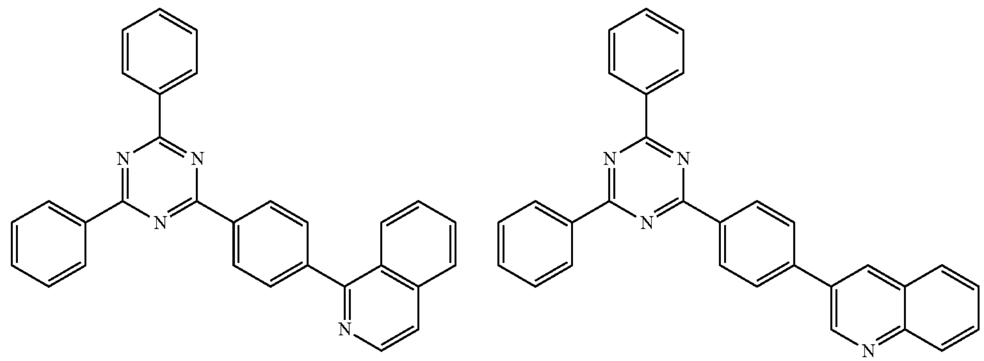
N
N
N
N
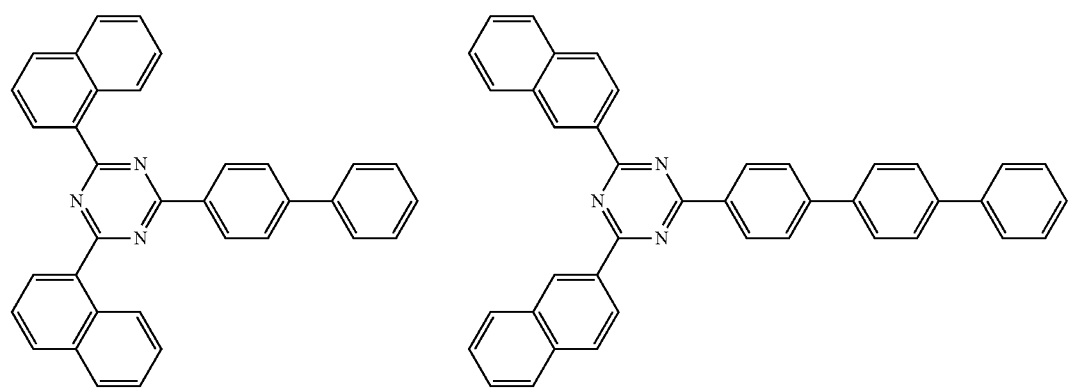
N
N
N
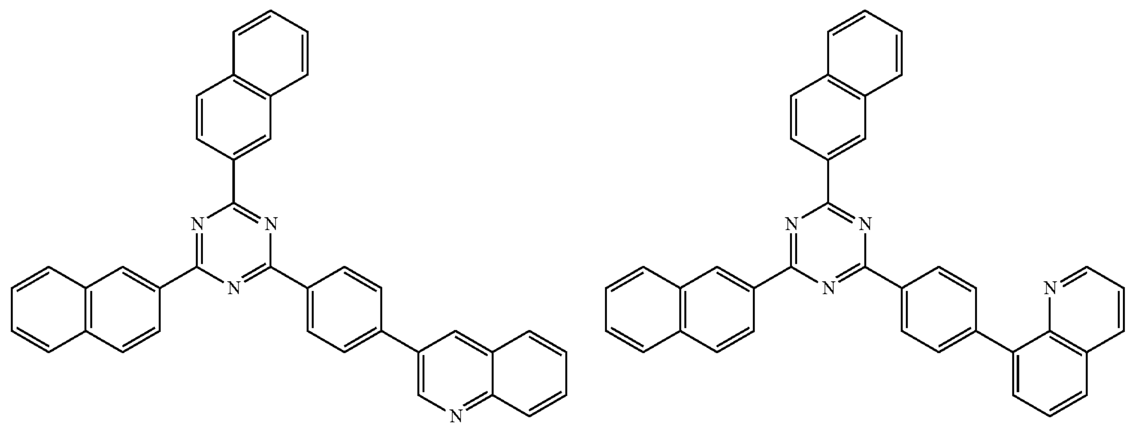
N
N
N
N
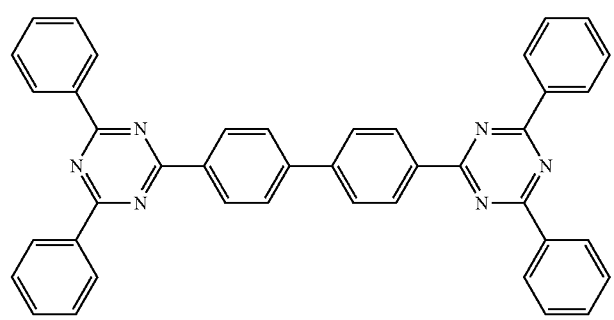
N
N
N

-continued
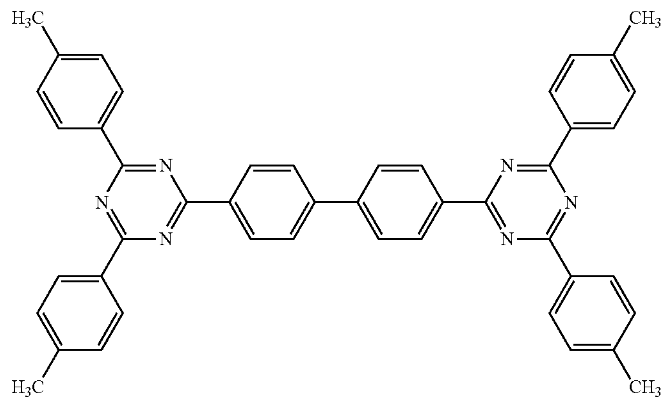
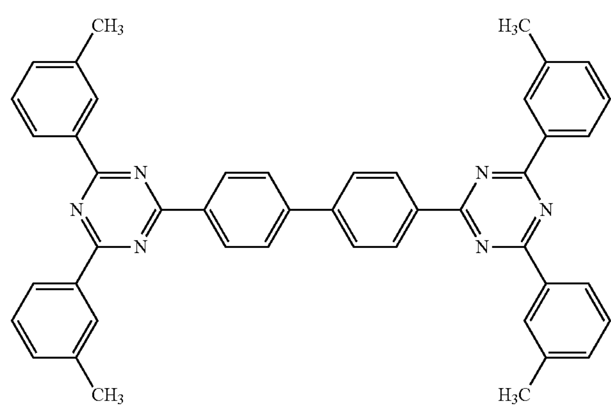
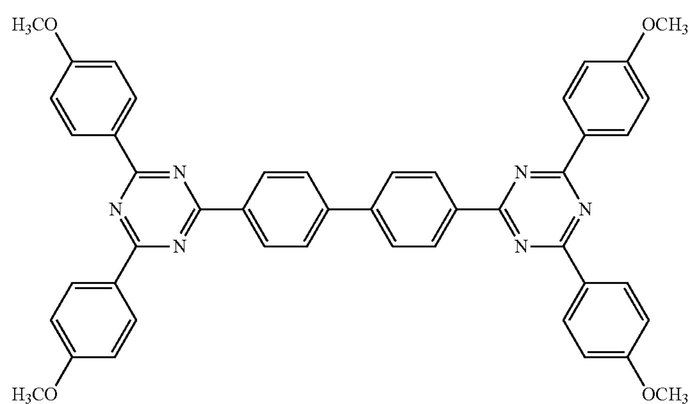
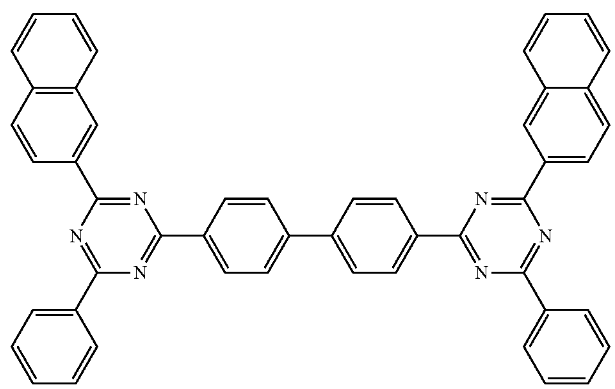

-continued
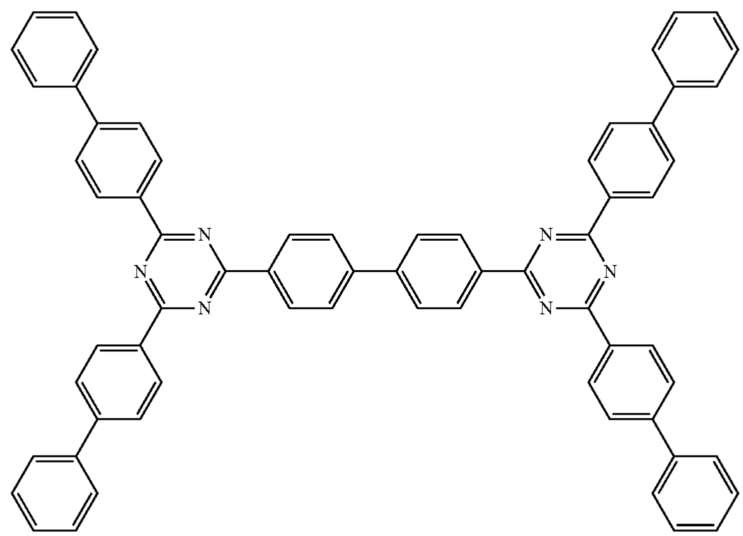
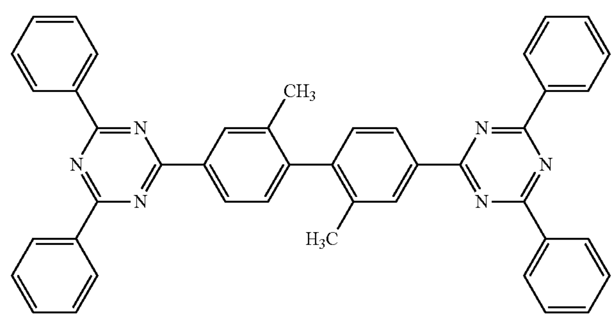
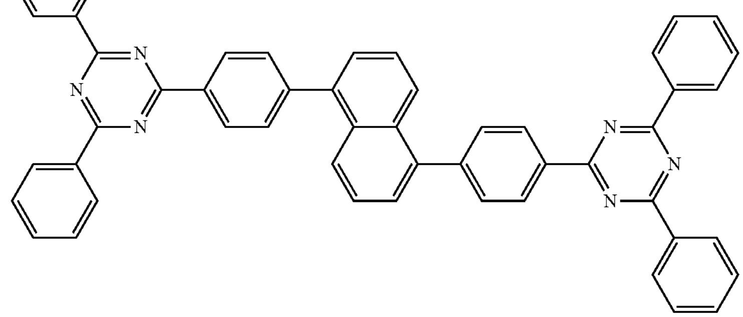
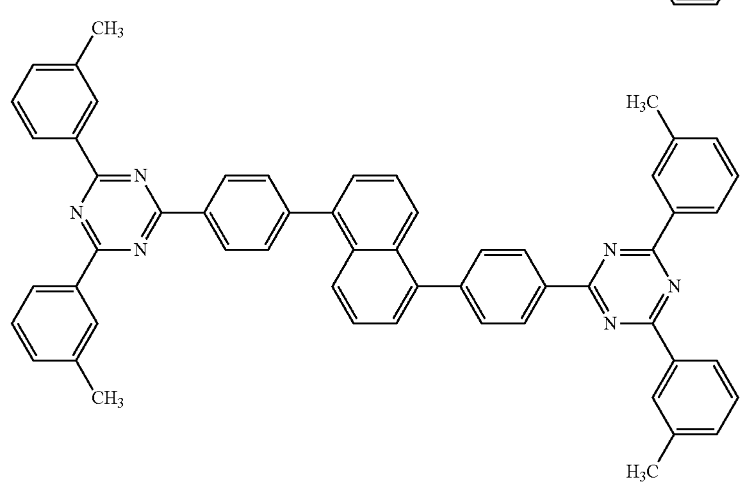

-continued
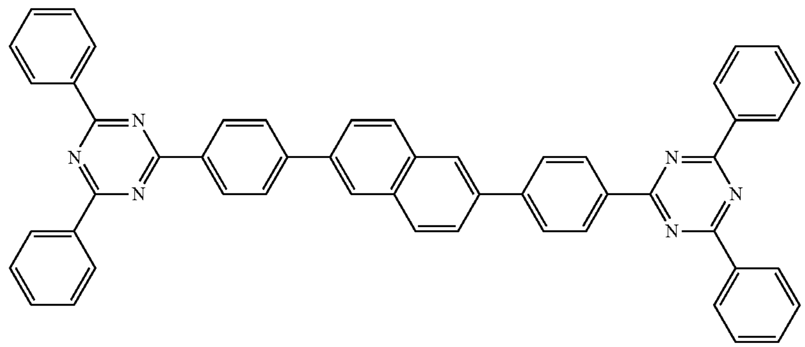
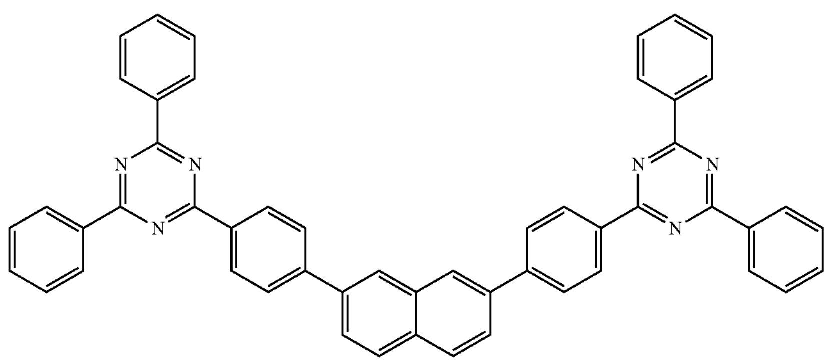
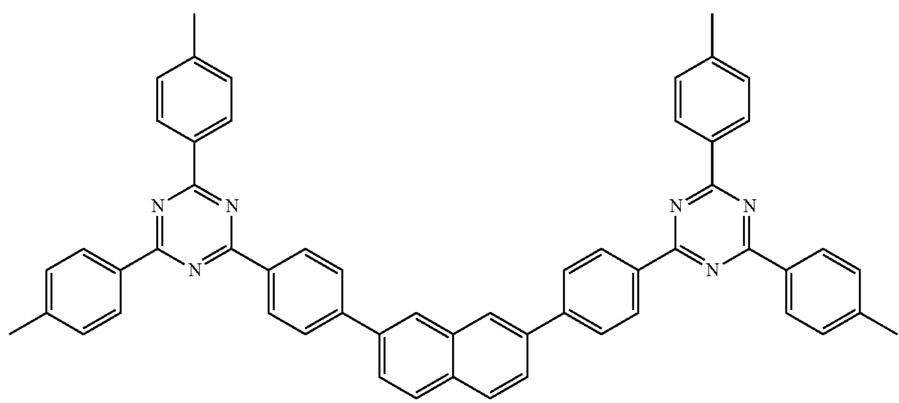
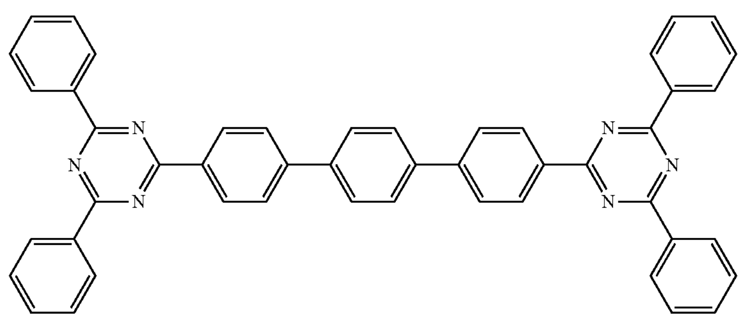

-continued
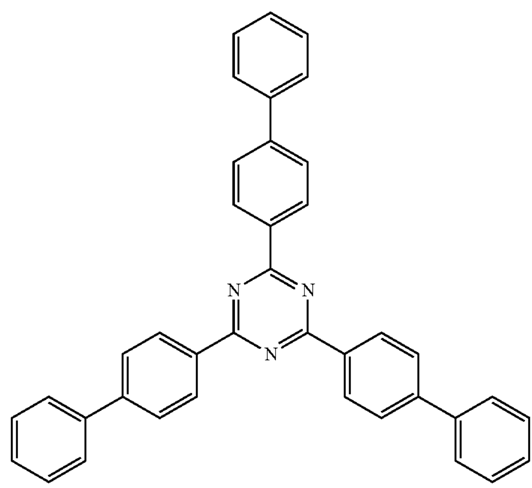
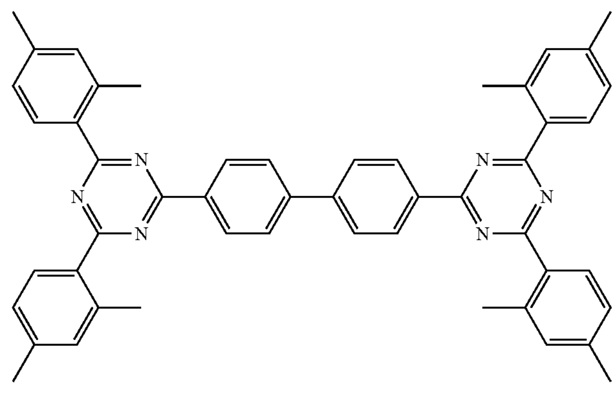
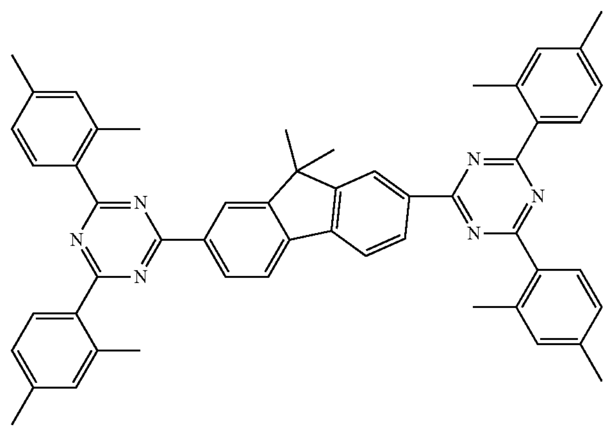
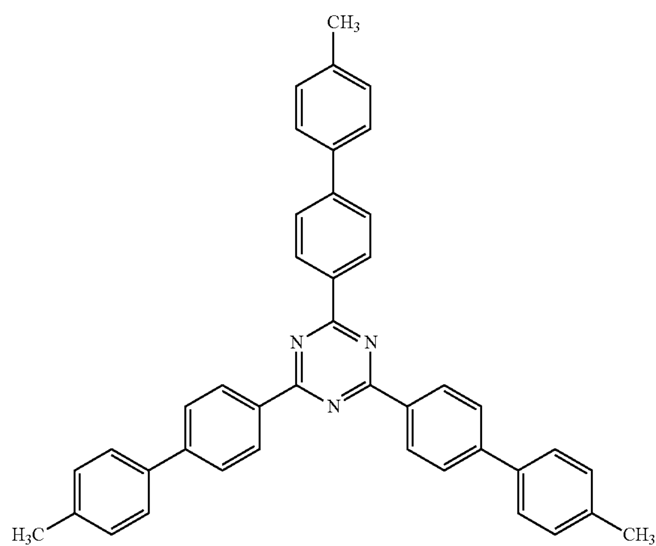

-continued
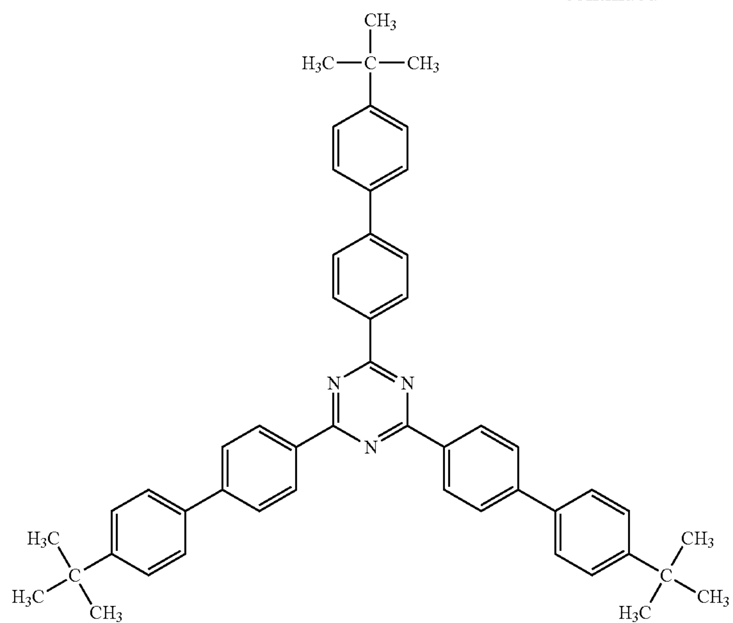
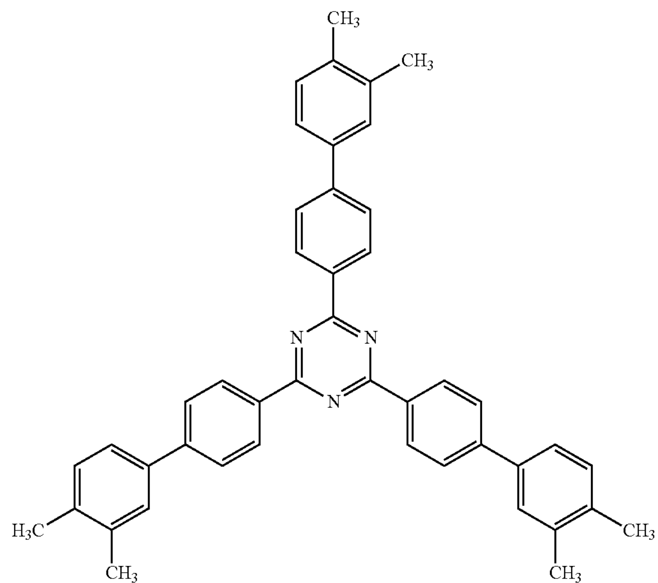

-continued
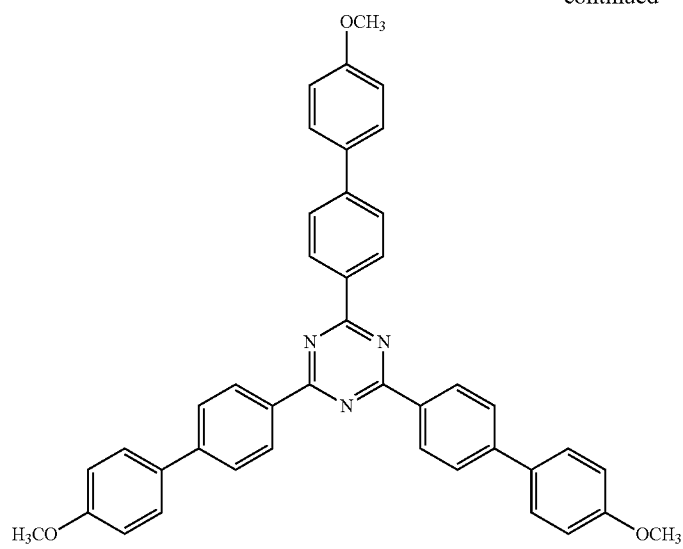
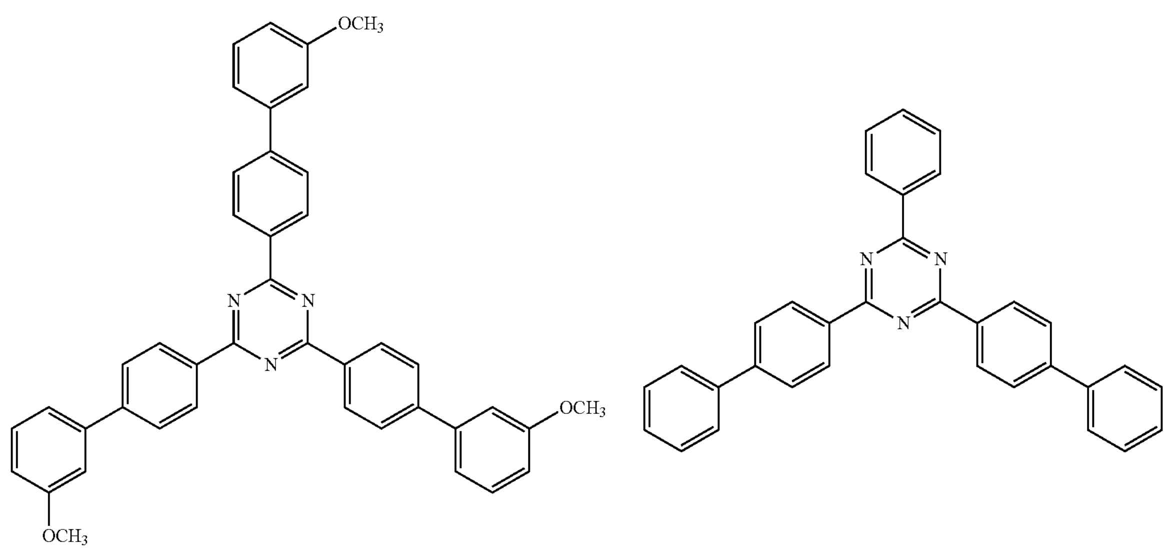
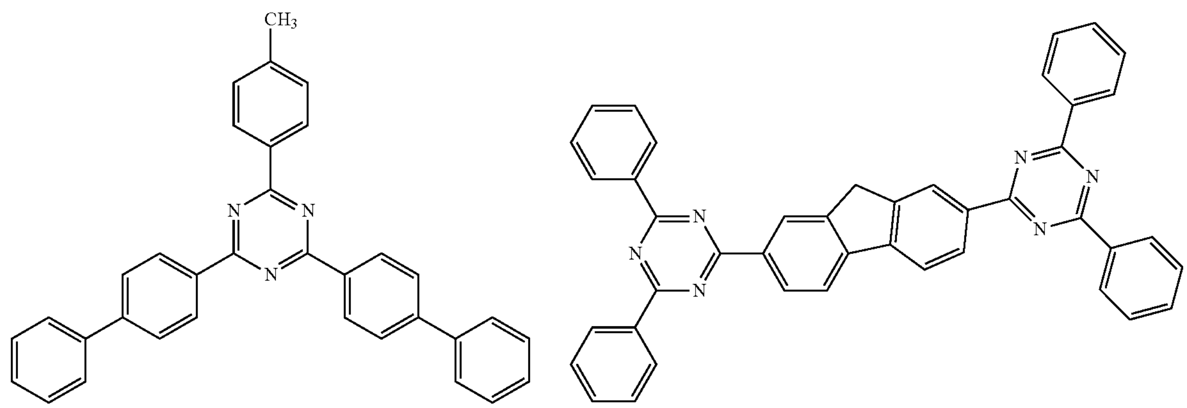

-continued
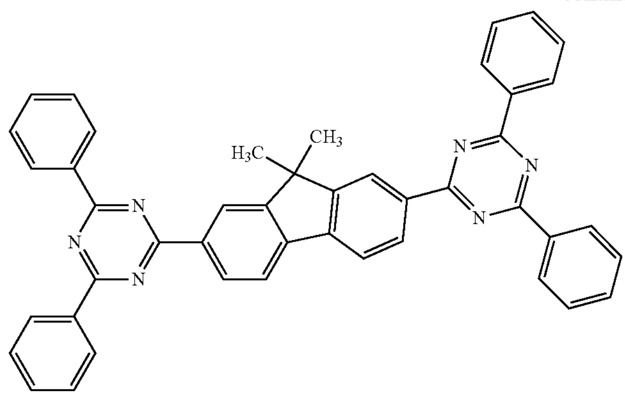
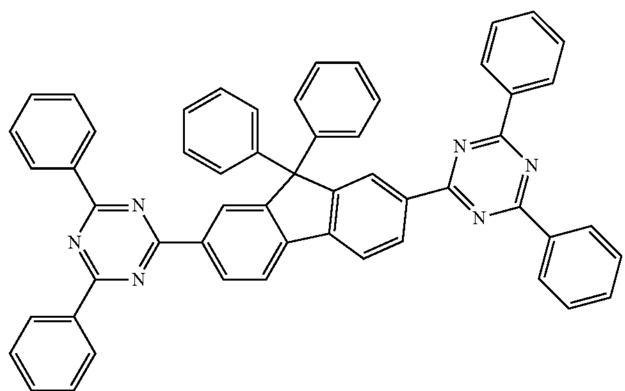
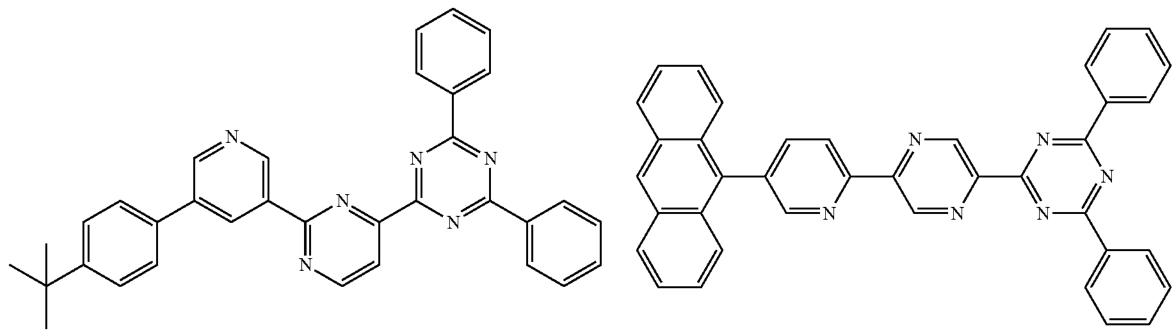
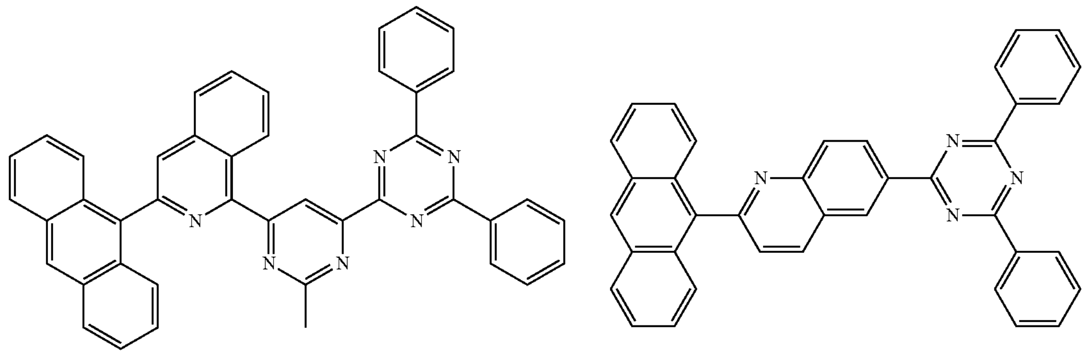

-continued
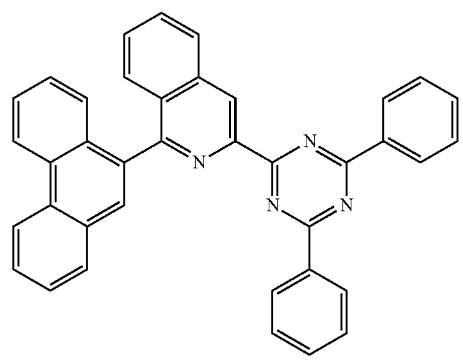
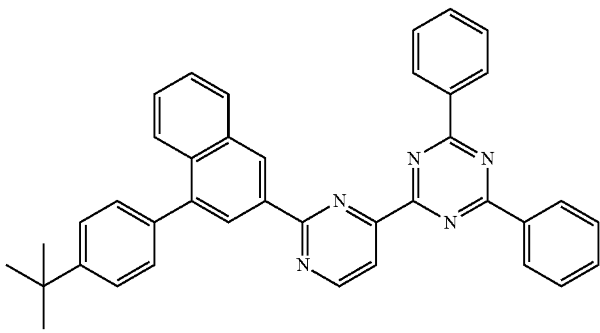
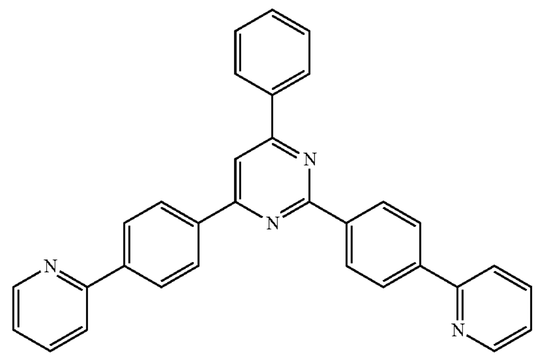
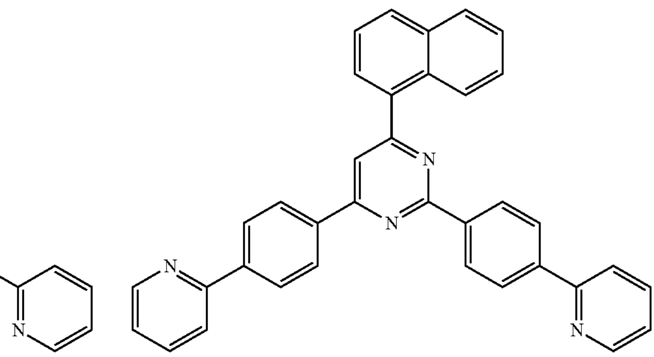
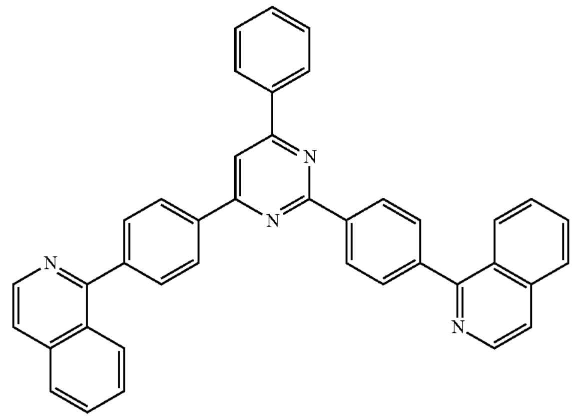
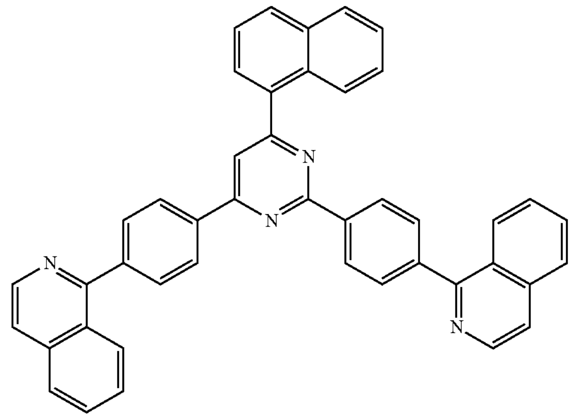
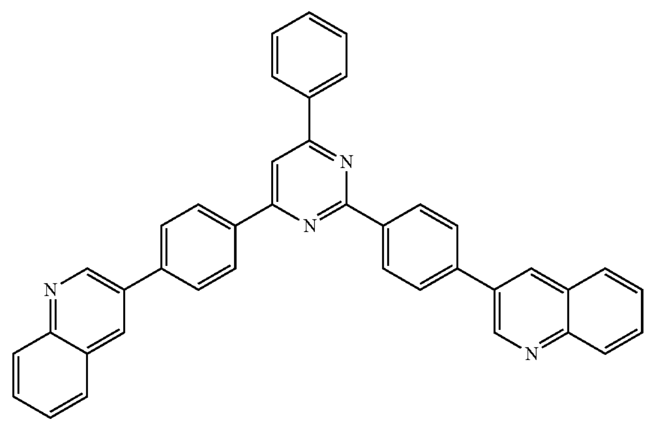
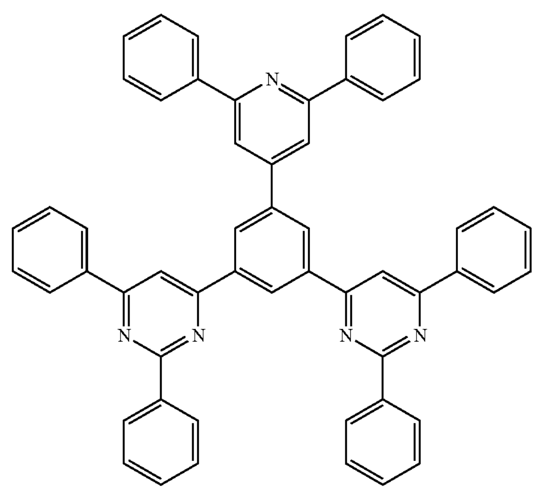

-continued
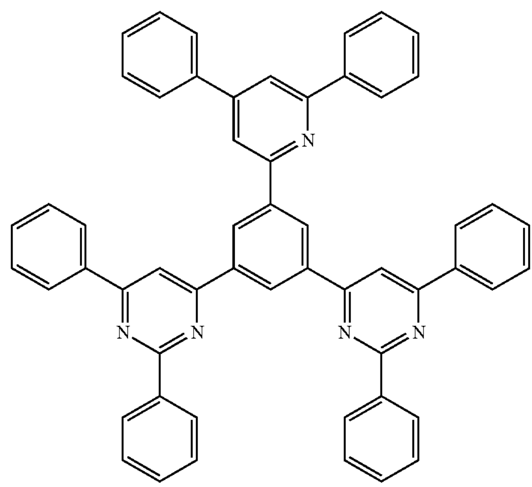
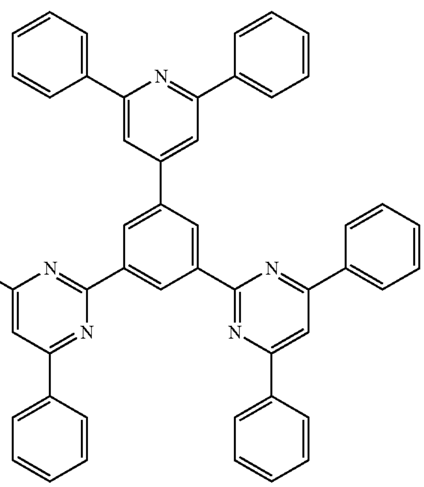
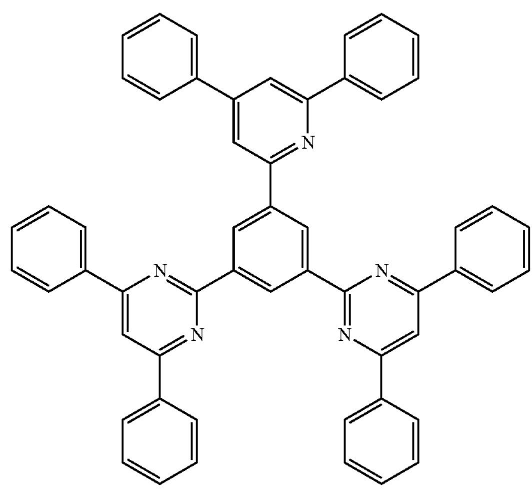
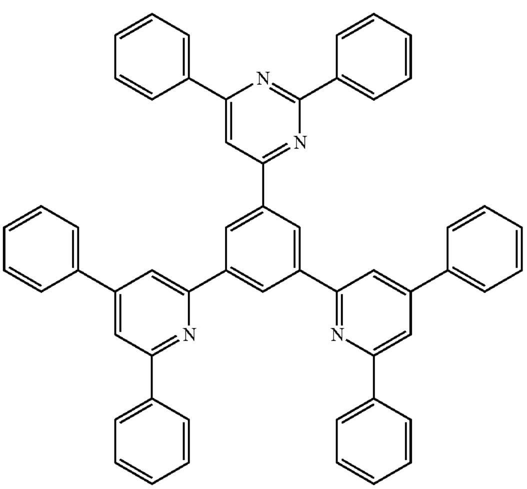
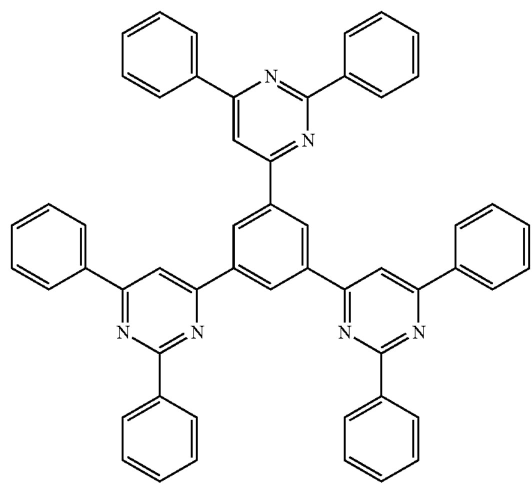
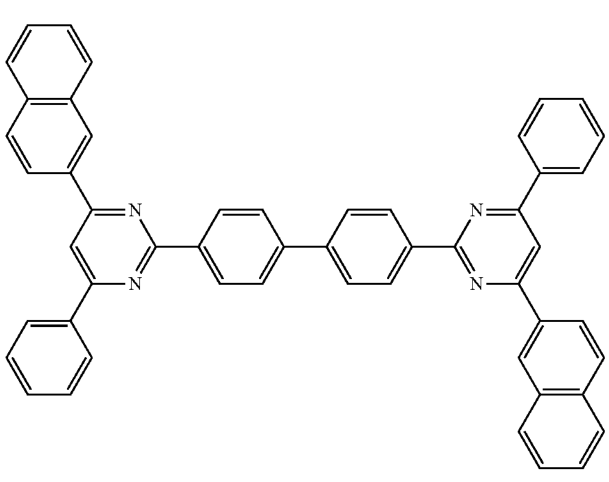

-continued
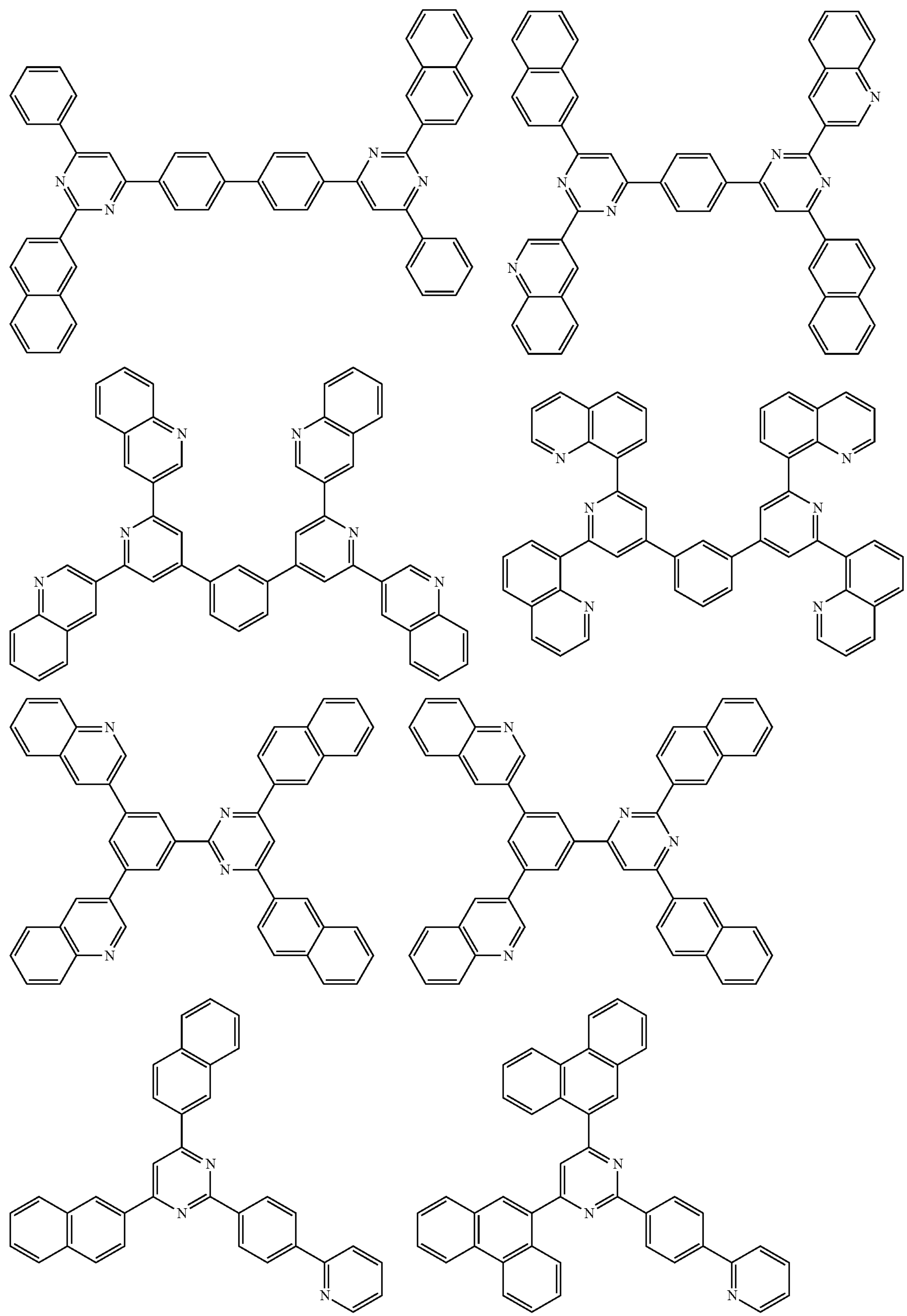

-continued
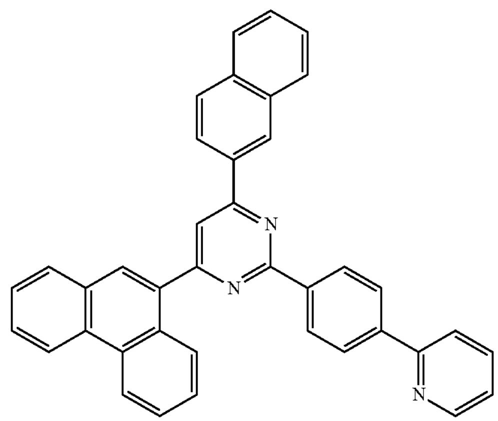
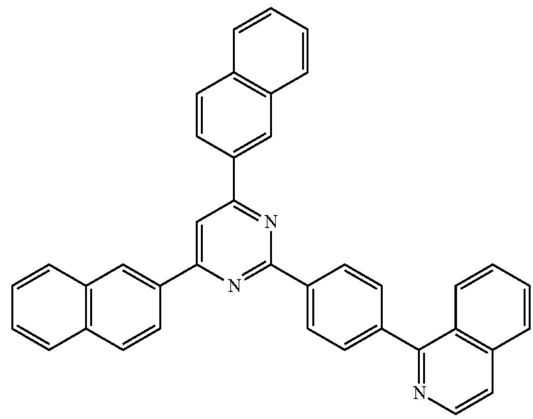
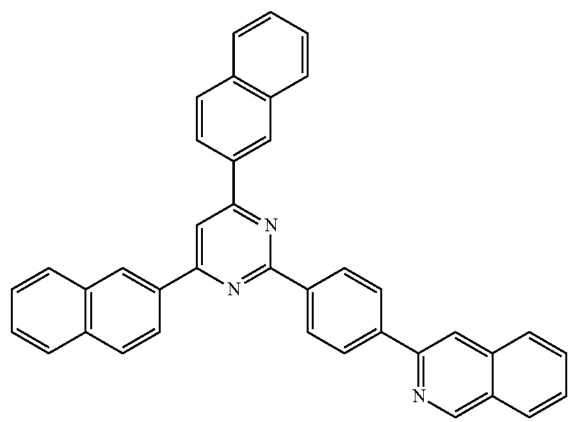
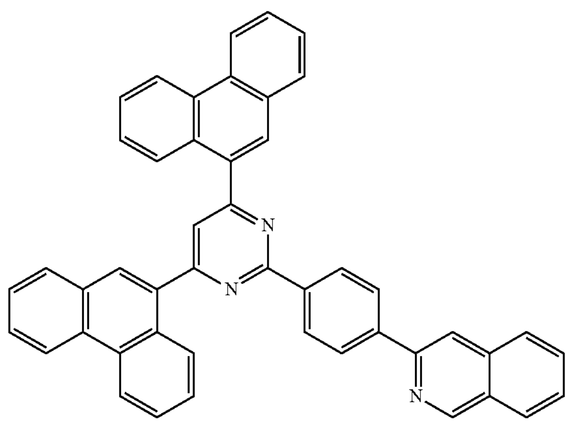
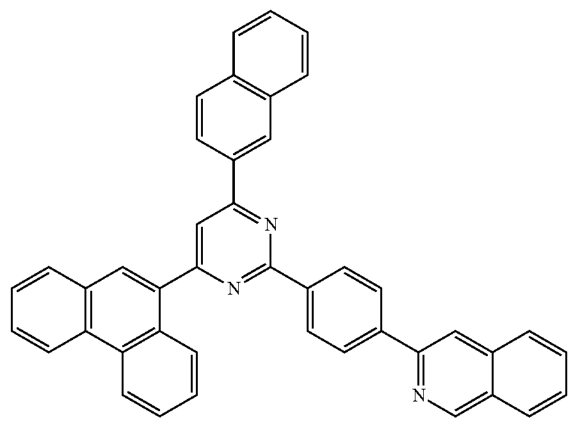
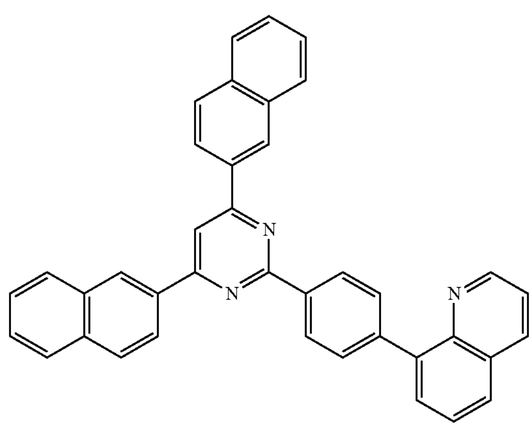

-continued

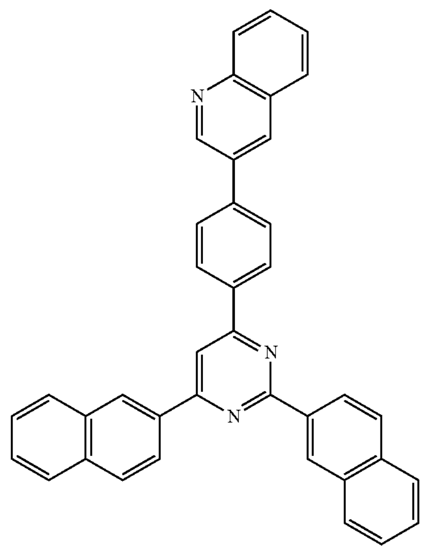

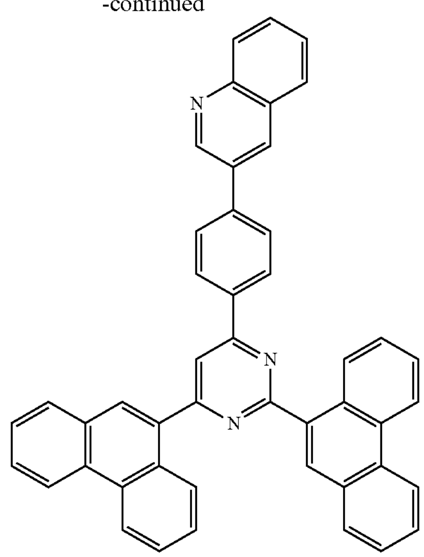

The organic light emitting diode according to the present invention may be manufactured by a manufacturing method and a material of a general organic light emitting diode, except that the one or more organic material layers are formed by using the aforementioned compounds.

The compounds represented by Formulas 1 to 3 may form the organic material layer by a vacuum deposition method and a solution coating method when the organic light emitting diode is manufactured. Herein, the solution coating method means spin coating, dip coating, inkjet printing, screen printing, a spray method, roll coating, and the like, but is not limited thereto.

The organic material layer of the organic light emitting diode of the present invention may have a single layer structure, or a multilayered structure in which two or more organic material layers are laminated. For example, the organic light emitting diode of the present invention may have a structure comprising a hole injection layer, a hole transport layer, a light emitting layer, an electron transport layer, an electron injection layer, and the like as an organic material layer. However, the structure of the organic light emitting diode is not limited thereto, but may comprise a smaller number of organic material layers.

For example, the structure of the organic light emitting diode of the present invention may have a structure illustrated in FIG. 1, but is not limited thereto.

FIG. 1 illustrates a structure of an organic light emitting diode, in which an anode 2, a hole injection layer 5, a hole transport layer 6, a light emitting layer 7, an electron transport layer 8, and a cathode 4 are sequentially laminated on a substrate 1. In the aforementioned structure, the compound represented by Formula 1 may be comprised in the hole transport layer 6, and the compound represented by Formula 2 may be comprised in the electron transport layer 8.

For example, the organic light emitting diode according to the present invention may be manufactured by depositing metal, metal oxides having conductivity, or an alloy thereof on the substrate by using a PVD (physical vapor deposition) method such as sputtering or e-beam evaporation to form the anode, forming the organic material layer comprising the hole injection layer, the hole transport layer, the light emitting layer, and the electron transport layer thereon, and depositing the material that can be used as the cathode thereon. In addition to the aforementioned method, the organic light emitting diode may be manufactured by sequentially depositing a cathode material, an organic material layer, and an anode material on the substrate.

The organic material layer may have a multilayered structure comprising the hole injection layer, the hole transport layer, the light emitting layer, the electron transport layer, and the like, but is not limited thereto and may have a single layer structure. Further, the organic material layer may be manufactured to have the smaller number of layers by using various polymer materials and by not the deposition method but the solvent process, for example, a method such as spin coating, dip coating, doctor blading, screen printing, inkjet printing, or a heat transferring method.

It is preferable that the anode material be, in general, a material having a large work function so as to smoothly inject holes into the organic material layer. Specific examples of the anode material that can be used in the present invention comprise metal such as vanadium, chrome, copper, zinc, and gold, or an alloy thereof; metal oxides such as zinc oxides, indium oxides, indium tin oxides (ITO), and indium zinc oxides (IZO); a combination of metal and oxides such as ZnO:Al or $SnO_2$:Sb; conductive polymers such as poly(3-methyl compound), poly[3,4-(ethylene-1,2-dioxy) compound] (PEDT), polypyrole, and polyaniline, and the like, but are not limited thereto.

It is preferable that the cathode material be, in general, a material having a small work function so as to easily inject electrons into the organic material layer. Specific examples of the cathode material comprise metal such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection material is a material that can well receive holes from the anode at a low voltage, and it is preferable that a HOMO (highest occupied molecular orbital) of the hole injection material be a value between a work function of the anode material and the HOMO of the organic material layer therearound. Specific examples of the hole injection material comprise metal porphyrine, oligothiophene, an arylamine-based organic material, a hexanitrilehexaazatriphenylene-based organic material, a quinacridone-based organic material, a perylene-based organic material, anthraquinone, polyaniline, a polycompound-based conductive polymer, and the like, but are not limited thereto.

The hole transport material is a material that can receive the holes from the anode or the hole injection layer and transport the holes to the light emitting layer, and is preferably a material having large mobility to the holes. Specific examples thereof comprise an arylamine-based organic material, a conductive polymer, a block copolymer in which a conjugate portion and a non-conjugate portion are present together, and the like, but are not limited thereto.

The light emitting material is a material that can receive the holes and the electrons from the hole transport layer and the electron transport layer, respectively, and bonds the holes and the electrons to emit light in a visible ray region, and is preferably a material having good quantum efficiency to fluorescence or phosphorescence. Specific examples thereof comprise a 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene, and the like, but are not limited thereto.

Particularly, in the organic light emitting diode according to the present invention, it is preferable that the light emitting layer comprise a blue fluorescent material or a green phosphorescent material.

The electron transport material is a material that can receive well the electrons from the cathode and transport the electrons to the light emitting layer, and is preferably a material having large mobility to the electrons. Specific examples thereof comprise a 8-hydroxyquinoline Al complex; a complex comprising $Alq_3$; an organic radical compound; a hydroxyflavone-metal complex, and the like, but are not limited thereto.

The organic light emitting diode according to the present invention may be a top emission type, a bottom emission type, or a both-sided emission type according to the used material. Further, the organic light emitting diode according to the present invention may have a positive structure in which a lower electrode is the anode and an upper electrode is the cathode, or a negative structure in which the lower electrode is the cathode and the upper electrode is the anode.

The compound according to the present invention may functions even in an organic electronic diode such as an organic solar cell, an organic photoconductor, and an organic transistor based on the principle that is similar to the principle applied to the organic light emitting diode.

The organic light emitting diode according to the present invention comprises the exciton blocking layer comprising the compound represented by Formula 1 to confine an exciton to the light emitting layer to prevent light emitting leakage, and thus there is an effect of implementing an organic electroluminescence diode having excellent light emitting efficiency. Further, even though there is no separate electron injection layer, electron injection and light transport characteristics are excellent by comprising the electron transport layer comprising the compound represented by Formula 2 or 3, and thus it is possible to implement an organic light emitting diode having a simple and economical manufacturing process, a low voltage, high efficiency, and a long life span as compared to the related art.

MODE FOR INVENTION

Hereinafter, preferable Examples will be described in order to help understanding of the present invention. However, the following Examples are set forth to illustrate the present invention, but the scope of the present invention is not limited thereto.

EXAMPLE

<Example 1> Manufacturing of the Organic Light Emitting Diode

The glass substrate (corning 7059 glass) on which the thin film of ITO (indium tin oxide) was applied to a thickness of 1,000 Å was immersed in distilled water having the detergent dissolved therein, and washed by the ultrasonic wave. In this case, the detergent as used herein was the product commercially available from Fisher Co. and the distilled water was one which had been twice filtered by using the filter commercially available from Millipore Co. ITO was washed for 30 mins, and washing with ultrasonic waves was then repeated twice for 10 mins by using distilled water. After the completion of washing with distilled water, washing with ultrasonic waves was performed by using solvents such as isopropyl alcohol, acetone, and methanol, and the resulting product was dried and transported to the plasma washing machine. Further, the substrate was dry-washed by using the oxygen plasma for 5 mins, and then transported to the vacuum deposition machine.

Hexanitrile hexaazatriphenylene (hereinafter, referred to as "HAT") that was the compound of the following Formula was deposited under the heat vacuum in a thickness of 100 Å on the prepared ITO transparent electrode to form the thin film. The interfacial characteristic between the substrate and the hole injection layer can be improved by the thin film. Subsequently, the compound of Formula HT-1 was deposited in a thickness of 800 Å on the thin film to form the hole transport layer, and the compound of the following Formula EB-4 was deposited in a thickness of 200 Å thereon to form the electron blocking layer. Subsequently, 10 wt % of the compound of Formula PD-1 was doped onto the compound of Formula PH-1 to form the light emitting layer in a thickness of 300 Å. The compound of Formula HB-1 was deposited in a thickness of 50 Å thereon to form the hole blocking layer, and subsequently, the electron transport layer material of Formula ET-1 was deposited in a thickness of 300 Å to form the electron transport layer. Lithium fluoride (LiF) in a thickness of 12 Å and aluminum in a thickness of 2,000 Å were sequentially deposited on the electron transport layer to form the cathode.

In the aforementioned process, the deposition rate of the organic material was maintained at 0.3 to 0.8 Å/sec. Further, the deposition rate of lithium fluoride of the cathode was maintained at 0.3 Å/sec, and the deposition rate of aluminum was maintained at 1.5 to 2.5 Å/sec. The degree of vacuum during the deposition was maintained at 1 to $3\times10^{-7}$.

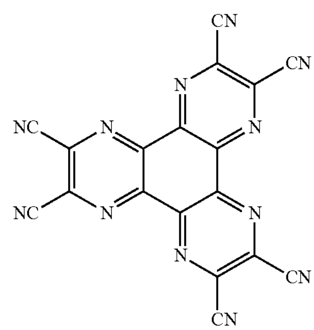
[HAT]
[HT-1]
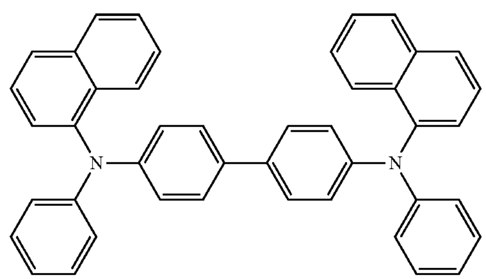
[EB-4]
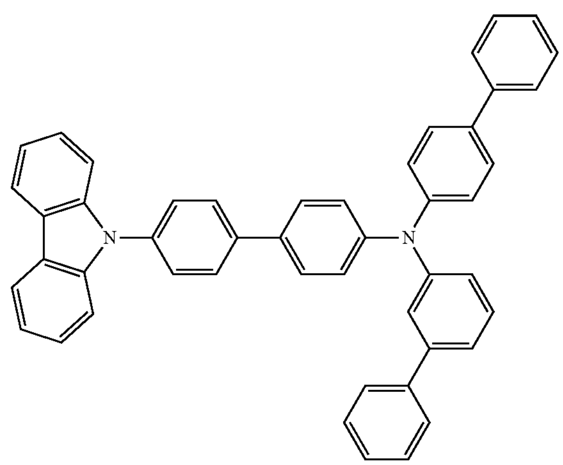
[PH-1]
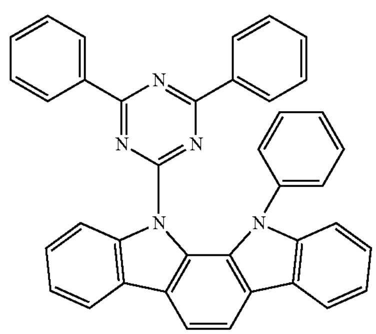
[PD-1]
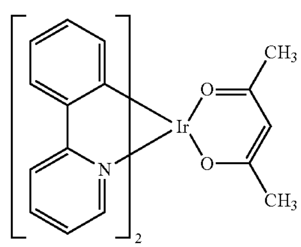
[HB-1]
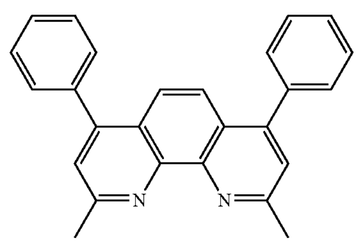
[ET-1]
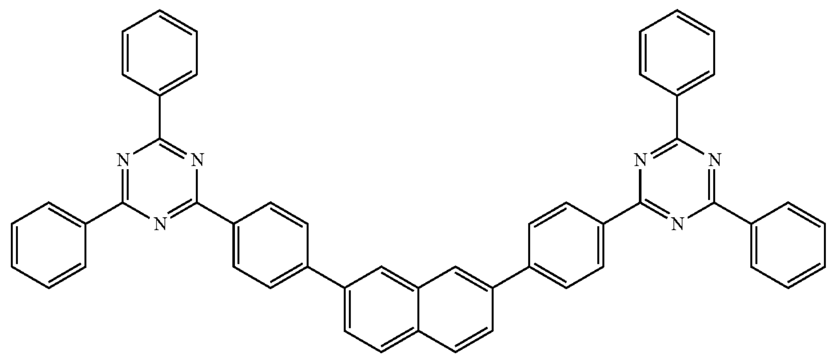

<Example 2> Manufacturing of the Organic Light Emitting Diode

The same diode was manufactured, except that the compound of Formula ET-1 used as the electron transport layer in Example 1 was substituted by the compound of the following Formula ET-2.

[ET-2]

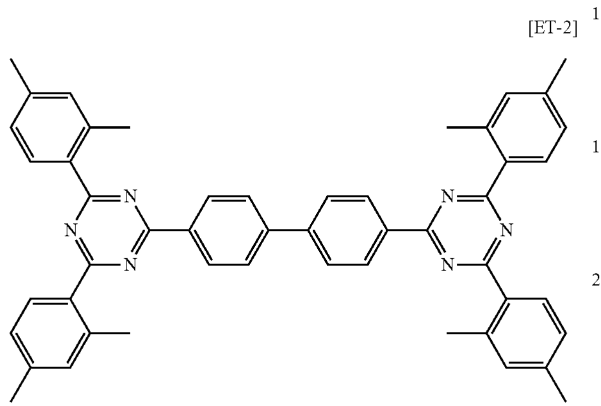

<Example 3> Manufacturing of the Organic Light Emitting Diode

The same diode was manufactured, except that the compound of Formula ET-1 used as the electron transport layer in Example 1 was substituted by the compound of the following Formula ET-3.

[ET-3]

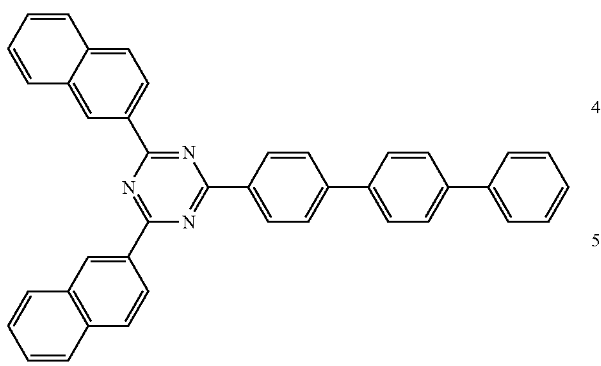

<Example 4> Manufacturing of the Organic Light Emitting Diode

The same diode was manufactured, except that the compound of Formula ET-1 used as the electron transport layer in Example 1 was substituted by the compound of the following Formula ET-4.

[ET-4]

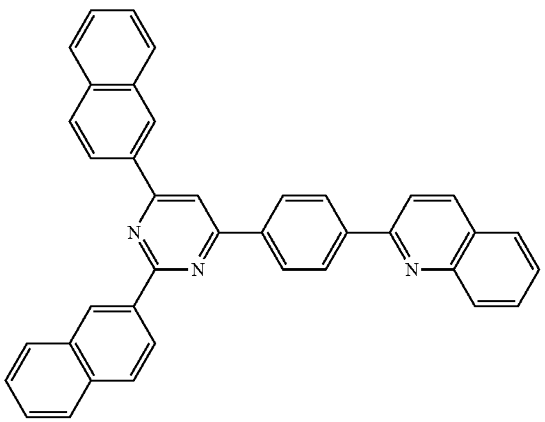

<Example 5> Manufacturing of the Organic Light Emitting Diode

The same diode was manufactured, except that the compound of Formula EB-4 used as the electron blocking layer in Example 1 was substituted by the compound of the following Formula EB-5.

[EB-5]

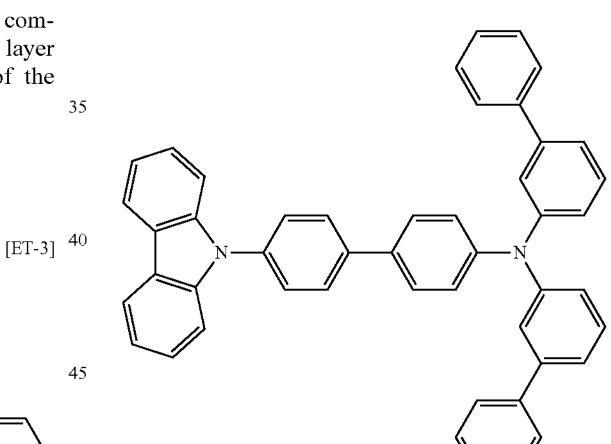

<Example 6> Manufacturing of the Organic Light Emitting Diode

The same diode was manufactured, except that the compound of Formula EB-4 used as the electron blocking layer in Example 2 was substituted by the compound of Formula EB-5.

<Example 7> Manufacturing of the Organic Light Emitting Diode

The same diode was manufactured, except that the compound of Formula EB-4 used as the electron blocking layer in Example 3 was substituted by the compound of Formula EB-5.

<Example 8> Manufacturing of the Organic Light Emitting Diode

The same diode was manufactured, except that the compound of Formula EB-4 used as the electron blocking layer in Example 4 was substituted by the compound of Formula EP-5.

<Example 9> Manufacturing of the Organic Light Emitting Diode

The same diode was manufactured, except that the compound of Formula EB-4 used as the electron blocking layer in Example 1 was substituted by the compound of the following Formula EB-6.

[EB-6]

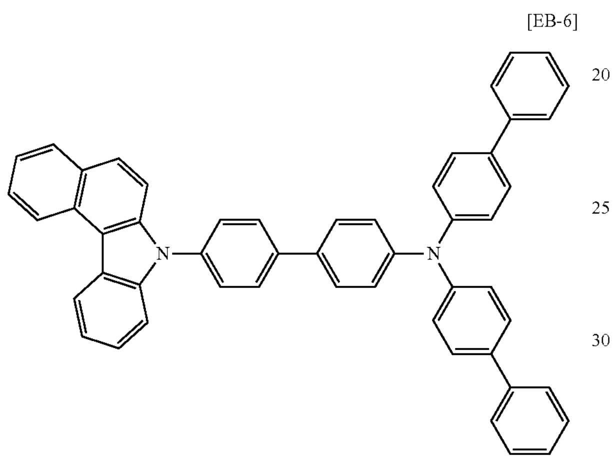

<Example 10> Manufacturing of the Organic Light Emitting Diode

The same diode was manufactured, except that the compound of Formula EB-4 used as the electron blocking layer in Example 2 was substituted by the compound of Formula EB-6.

<Example 11> Manufacturing of the Organic Light Emitting Diode

The same diode was manufactured, except that the compound of Formula EB-4 used as the electron blocking layer in Example 3 was substituted by the compound of Formula EB-6.

<Example 12> Manufacturing of the Organic Light Emitting Diode

The same diode was manufactured, except that the compound of Formula EB-4 used as the electron blocking layer in Example 4 was substituted by the compound of Formula EB-6.

<Example 13> Manufacturing of the Organic Light Emitting Diode

The same diode was manufactured, except that the compound of Formula EB-4 used as the electron blocking layer in Example 1 was substituted by the compound of the following Formula EB-7.

[EB-7]

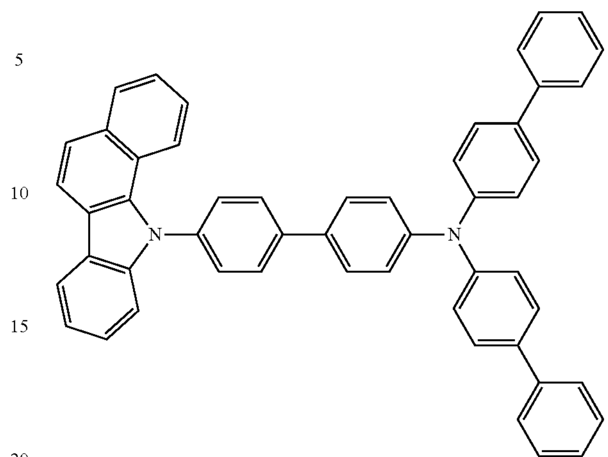

<Example 14> Manufacturing of the Organic Light Emitting Diode

The same diode was manufactured, except that the compound of Formula EB-4 used as the electron blocking layer in Example 2 was substituted by the compound of Formula EB-7.

<Example 15> Manufacturing of the Organic Light Emitting Diode

The same diode was manufactured, except that the compound of Formula EB-4 used as the electron blocking layer in Example 3 was substituted by the compound of Formula EB-7.

<Example 16> Manufacturing of the Organic Light Emitting Diode

The same diode was manufactured, except that the compound of Formula EB-4 used as the electron blocking layer in Example 4 was substituted by the compound of Formula EB-7.

The driving voltage and light emitting efficiency of the organic light emitting diode manufactured by the aforementioned method were measured at the current density of 10 mA/cm$^2$, and the time (LT90) at which brightness was 90% of initial brightness was measured at the current density of 20 mA/cm$^2$. The result is described in the following Table 1.

TABLE 1

| Example | Voltage (V) | Light emitting efficiency (cd/A) | CIE-x | CIE-y | LT90 (hr) at 20 mA/cm$^2$ |
|---|---|---|---|---|---|
| 1 | 4.9 | 64.2 | 0.455 | 0.534 | 232.3 |
| 2 | 4.7 | 63.3 | 0.453 | 0.537 | 237.6 |
| 3 | 4.3 | 68.5 | 0.444 | 0.544 | 229.7 |
| 4 | 6.2 | 62.1 | 0.452 | 0.538 | 245.8 |
| 5 | 5.3 | 63.2 | 0.439 | 0.549 | 280.8 |
| 6 | 4.4 | 71.2 | 0.443 | 0.546 | 259.5 |
| 7 | 5.2 | 65.6 | 0.441 | 0.546 | 261.8 |
| 8 | 4.2 | 73.4 | 0.435 | 0.553 | 255.5 |
| 9 | 4.7 | 74.2 | 0.442 | 0.546 | 295.5 |
| 10 | 4.8 | 63.7 | 0.450 | 0.540 | 296.2 |
| 11 | 4.0 | 68.1 | 0.448 | 0.541 | 285.5 |
| 12 | 4.2 | 68.3 | 0.448 | 0.541 | 289.9 |

TABLE 1-continued

| Example | Voltage (V) | Light emitting efficiency (cd/A) | CIE-x | CIE-y | LT90 (hr) at 20 mA/cm$^2$ |
|---|---|---|---|---|---|
| 13 | 4.5 | 70.2 | 0.447 | 0.542 | 299.5 |
| 14 | 5.5 | 64.5 | 0.447 | 0.542 | 322.6 |
| 15 | 4.6 | 62.4 | 0.442 | 0.546 | 325.9 |
| 16 | 4.7 | 69.7 | 0.444 | 0.545 | 308.8 |

<Comparative Example 1> Manufacturing of the Organic Light Emitting Diode

The same diode was manufactured, except that the compound of Formula EB-4 used as the electron blocking layer in Example 1 was substituted by the compound of the following Formula EB-1.

[EB-1]

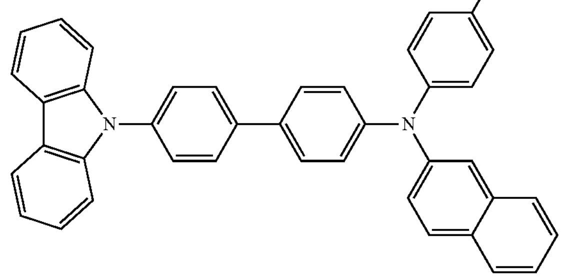

<Comparative Example 2> Manufacturing of the Organic Light Emitting Diode

The same diode was manufactured, except that the compound of Formula EB-4 used as the electron blocking layer in Example 2 was substituted by the compound of Formula EB-1.

<Comparative Example 3> Manufacturing of the Organic Light Emitting Diode

The same diode was manufactured, except that the compound of Formula EB-4 used as the electron blocking layer in Example 3 was substituted by the compound of Formula EB-1.

<Comparative Example 4> Manufacturing of the Organic Light Emitting Diode

The same diode was manufactured, except that the compound of Formula EB-4 used as the electron blocking layer in Example 4 was substituted by the compound of Formula EB-1.

<Comparative Example 5> Manufacturing of the Organic Light Emitting Diode

The same diode was manufactured, except that the compound of Formula EB-4 used as the electron blocking layer in Example 1 was substituted by the compound of the following Formula EB-2.

[EB-2]

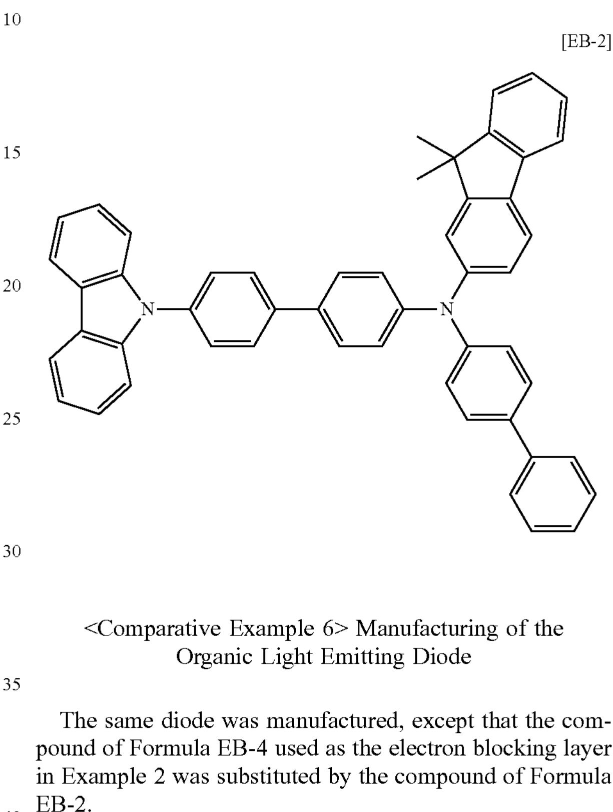

<Comparative Example 6> Manufacturing of the Organic Light Emitting Diode

The same diode was manufactured, except that the compound of Formula EB-4 used as the electron blocking layer in Example 2 was substituted by the compound of Formula EB-2.

<Comparative Example 7> Manufacturing of the Organic Light Emitting Diode

The same diode was manufactured, except that the compound of Formula EB-4 used as the electron blocking layer in Example 3 was substituted by the compound of Formula EB-2.

<Comparative Example 8> Manufacturing of the Organic Light Emitting Diode

The same diode was manufactured, except that the compound of Formula EB-4 used as the electron blocking layer in Example 4 was substituted by the compound of Formula EB-2.

<Comparative Example 9> Manufacturing of the Organic Light Emitting Diode

The same diode was manufactured, except that the compound of Formula EB-4 used as the electron blocking layer in Example 1 was substituted by the compound of the following Formula EB-3.

[EB-3]

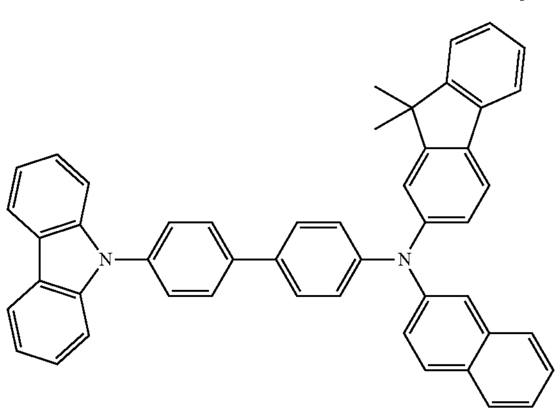

<Comparative Example 10> Manufacturing of the Organic Light Emitting Diode

The same diode was manufactured, except that the compound of Formula EB-4 used as the electron blocking layer in Example 2 was substituted by the compound of Formula EB-3.

<Comparative Example 11> Manufacturing of the Organic Light Emitting Diode

The same diode was manufactured, except that the compound of Formula EB-4 used as the electron blocking layer in Example 3 was substituted by the compound of Formula EB-3.

<Comparative Example 12> Manufacturing of the Organic Light Emitting Diode

The same diode was manufactured, except that the compound of Formula EB-4 used as the electron blocking layer in Example 4 was substituted by the compound of Formula EB-3.

<Comparative Example 13> Manufacturing of the Organic Light Emitting Diode

The same diode was manufactured, except that the compound of Formula ET-1 used as the electron transport layer in Example 1 was substituted by the compound of the following Formula ET-5.

[ET-5]

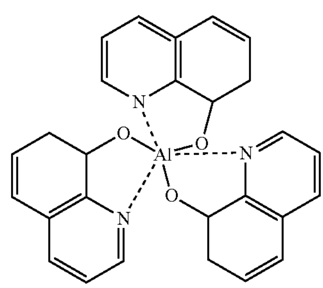

<Comparative Example 14> Manufacturing of the Organic Light Emitting Diode

The same diode was manufactured, except that the compound of Formula ET-1 used as the electron transport layer in Example 5 was substituted by the compound of Formula ET-5.

<Comparative Example 15> Manufacturing of the Organic Light Emitting Diode

The same diode was manufactured, except that the compound of Formula ET-1 used as the electron transport layer in Example 9 was substituted by the compound of Formula ET-5.

<Comparative Example 16> Manufacturing of the Organic Light Emitting Diode

The same diode was manufactured, except that the compound of Formula ET-1 used as the electron transport layer in Example 13 was substituted by the compound of Formula ET-5.

<Comparative Example 17> Manufacturing of the Organic Light Emitting Diode

The same diode was manufactured, except that the compound of Formula EB-4 used as the electron blocking layer in Example 1 was substituted by the compound of Formula EB-1 and the compound of Formula ET-1 used as the electron transport layer was substituted by the compound of Formula ET-5.

<Comparative Example 18> Manufacturing of the Organic Light Emitting Diode

The same diode was manufactured, except that the compound of Formula EB-4 used as the electron blocking layer in Example 1 was substituted by the compound of Formula EB-2 and the compound of Formula ET-1 used as the electron transport layer was substituted by the compound of Formula ET-5.

<Comparative Example 19> Manufacturing of the Organic Light Emitting Diode

The same diode was manufactured, except that the compound of Formula EB-4 used as the electron blocking layer in Example 1 was substituted by the compound of Formula EB-3 and the compound of Formula ET-1 used as the electron transport layer was substituted by the compound of Formula ET-5.

The driving voltage and light emitting efficiency of the organic light emitting diode manufactured by the aforementioned method were measured at the current density of 10 mA/cm$^2$, and the time (LT90) at which brightness was 90% of initial brightness was measured at the current density of 20 mA/cm$^2$. The result is described in the following Table 2.

TABLE 2

| Comparative Example | Voltage (V) | Light emitting efficiency (cd/A) | CIE-x | CIE-y | LT90 (hr) at 20 mA/cm$^2$ |
|---|---|---|---|---|---|
| 1 | 6.5 | 51.2 | 0.438 | 0.549 | 213.7 |
| 2 | 3.8 | 55.0 | 0.410 | 0.572 | 204.1 |
| 3 | 3.2 | 54.8 | 0.452 | 0.539 | 213.7 |
| 4 | 3.4 | 51.0 | 0.441 | 0.548 | 214.7 |

TABLE 2-continued

| Comparative Example | Voltage (V) | Light emitting efficiency (cd/A) | CIE-x | CIE-y | LT90 (hr) at 20 mA/cm$^2$ |
|---|---|---|---|---|---|
| 5 | 3.5 | 51.3 | 0.437 | 0.551 | 217.0 |
| 6 | 3.1 | 50.1 | 0.439 | 0.550 | 223.4 |
| 7 | 3.5 | 54.6 | 0.432 | 0.555 | 216.4 |
| 8 | 3.4 | 51.7 | 0.432 | 0.555 | 216.3 |
| 9 | 4.0 | 53.8 | 0.429 | 0.558 | 227.6 |
| 10 | 3.3 | 52.9 | 0.433 | 0.555 | 224.3 |
| 11 | 3.2 | 51.1 | 0.434 | 0.553 | 225.9 |
| 12 | 2.9 | 52.7 | 0.431 | 0.555 | 227.6 |
| 13 | 5.9 | 54.1 | 0.445 | 0.537 | 202.6 |
| 14 | 6.2 | 50.3 | 0.422 | 0.562 | 203.5 |
| 15 | 3.7 | 51.0 | 0.439 | 0.544 | 200.9 |
| 16 | 4.2 | 54.2 | 0.444 | 0.545 | 201.9 |
| 17 | 5.0 | 54.5 | 0.432 | 0.542 | 192.9 |
| 18 | 6.1 | 54.1 | 0.449 | 0.540 | 195.5 |
| 19 | 7.2 | 53.6 | 0.446 | 0.542 | 196.1 |

It could be seen that the organic light emitting diodes of Examples 1 to 16 had high light emitting efficiency and the improved diode life span, and through this, it can be confirmed that light emitting and life span characteristics of the organic light emitting diode can be improved through a combination of the electron blocking layer material having the structure in which the fluorene group or the naphthalene group is not directly connected to amine and the electron transport layer material that is a triazine or pyrimidine derivative.

The invention claimed is:

1. An organic light emitting diode comprising an anode, a cathode, and one or more organic material layers interposed between the anode and the cathode, wherein:

a first organic material layer is a light emitting layer, a second organic layer is an electron blocking layer interposed between the anode and the light emitting layer, the electron blocking layer comprising a compound represented by following Formula 1, a third organic material layer comprising a compound represented by the following Formula 2 or 3 is interposed between the cathode and the light emitting layer, and a fourth organic material layer is a hole transport layer interposed between the anode and the electron blocking layer:

[Formula 1]

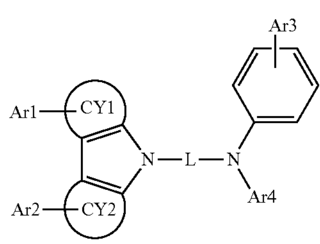

wherein,

CY1 and CY2 are the same as or different from each other, and each independently represent a benzene cycle or a naphthalene cycle, Ar1 and Ar2 are the same as or different from each other, and are each independently selected from the group consisting of hydrogen and a phenyl group, Ar3 is selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 12 to 30 carbon atoms,

[Formula 2]

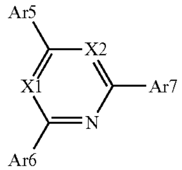

[Formula 3]

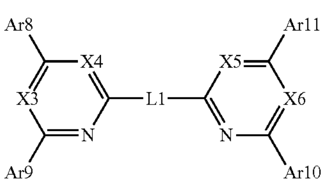

wherein,

X1 to X6 are the same as or different from each other, and each independently N or CH, Ar5 to Ar11 are the same as or different from each other, and are each independently selected from the group consisting of a substituted or unsubstituted phenyl group; a substituted or unsubstituted biphenyl group; a substituted or unsubstituted naphthyl group; a substituted or unsubstituted anthracenyl group; a substituted or unsubstituted phenanthrenyl group; and a fluorenyl group, which is unsubstituted or substituted with one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, a fluorenyl group, and a nitrile group; a substituted or unsubstituted pyrimidinyl group; a substituted or unsubstituted quinolyl group; and a substituted or unsubstituted pyrazinyl group, and L1 is a substituted or unsubstituted arylene group having 6 to 30 carbon atoms.

2. The organic light emitting diode of claim 1, wherein the electron blocking layer is in contact with the light emitting layer.

3. The organic light emitting diode of claim 1, wherein the third organic material layer is an electron transport layer.

4. The organic light emitting diode of claim 1, wherein the third organic material layer is an electron transport layer and a fifth organic material layer is an electron injection layer interposed between the cathode and the light emitting layer.

5. The organic light emitting diode of claim 1, wherein both CY1 and CY2 of Formula 1 are a benzene cycle, Ar3 is hydrogen or a phenyl group, and Ar4 is a phenyl group or a biphenyl group.

6. The organic light emitting diode of claim 1, wherein both CY1 and CY2 of Formula 1 are a benzene cycle, and L is a divalent biphenyl group.

7. The organic light emitting diode of claim 1, wherein the compound represented by Formula 1 is represented by any one of the following Formulas 4 to 6:

[Formula 4]

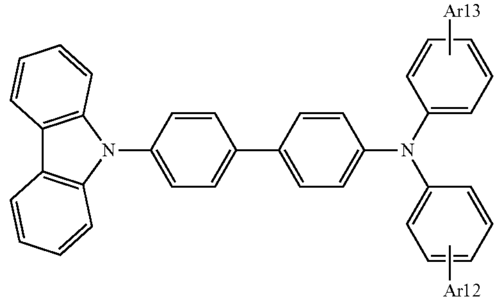

[Formula 5]

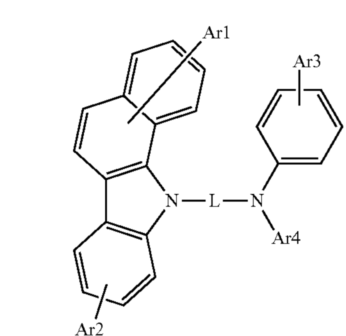

[Formula 6]

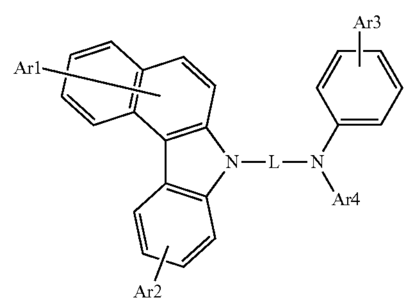

wherein,

Ar1 to Ar4, and L are the same as definitions of Formula 1, and at least one of Ar12 and Ar13 is a phenyl group, and the other is hydrogen, a substituted or unsubstituted alkyl group having 1 to 10 carbon atoms, or a phenyl group.

8. The organic light emitting diode of claim 1, wherein the compound represented by Formula 1 is selected from the group consisting of the following Structural Formulas:

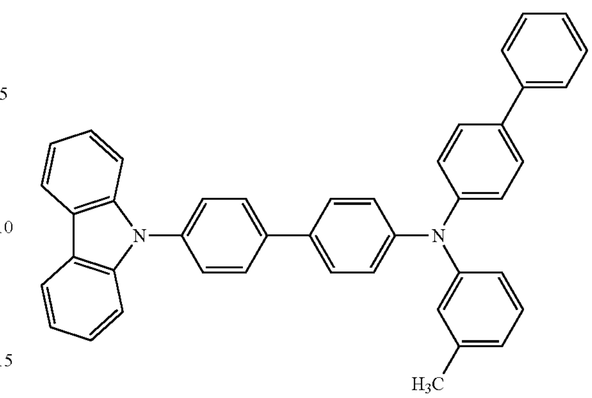

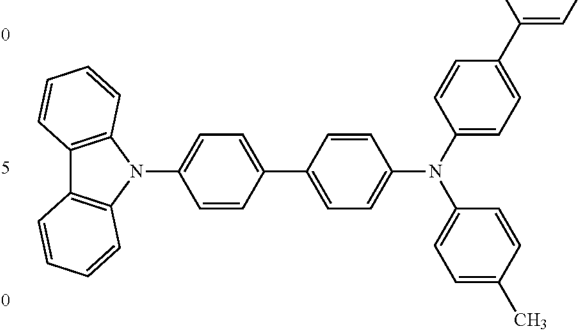

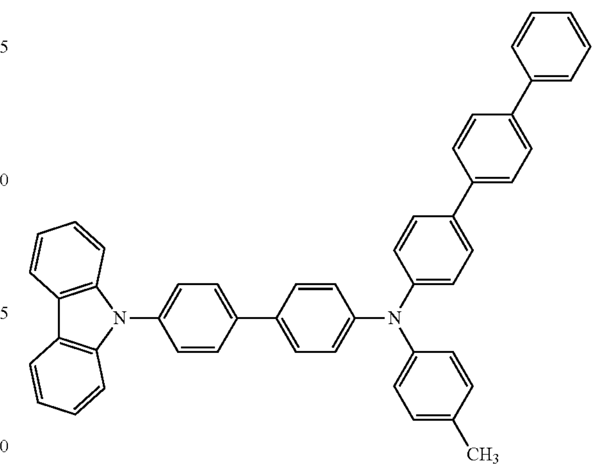

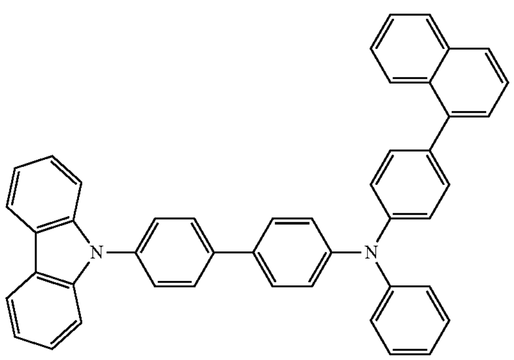

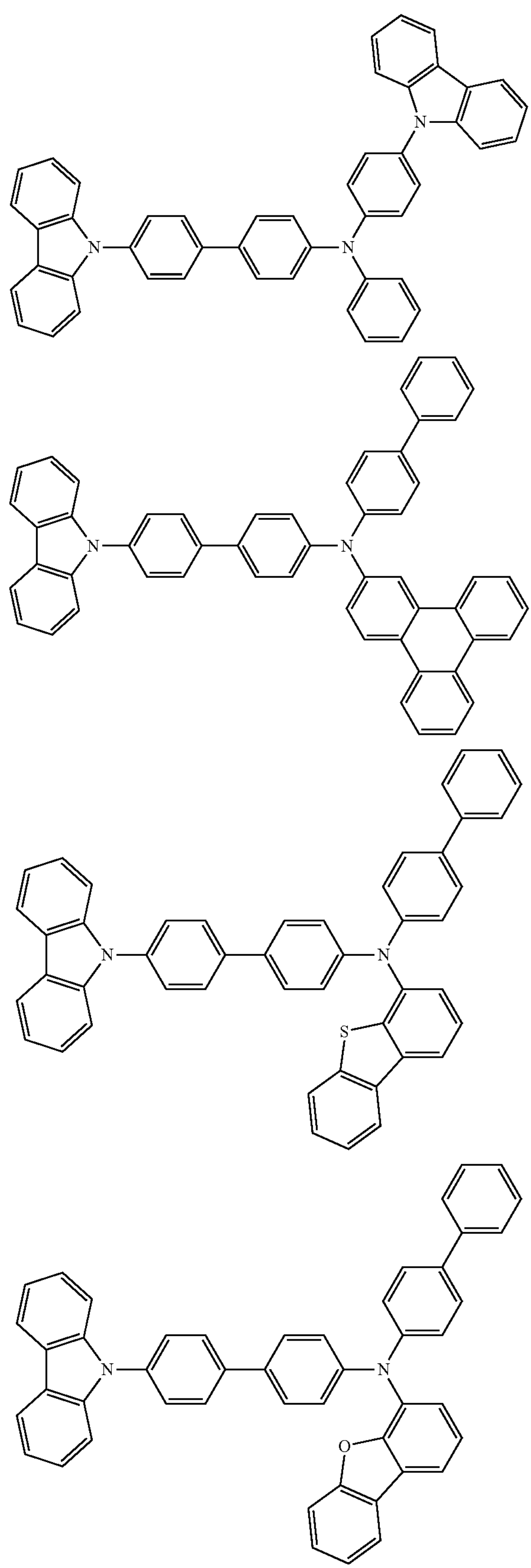
N
N
N
N
N
S
N
N
O
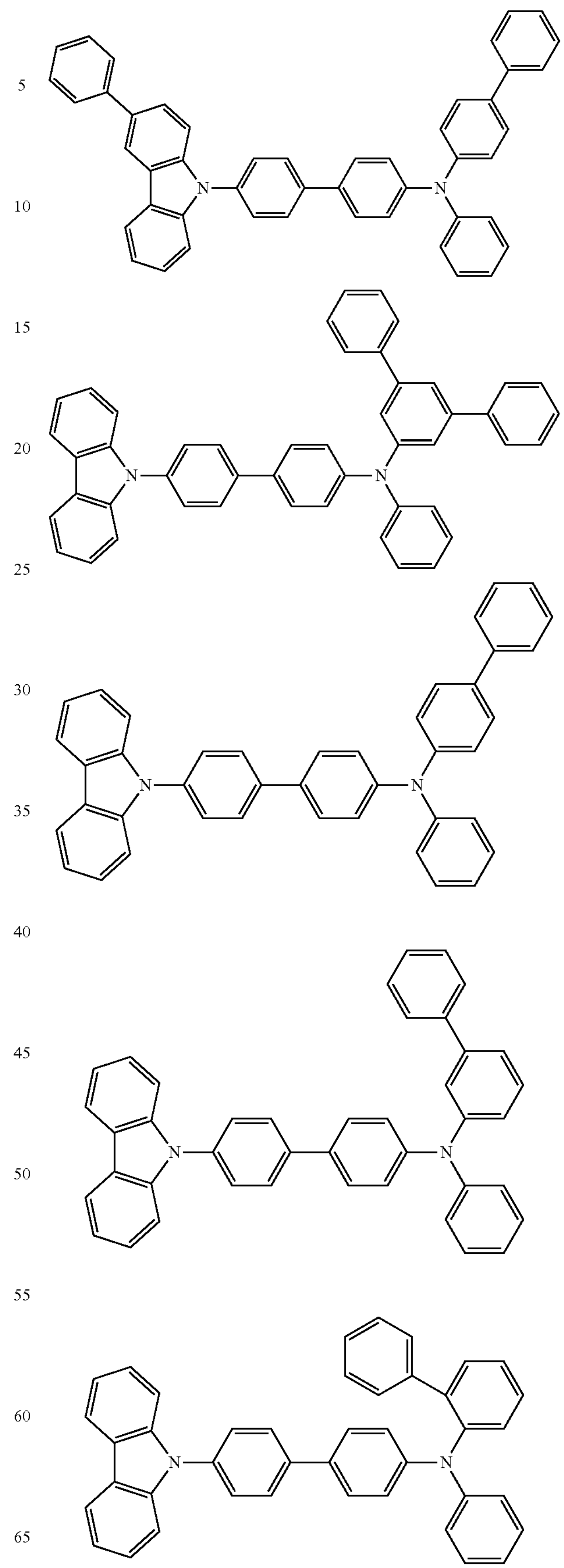
N
N
N
N
N
N
N
N
N
N

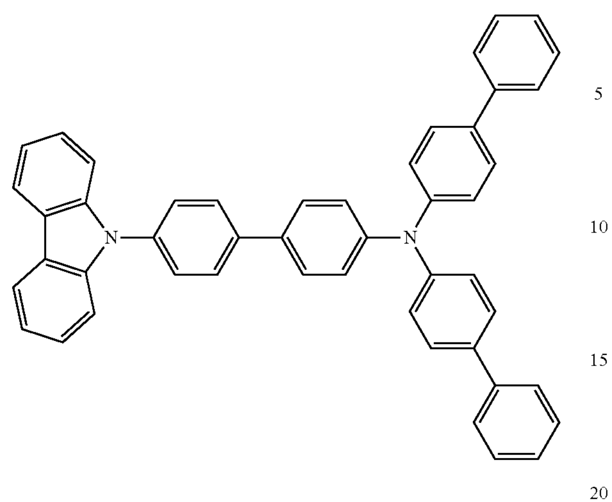
N
N
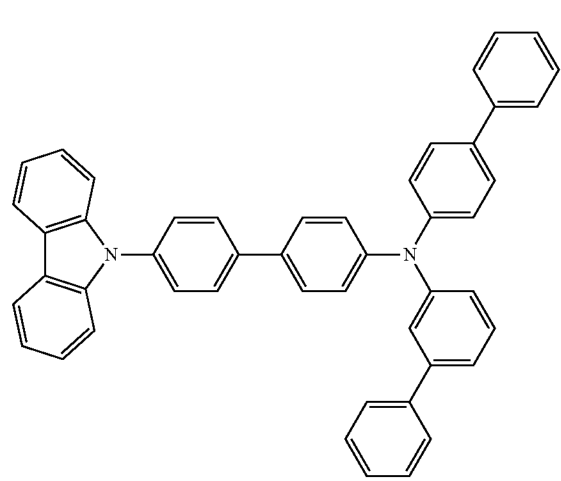
N
N
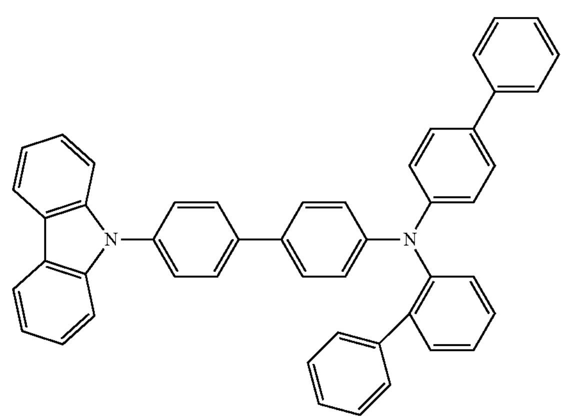
N
N
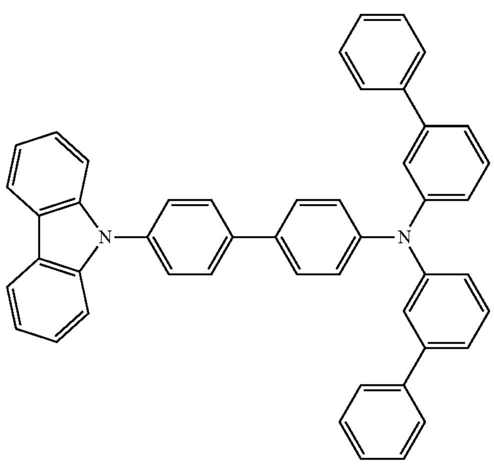
N
N
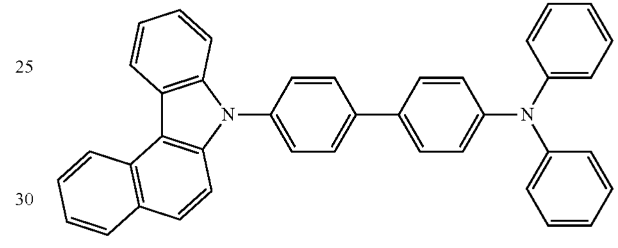
N
N
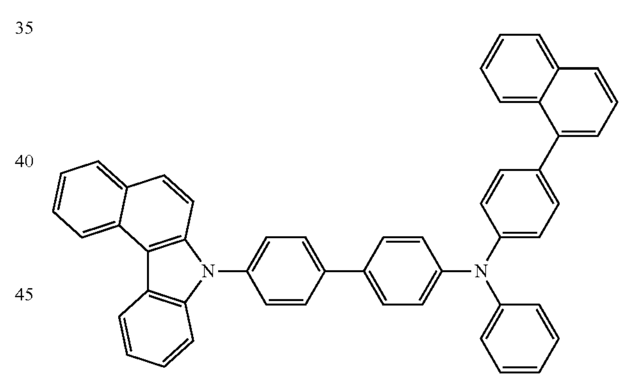
N
N
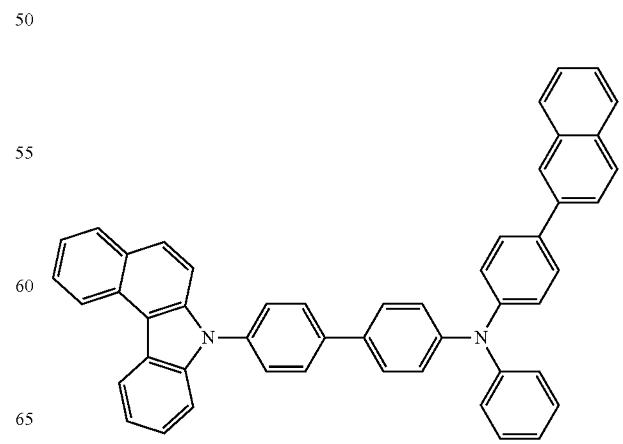
N
N -continued
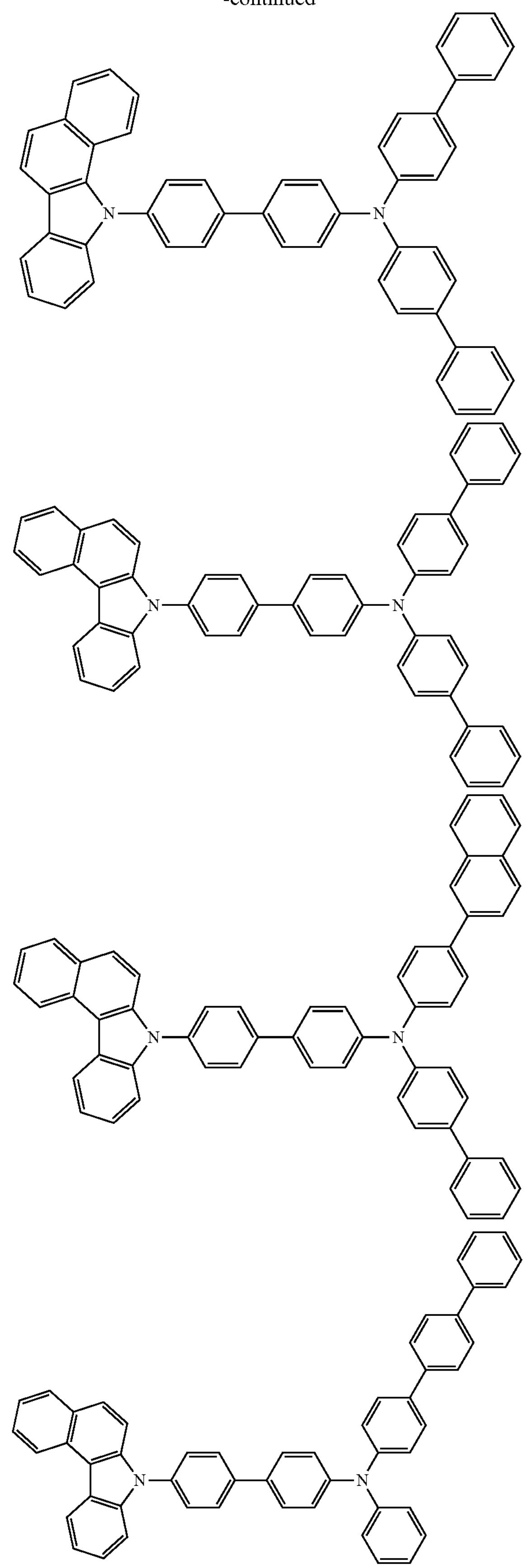
-continued
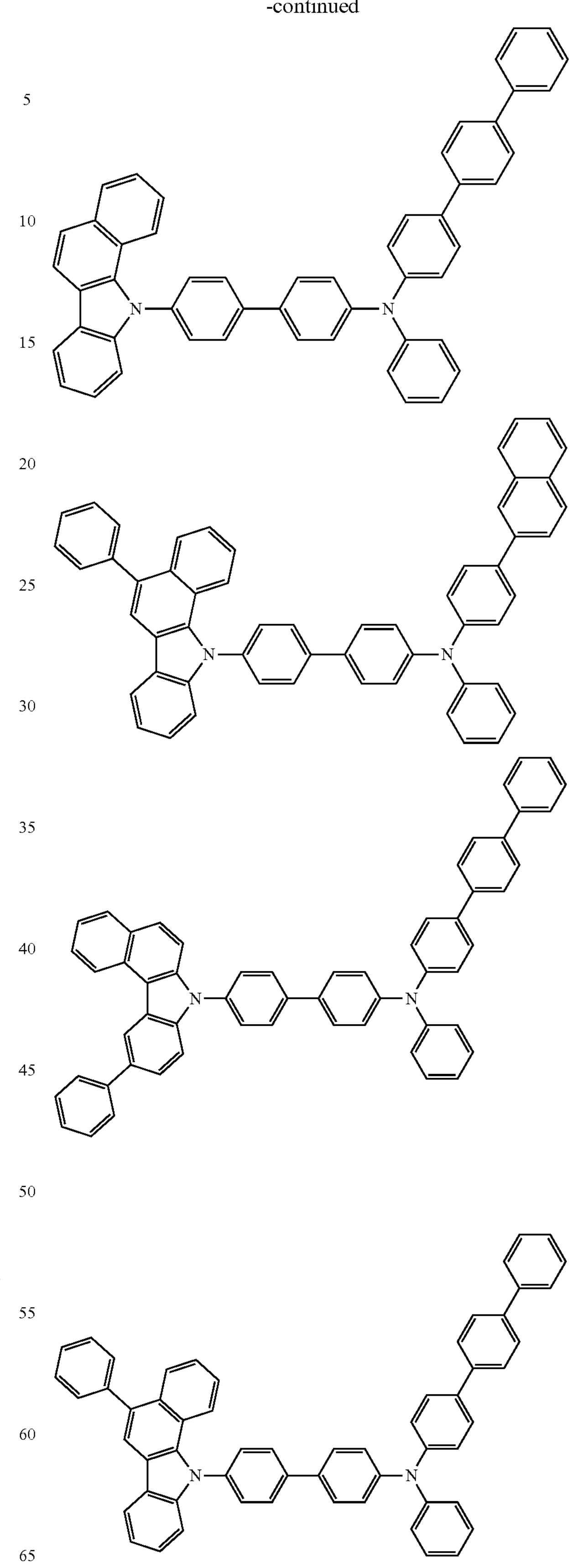

-continued
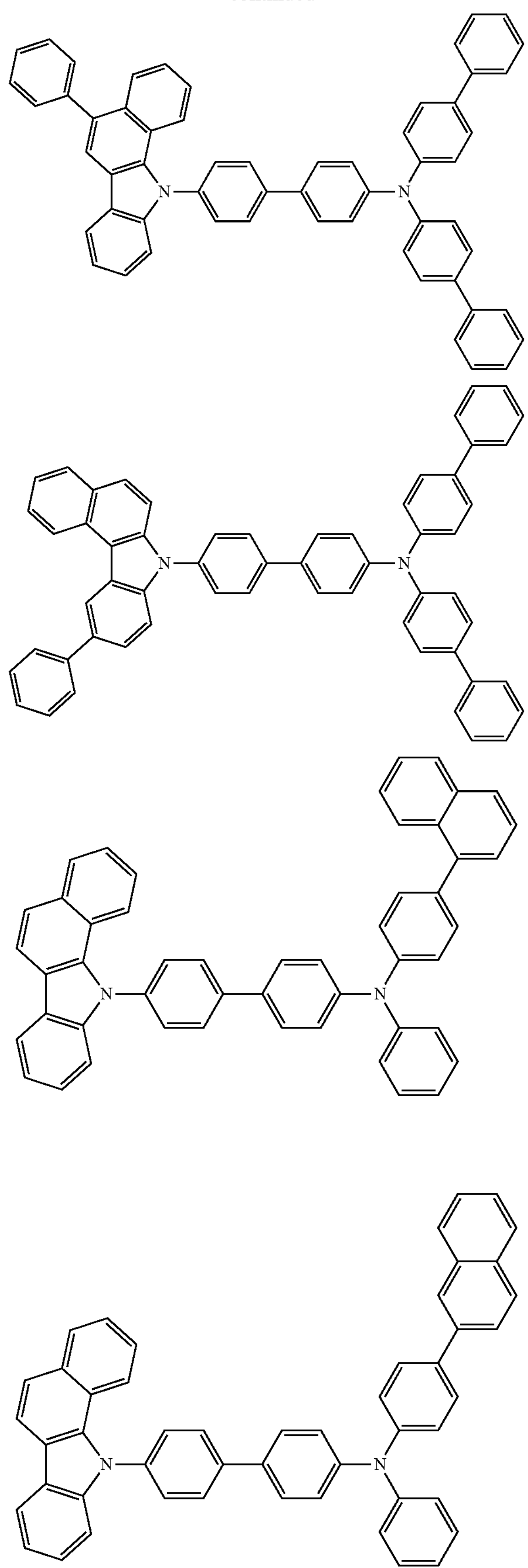
-continued
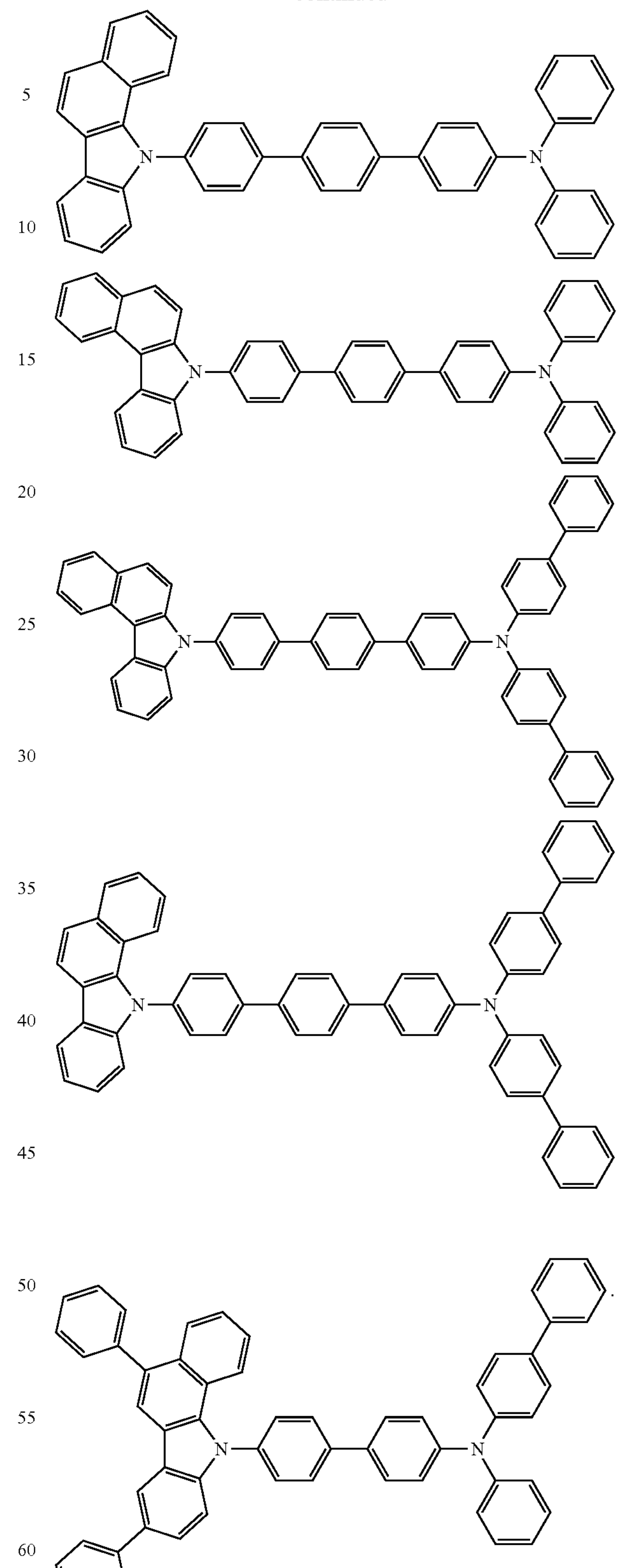
9. The organic light emitting diode of claim 1, wherein the compound represented by Formula 2 or 3 is selected from the group consisting of the following Structural Formulas:

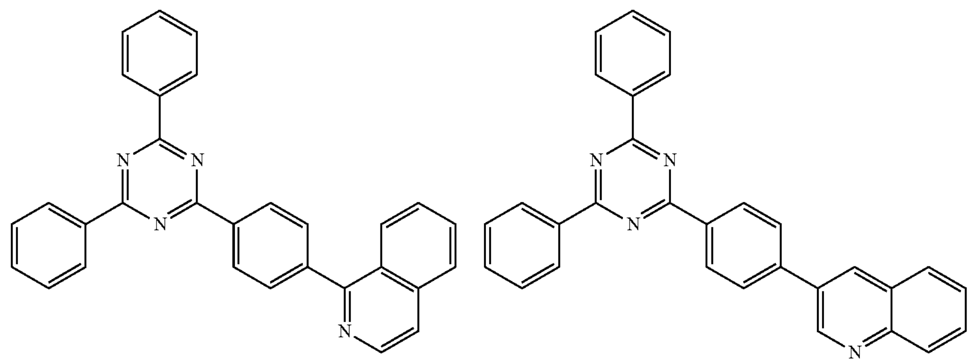
N
N
N
N
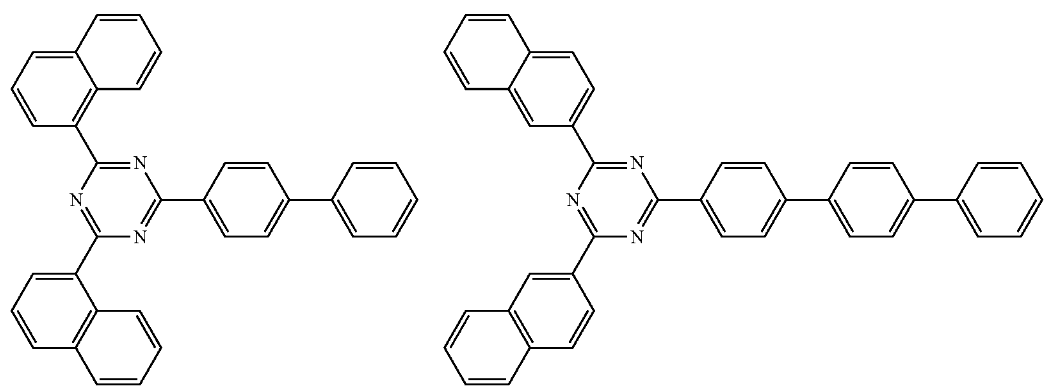
N
N
N
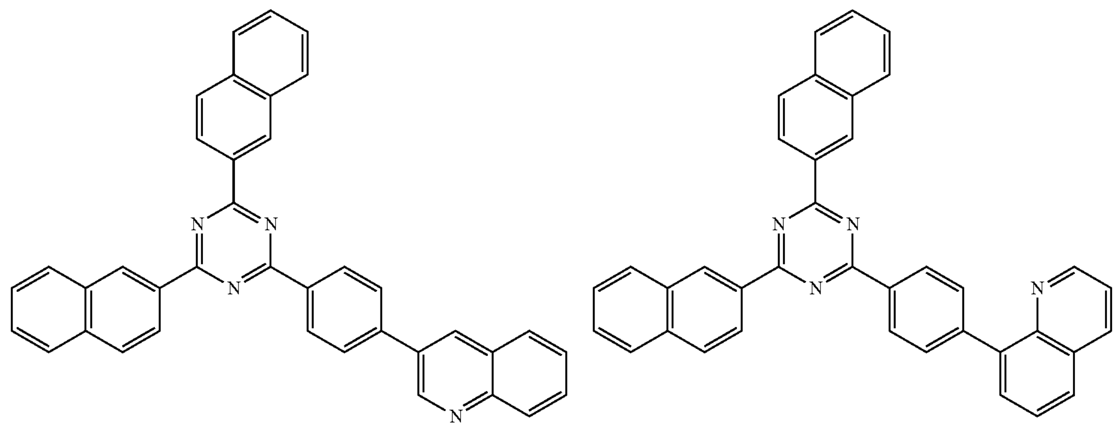
N
N
N
N
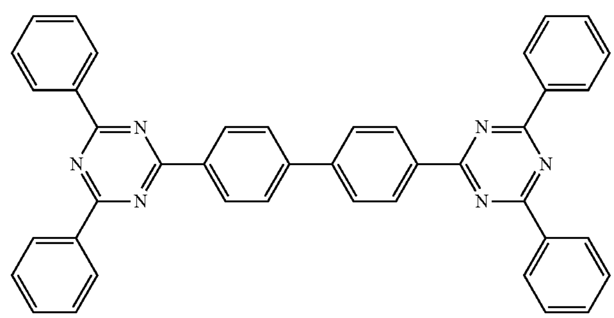
N
N
N

-continued
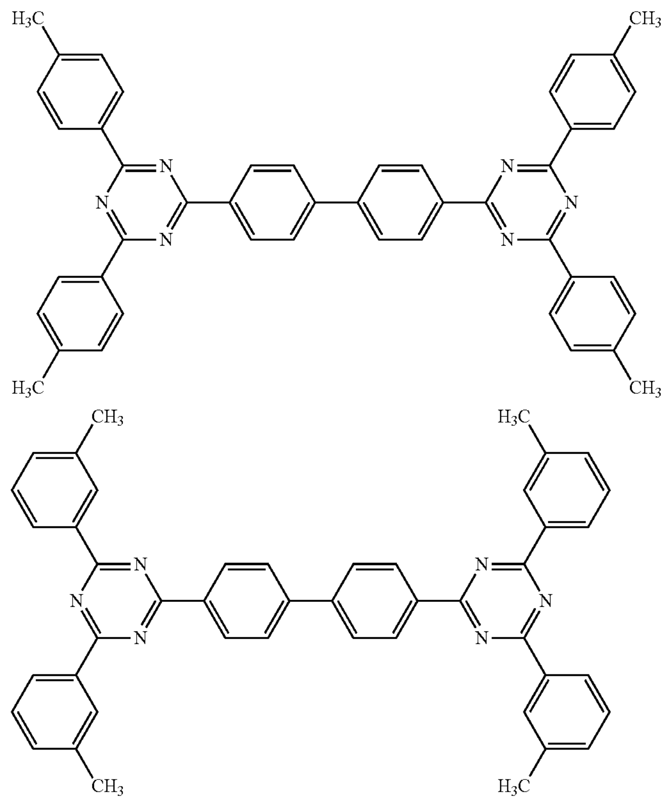
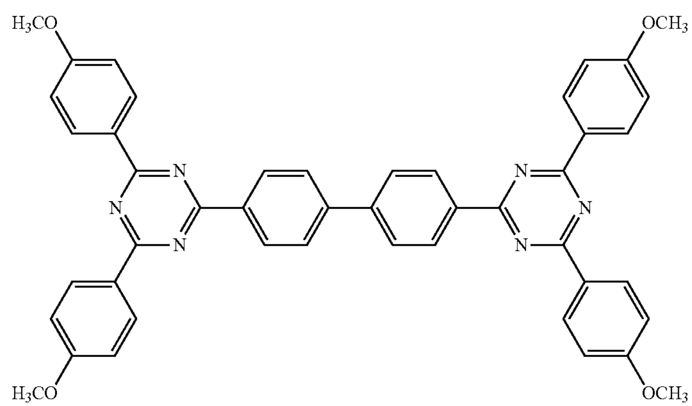
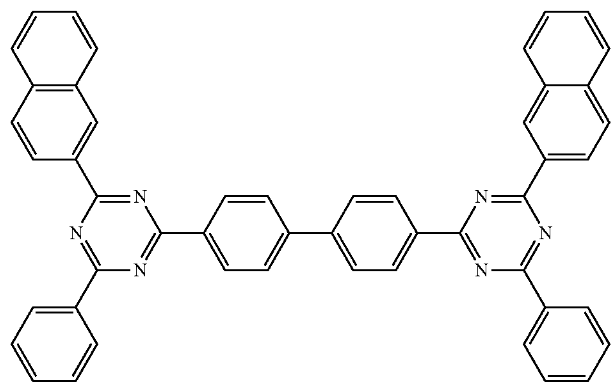

-continued
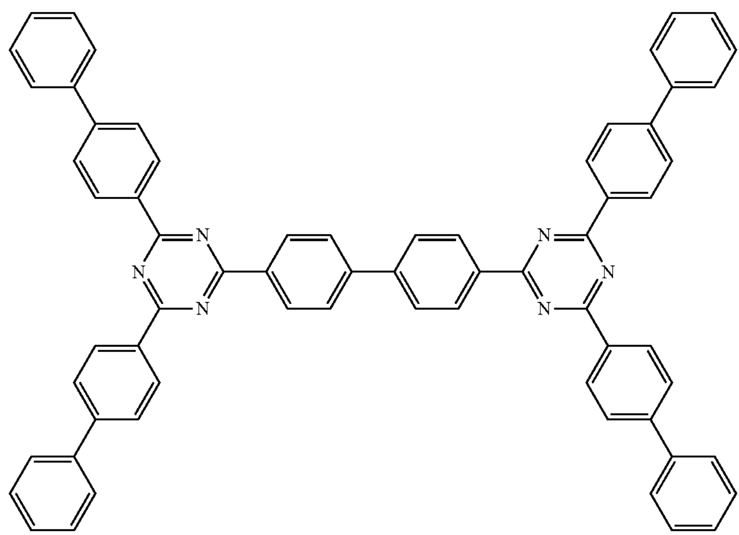
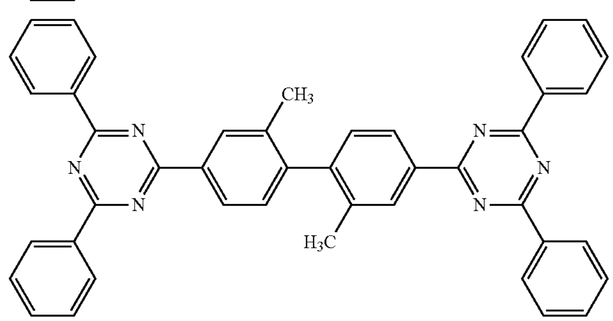
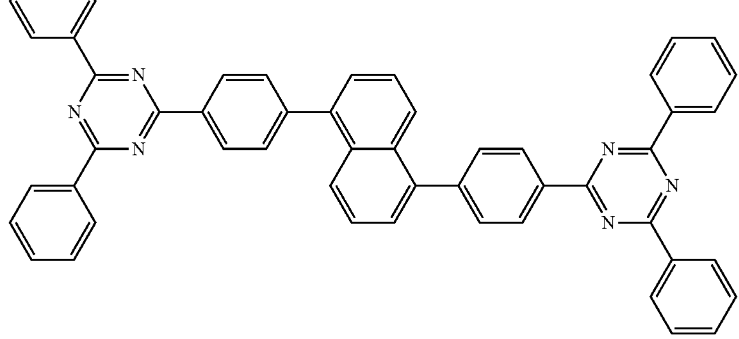
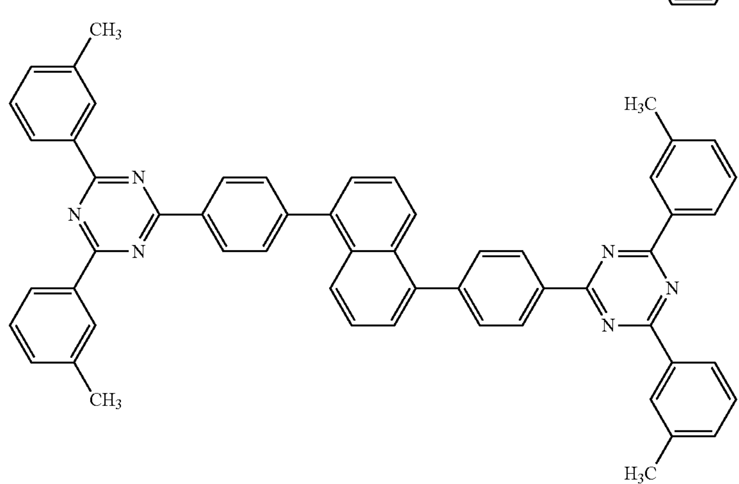

-continued
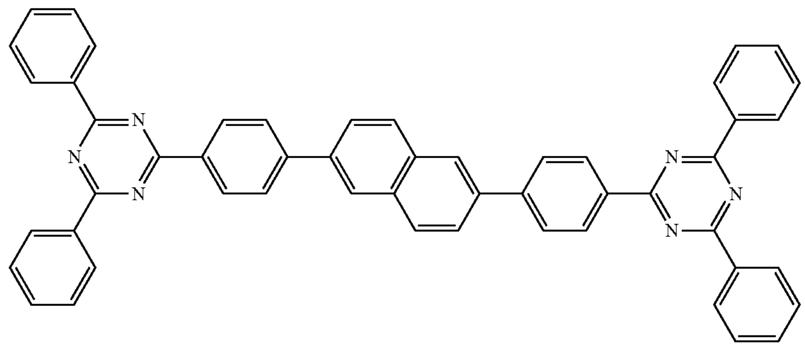
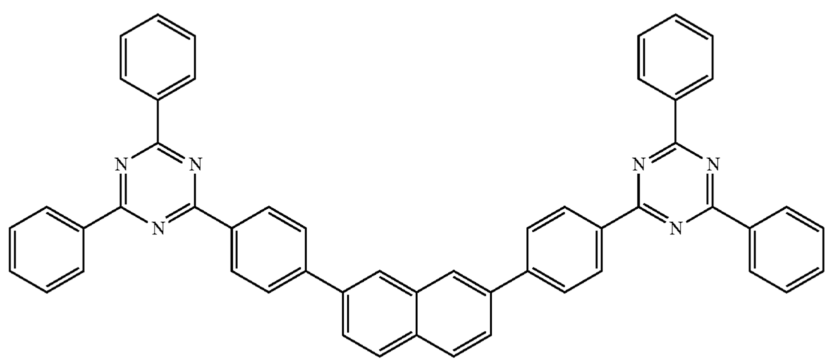
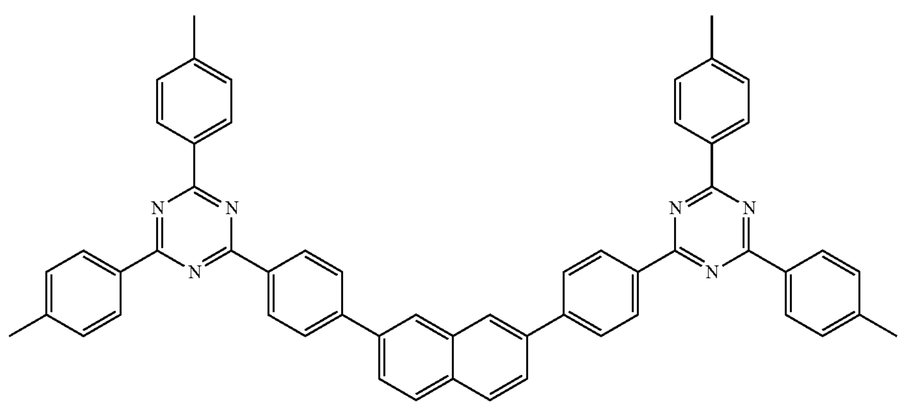
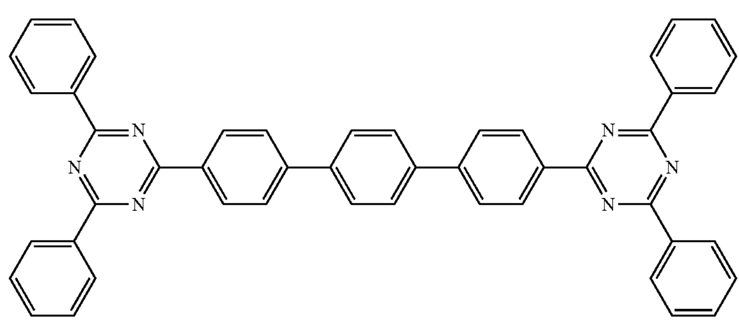

-continued
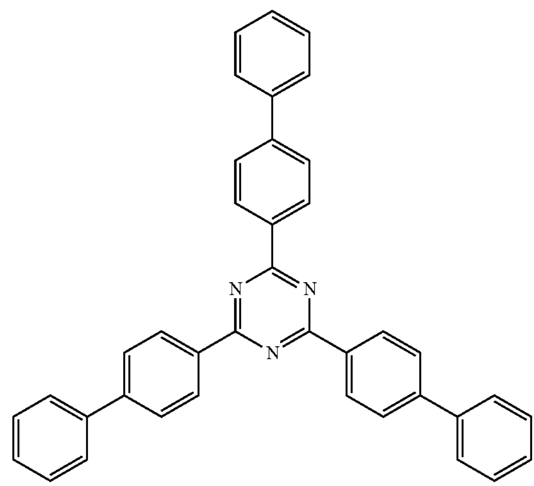
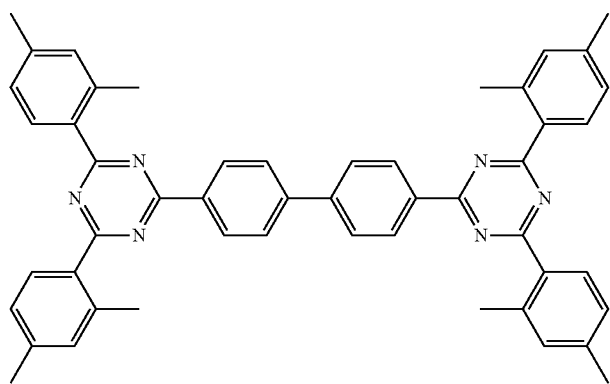
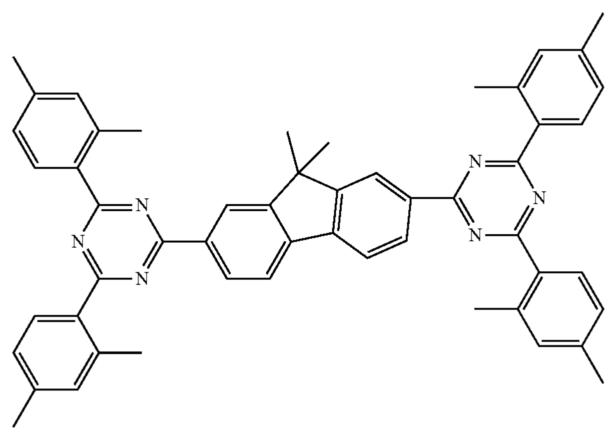
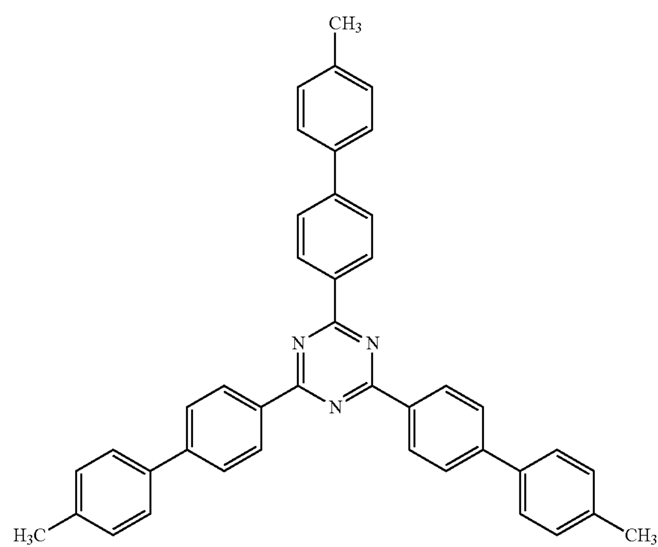

-continued
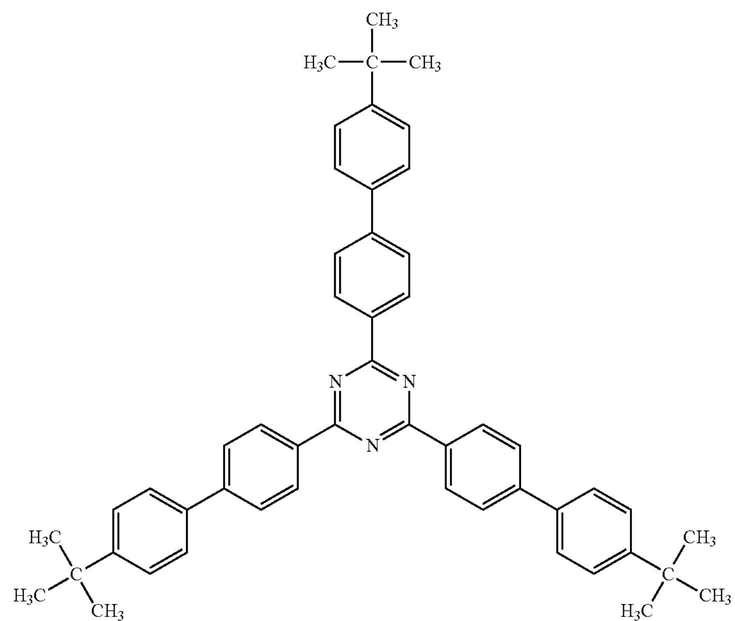
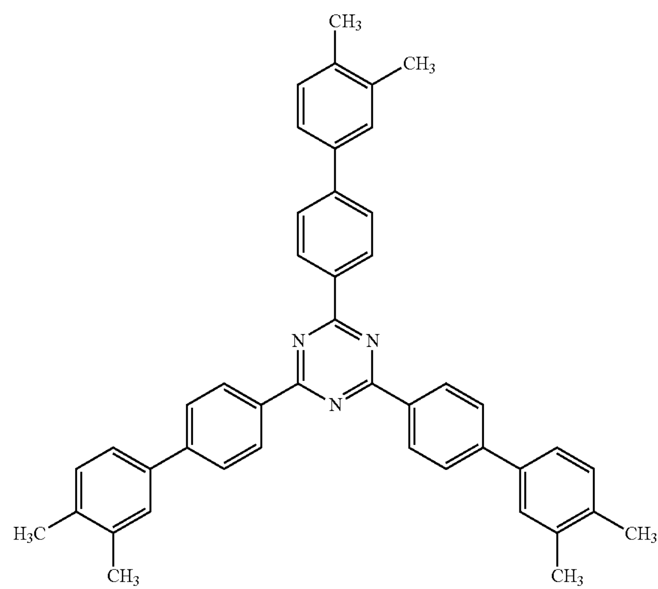

-continued
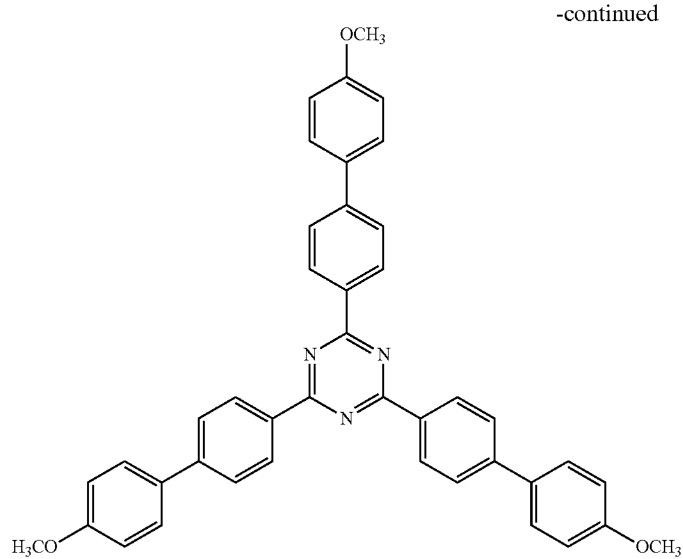
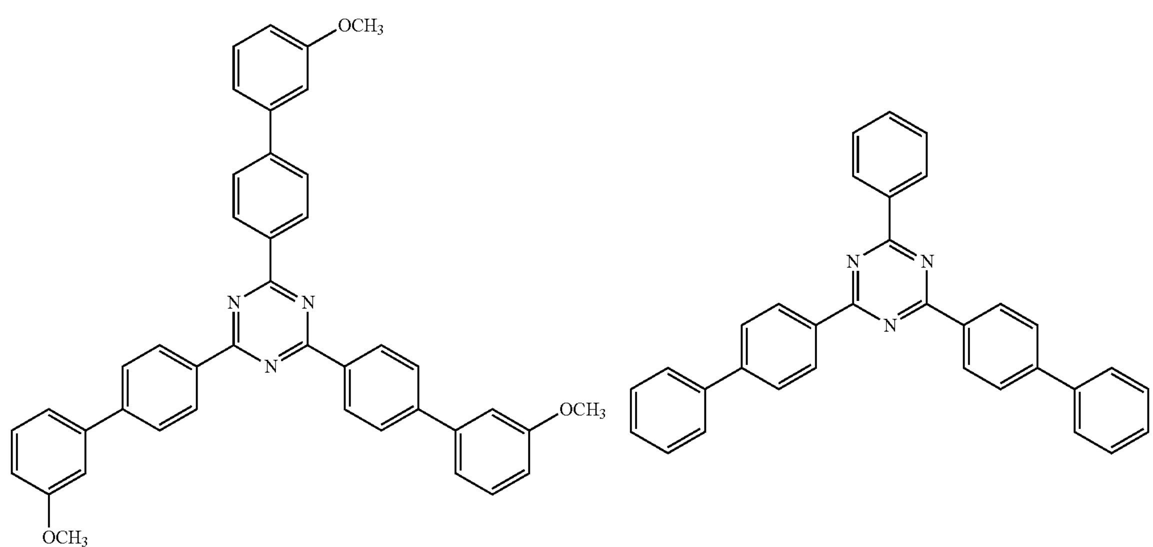
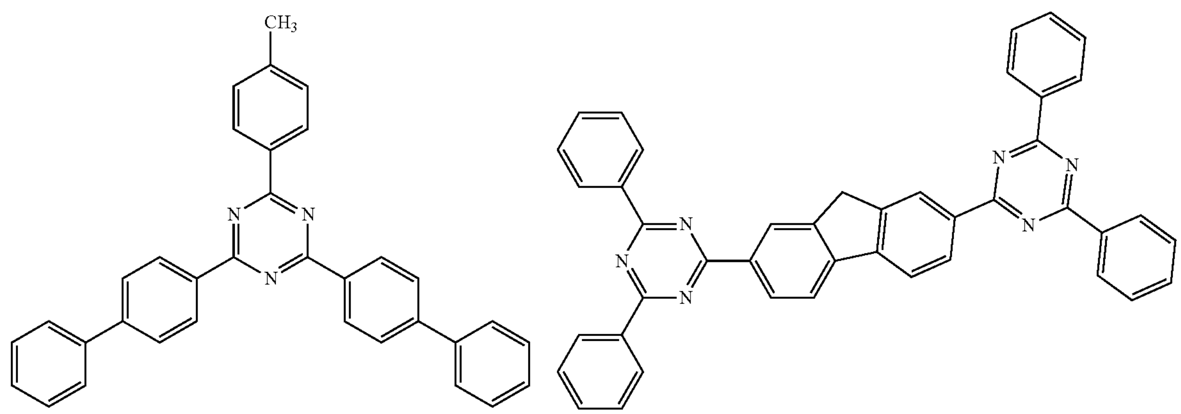

-continued
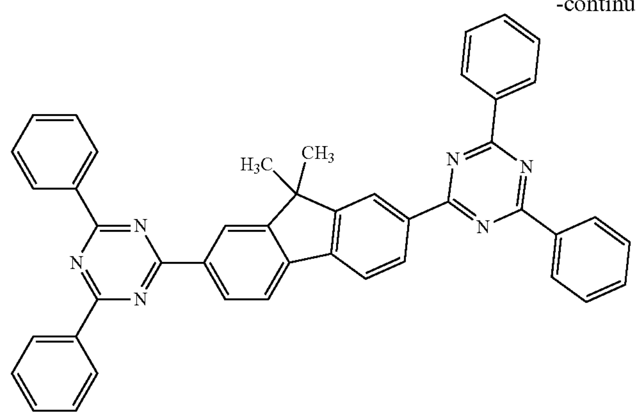
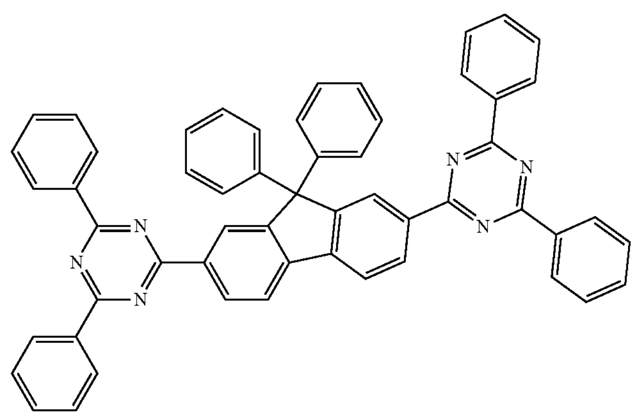
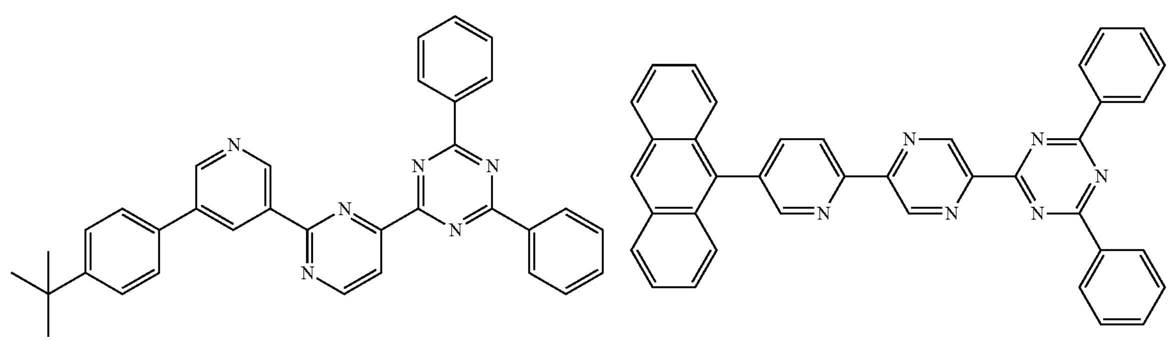
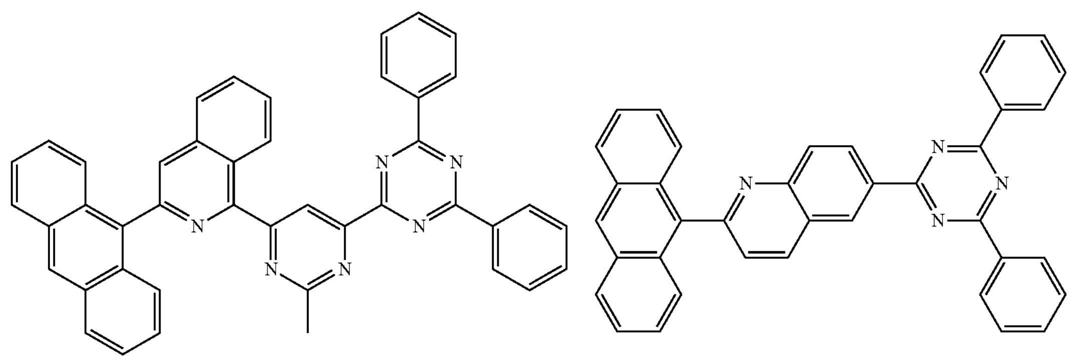

-continued
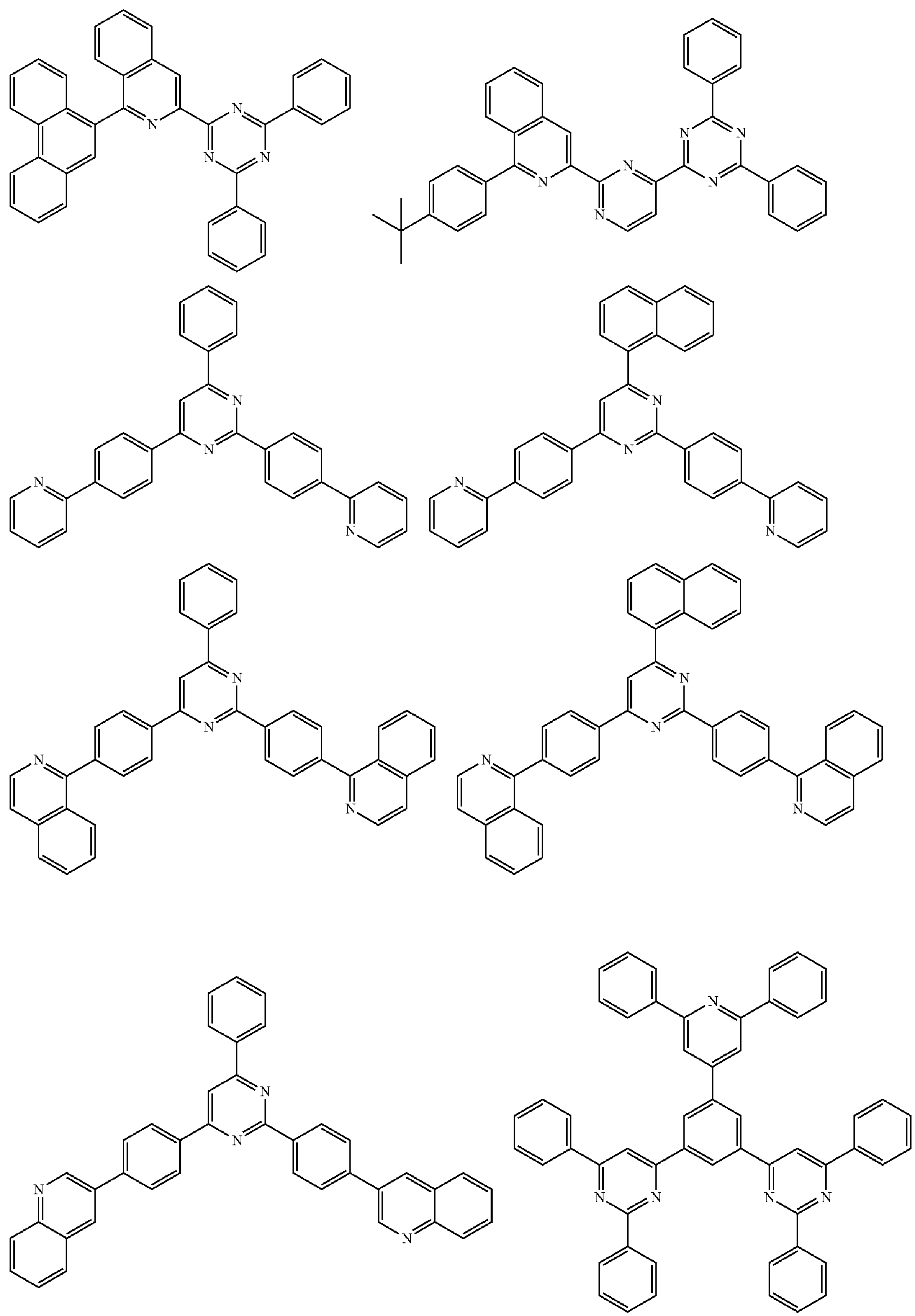

-continued
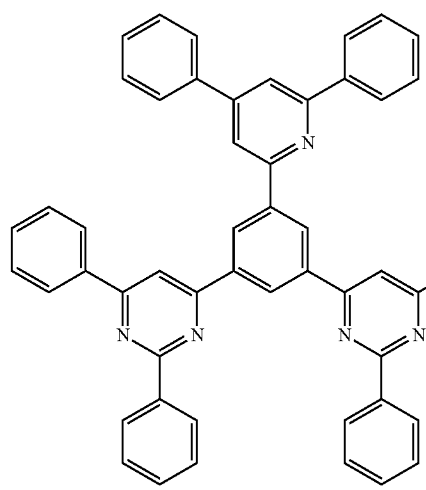
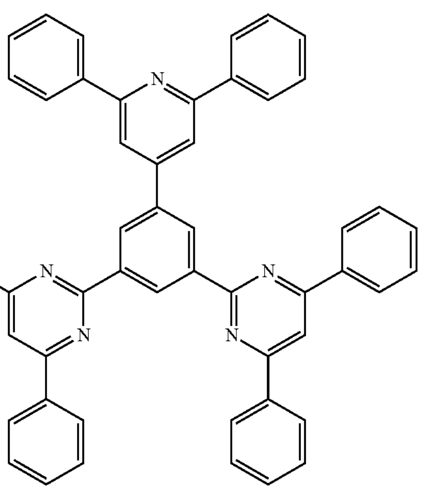
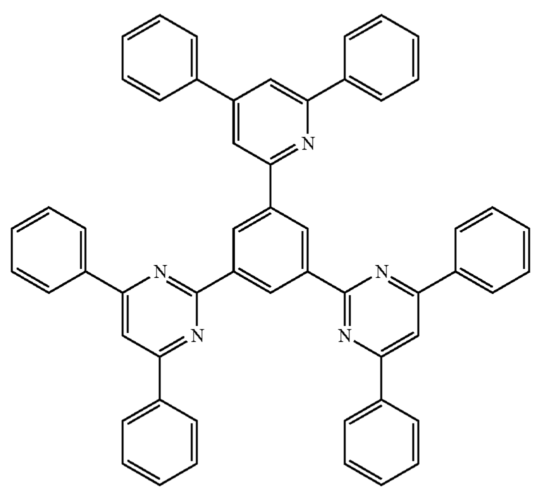
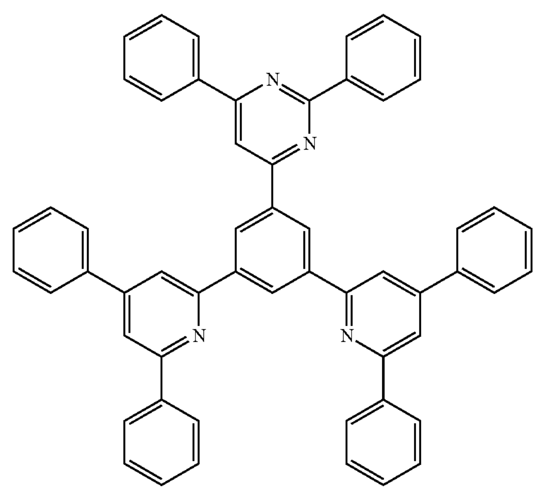
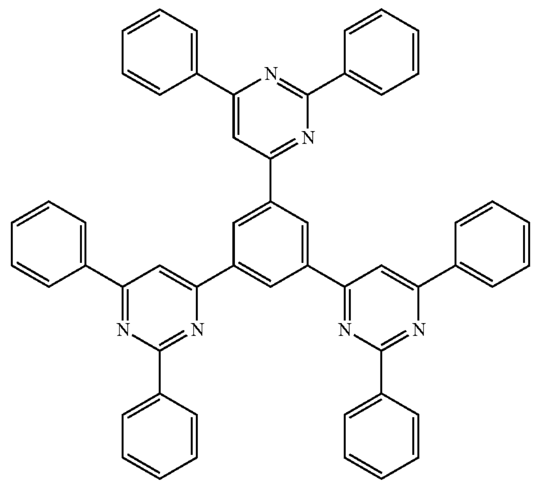
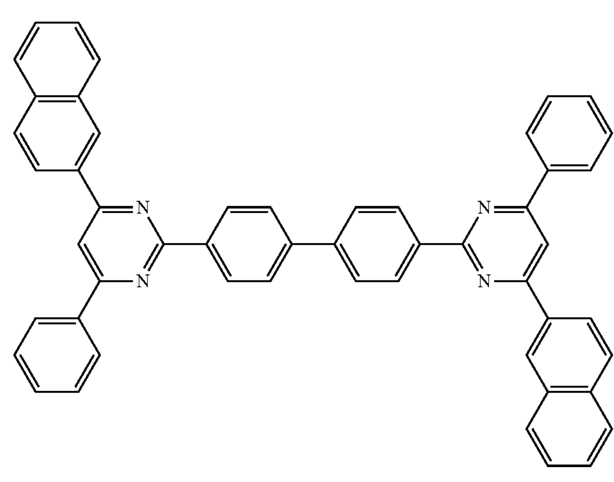

-continued
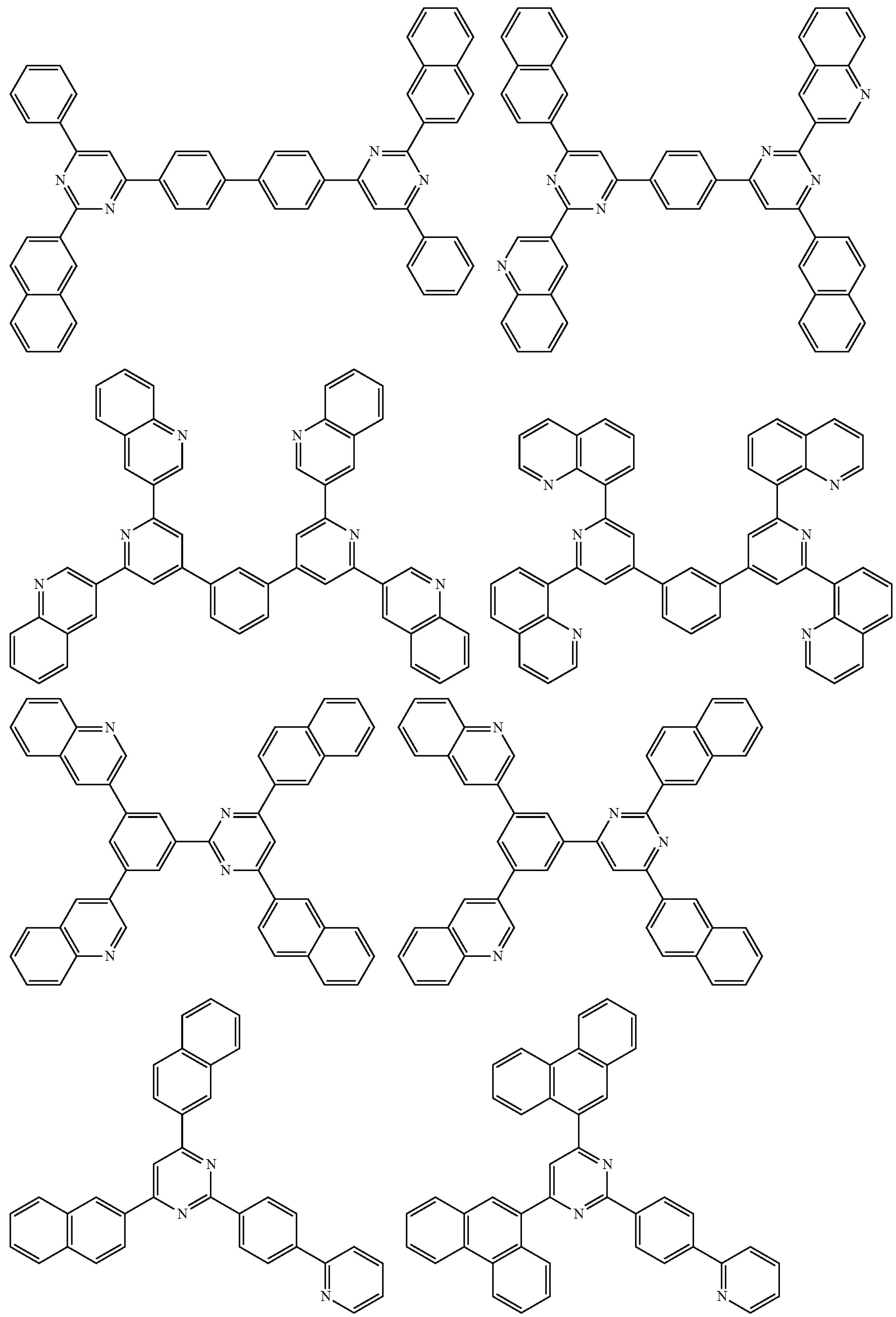

-continued
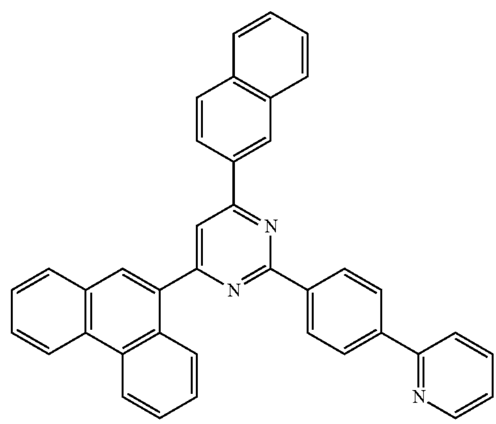
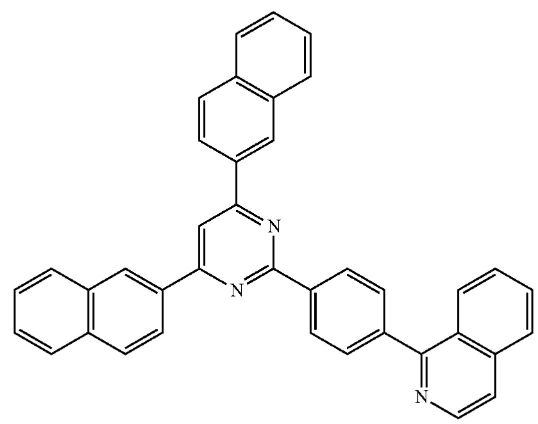
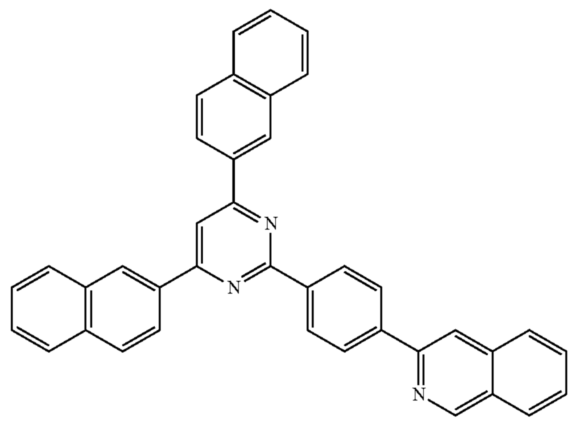
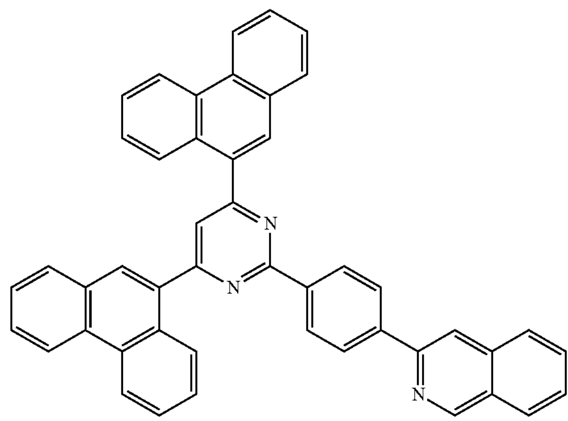
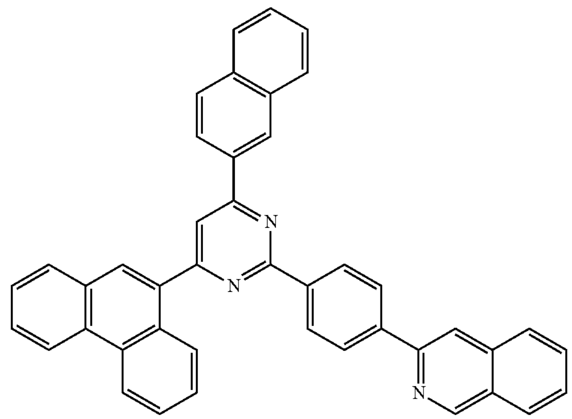
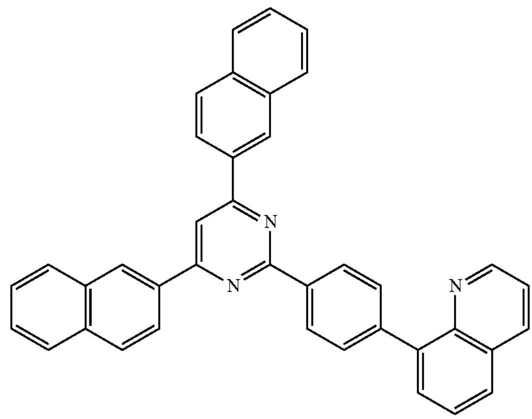

-continued
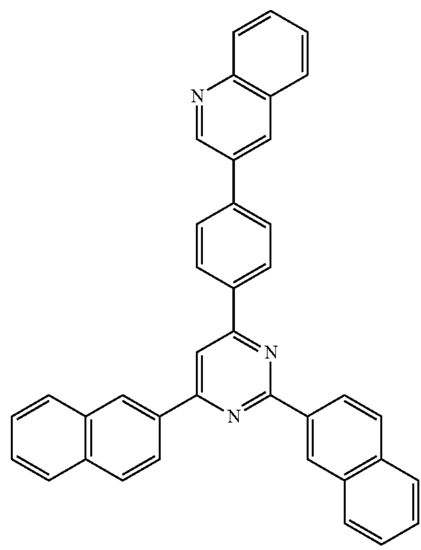
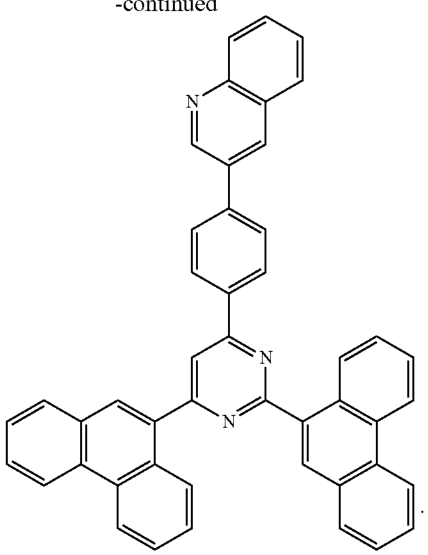
* * * * *

US009691991C1

(12) EX PARTE REEXAMINATION CERTIFICATE (11515th)

United States Patent

Hong et al.

(10) Number: US 9,691,991 C1

(45) Certificate Issued: May 10, 2019

(54) ORGANIC LIGHT-EMITTING DIODE

(71) Applicant: LG CHEM, LTD, Seoul (KR)

(72) Inventors: Sung Kil Hong, Daejeon (KR); Kongkyeom Kim, Daejeon (KR); Jungi Jang, Daejeon (KR); Yun Hwan Kim, Seoul (KR); Minseung Chun, Daejeon (KR)

(73) Assignee: LG CHEM, LTD., Yeoui-Daero, Yeongdeungpo-gu, Seoul (KR)

Reexamination Request:
No. 90/014,162, Jul. 3, 2018

Reexamination Certificate for:

| | |
|---|---|
| Patent No.: | **9,691,991** |
| Issued: | **Jun. 27, 2017** |
| Appl. No.: | **14/241,682** |
| PCT Filed: | **Feb. 27, 2013** |
| PCT No.: | **PCT/KR2013/001576** |
| § 371 (c)(1), (2) Date: | **Feb. 27, 2014** |
| PCT Pub. No.: | **WO2013/129835** |
| PCT Pub. Date: | **Sep. 6, 2013** |

(30) Foreign Application Priority Data

Feb. 27, 2012 (KR) ........................ 10-2012-0019959

(51) Int. Cl.
*H01L 51/00* (2006.01)
*H01L 51/50* (2006.01)

(52) U.S. Cl.
CPC ........ *H01L 51/006* (2013.01); *H01L 51/0052* (2013.01); *H01L 51/0054* (2013.01); *H01L 51/0058* (2013.01); *H01L 51/0061* (2013.01); *H01L 51/0067* (2013.01); *H01L 51/0072* (2013.01); *H01L 51/0073* (2013.01); *H01L 51/0074* (2013.01); *H01L 51/5072* (2013.01); *H01L 51/5096* (2013.01); *H01L 51/0096* (2013.01)

(58) Field of Classification Search
None
See application file for complete search history.

(56) References Cited

To view the complete listing of prior art documents cited during the proceeding for Reexamination Control Number 90/014,162, please refer to the USPTO's public Patent Application Information Retrieval (PAIR) system under the Display References tab.

*Primary Examiner* — Jerry D Johnson

(57) ABSTRACT

The present invention relates to an organic light emitting diode and a method of manufacturing the same. An organic light emitting diode according to the present invention comprises an exciton blocking layer comprising a compound represented by Formula 1 to confine an exciton to a light emitting layer to prevent light emitting leakage, and thus there is an effect of implementing an organic electroluminescence diode having excellent light emitting efficiency. Further, even though there is no separate electron injection layer, electron injection and light transport characteristics are excellent by comprising an electron transport layer comprising a compound represented by Formula 2 or 3, and thus it is possible to implement an organic light emitting diode having a simple and economical manufacturing process, a low voltage, high efficiency, and a long file span as compared to the related art.

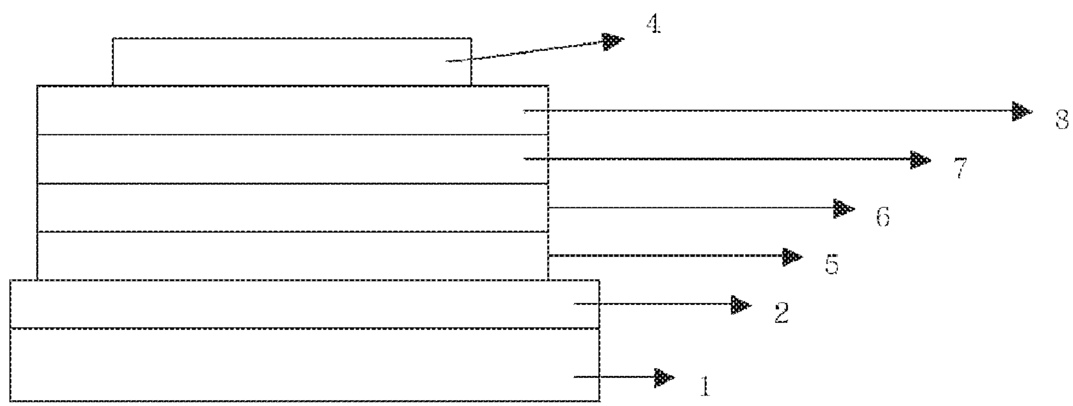

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2-8, dependent on an amended claim, are determined to be patentable.

Claim 9 was not reexamined.

1. An organic light emitting diode comprising an anode, a cathode, and one or more organic material layers interposed between the anode and the cathode, wherein:

a first organic material layer is a light emitting layer, a second organic layer is an electron blocking layer interposed between the anode and the light emitting layer, the electron blocking layer comprising a compound represented by following Formula 1, a third organic material layer comprising a compound represented by the following Formula 2 or 3 is interposed between the cathode and the light emitting layer, and a fourth organic material layer is a hole transport layer interposed between the anode and the electron blocking layer:

[Formula 1]

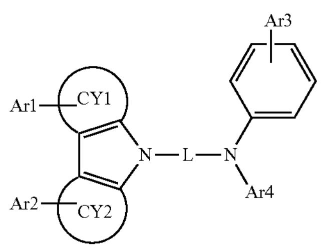

wherein,

CY1 and CY2 are the same as or different from each other, and each independently represent a benzene cycle or a naphthalene cycle, Ar1 and Ar2 are the same as or different from each other, and are each independently selected from the group consisting of hydrogen and a phenyl group, Ar3 is selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 12 to 30 carbon atoms,

[Formula 2]

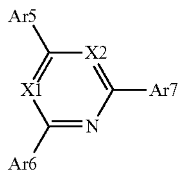

[Formula 2]

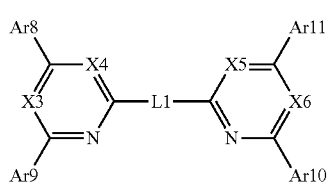

wherein,

X1 to X6 are the same as or different from each other, and each independently N or CH, Ar5 *to Ar7 are the same as or different from each other, and are each independently selected from the group consisting of a phenyl group which is unsubstituted or substituted by an alkyl group, an aryl group, a quinolyl group, or a pyridyl group; a biphenyl group which is unsubstituted or substituted by an alkyl group, or an alkoxy group; a substituted or unsubstituted naphthyl group; a substituted or unsubstituted anthracenyl group; a substituted or unsubstituted phenanthrenyl group; a fluorenyl group, which is unsubstituted or substituted with one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, a fluorenyl group, and a nitrile group; a substituted or unsubstituted pyrimidinyl group; a substituted or unsubstituted quinolyl group; and a substituted or unsubstituted pyrazinyl group;*

*Ar8* to Ar11 are the same as or different from each other, and are each independently selected from the group consisting of a substituted or unsubstituted phenyl group; a substituted or unsubstituted biphenyl group; a substituted or unsubstituted naphthyl group; a substituted or unsubstituted anthracenyl group; a substituted or unsubstituted phenanthrenyl group; [and] a fluorenyl group, which is unsubstituted or substituted with one or more substituent groups selected from the group consisting of heavy hydrogen, a halogen group, an alkyl group, an alkenyl group, an alkoxy group, a silyl group, an arylalkenyl group, an aryl group, a heteroaryl group, a carbazole group, an arylamine group, a fluorenyl group, and a nitrile group; a substituted or unsubstituted pyrimidinyl group; a substituted or unsubstituted quinolyl group; and a substituted or unsubstituted pyrazinyl group, and L1 is a substituted or unsubstituted arylene group having 6 to 30 carbon atoms.

* * * * *